United States Patent
Schilling et al.

(10) Patent No.: US 9,219,500 B2
(45) Date of Patent: Dec. 22, 2015

(54) NAVIGATION DEVICES AND METHODS CARRIED OUT THEREON

(75) Inventors: Heiko Schilling, Liverpool (GB); Ewgenij Gawrilow, Berlin (DE); Moritz Hilger, Berlin (DE); Andreas Profous, Berlin (DE); Jürgen Werber, Berlin (DE); Simone Tertoolen, Zuid Holland (NL)

(73) Assignee: TomTom International B.V., Amsterdam (NL)

( * ) Notice: Subject to any disclaimer, the term of this patent is extended or adjusted under 35 U.S.C. 154(b) by 0 days.

(21) Appl. No.: 13/382,956

(22) PCT Filed: Jul. 9, 2010

(86) PCT No.: PCT/EP2010/059944
§ 371 (c)(1),
(2), (4) Date: Mar. 13, 2012

(87) PCT Pub. No.: WO2011/004026
PCT Pub. Date: Jan. 13, 2011

(65) Prior Publication Data
US 2012/0158301 A1    Jun. 21, 2012

Related U.S. Application Data

(60) Provisional application No. 61/213,746, filed on Jul. 9, 2009.

(51) Int. Cl.
*G01C 21/34* (2006.01)
*H03M 7/30* (2006.01)
(Continued)

(52) U.S. Cl.
CPC ............. *H03M 7/70* (2013.01); *G01C 21/3446* (2013.01); *G01C 21/3492* (2013.01);
(Continued)

(58) Field of Classification Search
CPC ........... G01C 21/3453; G01C 21/3647; G01C 21/3446; G01C 21/3492; G08G 1/096866; H03M 7/40; H03M 7/70; H03M 7/705
USPC ......................... 701/532–533, 428, 408–411; 430/461–464
See application file for complete search history.

(56) References Cited

U.S. PATENT DOCUMENTS 5,204,817 A    4/1993  Yoshida
5,428,396 A    6/1995  Yagasaki et al.
(Continued)

FOREIGN PATENT DOCUMENTS

CN    1715835 A    1/2006
CN    1991312 A    7/2007
(Continued)

OTHER PUBLICATIONS

International Search Report issued Feb. 1, 2011 for International Application No. PCT/EP2010/059947.
(Continued)

*Primary Examiner* — Nga X Nguyen

(57) ABSTRACT

This invention concerns a method of determining a route using map data comprising a plurality of navigable paths, the map data divided into a plurality of regions. The method comprises using at least one processing apparatus to: receive an origin and a destination on the map data and a travel time, determine a route from the origin to the destination using the map data and minimum cost data that identifies minimum cost paths between regions of the map data. The minimum cost data identifies more than one minimum cost path between a pair of the regions if different minimum cost paths exist between the pair of regions at different times and determining a route comprises identifying from the minimum cost paths for the pair of regions comprising the origin and destination, the minimum cost path having a lowest cost at the travel time.

19 Claims, 21 Drawing Sheets

(51) Int. Cl.
  G08G 1/0968 (2006.01)
  H03M 7/40 (2006.01)
(52) U.S. Cl.
  CPC ..... *G08G 1/09685* (2013.01); *G08G 1/096827* (2013.01); *G08G 1/096866* (2013.01); *H03M 7/40* (2013.01); *H03M 7/705* (2013.01); *H03M 7/3068* (2013.01); *H03M 7/4043* (2013.01)

(56) References Cited

U.S. PATENT DOCUMENTS

| | | | |
|---|---|---|---|
| 6,084,908 | A | 7/2000 | Chiang et al. |
| 6,266,610 | B1 | 7/2001 | Schultz et al. |
| 6,434,275 | B1 | 8/2002 | Fukuda et al. |
| 6,636,800 | B1 * | 10/2003 | Lauther et al. ............... 701/533 |
| 7,079,943 | B2 | 7/2006 | Flann et al. |
| 7,136,749 | B2 | 11/2006 | Ichihara et al. |
| 7,206,448 | B2 | 4/2007 | Howard |
| 7,451,005 | B2 | 11/2008 | Hoffberg et al. |
| 7,454,071 | B2 | 11/2008 | Howard |
| 7,711,046 | B2 | 5/2010 | Ebara et al. |
| 7,783,420 | B2 | 8/2010 | Oonishi et al. |
| 7,890,258 | B2 | 2/2011 | Endo et al. |
| 8,086,403 | B2 | 12/2011 | Ishikawa |
| 8,150,620 | B2 * | 4/2012 | Motoyama ............... 701/410 |
| 8,392,113 | B2 | 3/2013 | Gupta et al. |
| 8,472,729 | B2 | 6/2013 | Howard |
| 8,788,202 | B2 | 7/2014 | Schilling et al. |
| 2003/0161405 | A1 | 8/2003 | Howard |
| 2004/0249568 | A1 | 12/2004 | Endo et al. |
| 2004/0260466 | A1 | 12/2004 | Ichihara et al. |
| 2005/0096842 | A1 * | 5/2005 | Tashiro ............... 701/210 |
| 2005/0157884 | A1 | 7/2005 | Eguchi |
| 2005/0187702 | A1 | 8/2005 | Yoshikawa et al. |
| 2005/0243918 | A1 | 11/2005 | Ebara et al. |
| 2006/0004511 | A1 | 1/2006 | Yoshikawa et al. |
| 2006/0200258 | A1 | 9/2006 | Hoffberg et al. |
| 2007/0010941 | A1 | 1/2007 | Marsh |
| 2007/0154090 | A1 | 7/2007 | Howard |
| 2007/0208498 | A1 | 9/2007 | Barker et al. |
| 2008/0228389 | A1 | 9/2008 | Kano et al. |
| 2008/0270016 | A1 | 10/2008 | Proietty et al. |
| 2009/0005977 | A1 | 1/2009 | Chung et al. |
| 2009/0041128 | A1 | 2/2009 | Howard |

FOREIGN PATENT DOCUMENTS

| | | |
|---|---|---|
| CN | 101246021 A | 8/2008 |
| CN | 101322011 A | 12/2008 |
| CN | 101685020 A | 3/2010 |
| EP | 1566611 A1 | 8/2005 |
| EP | 1 635 141 A1 | 3/2006 |
| JP | H03-238599 A | 10/1991 |
| JP | 2000283776 A | 10/2000 |
| JP | 2002310702 A | 10/2002 |
| JP | 2003021524 A | 1/2003 |
| JP | 2004 233230 A | 8/2004 |
| JP | 2005140582 A | 6/2005 |
| JP | 2005140582 A | 7/2005 |
| JP | 2005201793 A | 7/2005 |
| JP | 2005233814 A | 9/2005 |
| JP | 2007040912 A | 2/2007 |
| JP | 2007139794 A | 6/2007 |
| JP | 2007218777 A | 8/2007 |
| JP | 2008020414 A | 1/2008 |
| JP | 2008215860 A | 9/2008 |
| JP | 2008224547 A | 9/2008 |
| JP | 2008309665 A | 12/2008 |
| JP | 2009516829 A | 4/2009 |
| WO | 99/22205 A1 | 5/1999 |
| WO | 2009/053405 A1 | 4/2009 |
| WO | 2009092812 A1 | 7/2009 |
| WO | 2011004026 A2 | 1/2011 |

OTHER PUBLICATIONS

XP002612394—Daniel Delling: "Engineering and Augmenting Route Planning Algorithms", PHD Thesis, Feb. 10, 2009 Universität Karlsruhe (TH), Fakultät für Informatik Retrieved from the Internet: URL:http://i11www.ira.uka.de/extra/publications/d-earpa-09.pdf [retrieved on Dec. 2, 2010].

XP002612373—Reinhard Bauer, Daniel Delling: "SHARC: Fast and Robust Unidirectional Routing", ACM Journal of Experimental Algorithmics, vol. 14,2.4, May 2009.

XP019107027—Daniel Delling Ed—Dan Halperin et al: "Time-Dependent SHARC-Routing", Sep. 15, 2008, Algorithms—ESA 2008; [Lecture Notes in Computer Science], Springer Berlin Heidelberg, Berlin, Heidelberg, pp. 332-343, ISBN: 978-3-540-87743-1.

XP002612372—Rolf H. Mohring, Heiko Schilling, Birk Schütz, Dorothea Wagner, Thomas Willhalm: "Partitioning graphs to speedup Dijkstra's algorithm", ACM Journal of Experimental Algorithmics, vol. 11, 2.8, 2007, pp. 1-29, ISSN: 1084-6654, DOI: 1187436.1216585.

XP019121077—Daniel Delling et al: "Engineering Route Planning Algorithms", Nov. 30, 2008, Algorithmics of Large and Complex Networks, Springer Berlin Heidelberg, Berlin, Heidelberg, pp. 117-139, ISBN: 978-3-642-02093-3.

XP000949386—Jakobsson M: "Huffman Coding in Bit-Vector Compression", Information Processing Letters, Amsterdam, NL, vol. 7, No. 6, Oct. 1, 1978, pp. 304-307, ISSN: 0020-0190, 001: DOi:10. 1016/0020-0190(78)90023-6.

International Search Report issued Mar. 15, 2011 for International Application No. PCT/EP2010/059944.

M. Hilger, E. Koehler, R.H. Moehring, and H. Schilling, "Fast Point-to-Point Shortest Path Computations with Arc-Flags", Mathematical Programming, Feb. 2007.

M. Hilger, "Accelerating Point-to-Point Shortest Path Computations in Large Scale Networks", Master's thesis, Technische Universität Berlin, 2007.

P. Sanders, D. Schultes, and C. Vetter, "Mobile Route Planning", In Proceedings of ESA. 2008, 732-743.

\* cited by examiner

Variable size data after coalescing:

8 regions, grouping to use 4-bit bit vector flags

Grouping from region A point of view

Grouping from region B point of view

2010

NAVIGATION DEVICES AND METHODS CARRIED OUT THEREON

This application is the National Stage of International Application No. PCT/EP2010/059944, filed on Jul. 9, 2010, and designating the United States. The entire contents of this application is incorporated herein by reference.

The application claims priority from U.S. Provisional Application No. 61/213,746, filed Jul. 9, 2009; the entire contents of which is incorporated herein by reference.

FIELD OF THE INVENTION

The present invention relates to a computerised method of determining a route using map data and related systems. In particular, but not exclusively, the method may be used in a navigation device used to facilitate route planning.

BACKGROUND OF THE INVENTION

Route planning algorithms (such as the Dijkstra method, A* method or Moore/Pape methods) are known. However, these can be somewhat slow. An example of how the speed of such route planning may be increased is shown in U.S. Pat. No. 6,636,800, the teaching of which are hereby incorporated by reference. U.S. Pat. No. 6,636,800 teaches pre-processing of map data by dividing the map into regions and determining a tree of shortest paths (minimum cost paths) to each region of the map. This pre-processed data is stored in memory and used during the calculation of a route.

More specifically, when an origin lies within one region and a destination lies within another region, the pre-determined tree of shortest paths can be used to quickly determine the path between the regions to be used as part of the route. Such a method reduces the level of processing required to determine a route because it reduces the number of paths explored from when a user requests determination of a route.

It will be understood that "shortest" path does not necessarily mean the path of shortest distance but means the path having the minimum cost. The cost of path will depend on the factors being considered as specified in a cost formula and may take into account factors such as quickest route and fuel usage.

Such a method is very successful when the shortest paths between regions remain static. However, changes in traffic conditions over time can change the path that is the shortest path between regions such that the pre-processed tree no longer identifies the true shortest paths between regions. This can result in a route being determined that is not the optimum route for specified criteria.

SUMMARY OF THE INVENTION

According to a first aspect of the invention there is provided a method of determining a route using map data comprising a plurality of navigable paths, the map data divided into a plurality of regions, the method comprising using at least one processing apparatus to: receive an origin and a destination on the map data and a travel time, determine a route from the origin to the destination using the map data and minimum cost data that identifies minimum cost paths between regions of the map data, characterised in that the minimum cost data identifies more than one minimum cost path between a pair of the regions if different minimum cost paths exist between the pair of regions at different times and determining a route comprises identifying from the minimum cost paths for the pair of regions comprising the origin and destination, the minimum cost path having a lowest cost at the travel time.

This invention may increase the likelihood that the minimum cost path between regions at the travel time is identified relative to using data that does not identify more than one minimum cost path between a pair of the regions if different minimum cost paths exist between the pair of regions at different times. However, using minimum cost data enables routes to be determined more quickly than when using methods that determine the minimum cost paths from scratch. For example, predictable changes in traffic conditions, such as a regular rush-hour, may alter the minimum cost paths between regions. Pre-calculating the minimum cost paths between regions at different times allows such periodic changes to be taken into account.

Determination of the route may comprise identifying from the minimum cost data minimum cost paths between a pair of regions independently of time and carrying out a cost analysis for the identified minimum cost paths for one or more relevant times derived from the travel time to determine the minimum cost path at the travel time. This may allow the minimum cost data to be of a much smaller size as the data on the minimum cost paths does not require cross-reference to the time for which those paths are the minimum cost paths. A route planner, such as a navigation device, can determine which of the subset of paths identified by the minimum cost data is the minimum cost path at the relevant times. Such an arrangement does shift a small additional processing burden to the route planner but in return a significant saving is made in the size of the minimum cost data.

However, in an alternative arrangement, the minimum cost data identifies for each minimum cost path a reference time at which the path is the minimum cost path and determining a route comprises selecting a minimum cost path from the minimum cost data having a reference time corresponding to one or more relevant times derived from the travel time. This arrangement has the advantage in that fewer potential routes will have to be explored to find the minimum cost route.

The relevant time may be a predicted time of arrival at a node connected by the minimum cost path. A node is a point on the map where navigable paths intersect/diverge or an end point of a navigable path. Accordingly, the minimum cost paths identified through cost based analysis or selected for use in the route will not all be for a single time but will be for different times depending upon the time of arrival at nodes along the route. For example, if it is predicted that it takes an hour to travel a route, minimum cost paths for times across that hour will be identified/selected based on the time of arrival at nodes along the route. Furthermore, analysing/selecting minimum cost data and determining a route may go hand-in-hand in that minimum cost data can only be selected once a proportion of the route has been determined.

The travel time may be the departure time from the origin, arrival time at the destination or a time of arrival at a particular location (such as a node) along the route.

It has been found that to achieve a desired level of accuracy, a time resolution of the minimum cost data should be of the order of seconds, preferably of the order of deciseconds and most preferably, of the order of centiseconds. Using minimum cost data with a courser level of time samples has been found to result in an unacceptable level of accuracy. Furthermore, working within base ten of deciseconds or centiseconds may simplify calculations relative to base sixty of seconds. It may be desirable to avoid a finer level than centiseconds as this may require a larger number of bits for storing the data. It is understood that a time resolution of centiseconds can be stored as a 32 bit string whereas higher resolutions may require a 64 bit string.

The routing algorithm may be a routing algorithm that assigns costs to different paths based on a cost formula. The map data may comprise speed profile data identifying the expected speed on paths at different times. The plurality of paths of the map data may be divided into a plurality of navigable segments and the speed profile data may identify a speed profile for each navigable segment. The cost of a path may be determined, at least in part, from the speed profile of the navigable segments that make up that path.

In one embodiment, the method comprises determining from the speed profile data speeds for the relevant times, wherein a cost is calculated from the determined speeds for each of the routes being considered.

In an alternative embodiment, the method comprises determining a cost profile from multiple values (rather than a single value) of the speed profiles of the navigable segments of the route(s) being considered. In other words, a cost formula receives profiles (ie functions) as an input and outputs a profile that represents the cost of the route at different times. In this way, variations in the cost of a route over time can be determined.

The method may comprise determining a plurality of routes for different travel times between a common origin and destination. For example, the plurality of routes may be used to compare how different travel times affect the route and/or predicted time to travel along the route between an origin and a destination. For example, a trunk road during a rush-hour may not be the minimum cost path between regions but may become the minimum cost path outside of rush-hour. This may give rise to different routes and time of travel between the origin and destination for different travel times. Determining a plurality of routes may allow a user to make a decision about a travel time based on a comparison of the determined routes.

The determination of a plurality of routes may be combined with the creation of a cost profile to result in a cost profile from the origin to the destination for the plurality of routes.

The method may comprise receiving a profile request to determine an optimum travel time between an origin and a destination for defined criteria and, in response, determining a cost profile for a plurality of routes, each route for a different travel time, and displaying results to the user.

The display of results may be a display of the travel time for the optimum route. Accordingly, the method may comprise determining from the cost profile which route of the plurality of routes is the optimum route for the defined criteria, for example by filtering the results by comparing the values of the cost profile. In this way, the processing apparatus determines the optimum route for the user and analysis by the user is not required.

Alternatively, the display of results may be a display, such as a graph, of the cost profile. In this way, the user can select the route based on the assessment of the defined criteria as well as choosing a time that most suits him/her. For example, the fastest time to travel between an origin and a destination may be at night but the user may select a less than optimum route because it is at a more convenient time of travel, for example a time during the day. By displaying the results for all or at least more than one of the plurality of routes, the user can make an informed decision about the travel time and how this affects the route.

In one embodiment, the profile request includes a time frame within which the search for routes is confined. For example, the user may specify that the travel time should be between two times, for example between 6am and 9am, or on a certain day, for example on a Monday, on certain date, for example 1 July, certain week or certain month. Alternatively, the processing apparatus may automatically search for routes having travel times that fall within a window of a user specified travel time, for example 30 minutes either side of a user travel time, and suggest an alternative travel time to the user if a route having a different travel time is found with a lower cost than for the route having the user specified travel time.

In one embodiment, the method comprises receiving from a user via a user interface the travel time and causing a display to display an image of the determined route. The method may comprise enabling the user to change the travel time whilst viewing the image of the map data showing the determined route. For example, in response to a change in the travel time, a new route may be determined for the changed specified travel time and the display updated with an image of the new route. Alternatively, the minimum cost routes for other times may have been determined in advance (for example through determination of a cost profile as described above). Updating of the display may occur in "real-time", for example of the order of milliseconds, for example in less than 1000 milliseconds and preferably less than 500 milliseconds. Such fast re-calculation times are available through the use of the pre-processed minimum cost data used to identify minimum cost paths between regions. Updating of the display may be carried out by refreshing the entire screen, a fading out of the old route and a fading in of the new route and/or other appropriate animation. It will be understood that the new route may be the same or different from the old route depending on whether there is a change in the minimum cost paths.

In one embodiment, the method may comprise causing the display of a slider representing the travel time and determining the new route and updating the display with the image of the new route in response to user interaction with the slider. The method may comprise determining and displaying the new route such that there is an imperceptible delay to the user from when the user changes the travel time and display of the new route. For example, a delay of less than 1 second and preferably less than 0.5 seconds between the user moving the slider and the display of the new route.

According to a second aspect of the invention there is provided a data carrier having stored thereon instructions which, when executed by a processing apparatus, causes the processing apparatus to execute a method according to the first aspect of the invention.

According to a third aspect of the invention there is provided a data carrier having stored thereon map data comprising a plurality of navigable paths, the map data divided into a plurality of regions, and minimum cost data identifying minimum cost paths between the regions of the map data at different times.

Such a data carrier is advantageous as it can be used in the determination of a route according to the first aspect of the invention.

According to a fourth aspect of the invention there is provided a computer device comprising memory having stored therein map data comprising a plurality of navigable paths, the map data divided into a plurality of regions, minimum cost data identifying minimum cost paths between the regions of the map data and processing apparatus arranged to receive an origin and a destination on the map data and a travel time and determine a route from the origin to the destination using the map data and the minimum cost data, characterised in that the minimum cost data identifies more than one minimum cost path between a pair of the regions if different minimum cost paths exist between the pair of regions at different times and determining a route comprises identifying from the minimum cost data when taking into account the travel time a minimum cost path for the route between regions comprising the origin and destination.

According to a fifth aspect of the invention there is provided a method of determining a route using map data comprising a plurality of navigable segments representing segments of navigable paths of the map data, minimum cost data identifying minimum cost paths between regions of the map data, the minimum cost data identifying more than one minimum cost path between a pair of the regions if different minimum cost paths exist between the pair of regions at different times, and speed profiles for the navigable segments identifying how the speed on the navigable segments varies with time, the method comprising using at least one processing apparatus to: search for one or more routes from an origin to a destination on the map data, the search comprising determining whether one or more navigable segments of a set of navigable segments connected to a node are identified by the minimum cost data as part of a minimum cost path for regions comprising the origin and destination and, if one or more of the navigable segments of the set are identified as being part of a minimum cost path, exploring from the set only the one or more navigable segments that are identified as being part of a minimum cost path and determining a cost profile of the one or more routes over time from the speed profiles of the navigable segments that are explored.

The cost profile allows a user and/or a navigation apparatus to determine how changing a travel time will alter the cost of the route. In this way, a travel time can be selected based on the cost profile.

According to a sixth aspect of the invention there is provided a data carrier having stored thereon instructions which, when executed by a processing apparatus, causes the processing apparatus to execute a method according to the fourth aspect of the invention.

According to a seventh aspect of the invention there is provided a computer device comprising memory having stored therein map data comprising a plurality of navigable segments representing segments of navigable paths of the map data and speed profiles for the navigable segments identifying how the speed on the navigable segments varies with time and processing apparatus arranged to search for one or more routes from an origin to a destination on the map data, the search comprising determining whether one or more navigable segments of a set of navigable segments connected to a node are identified by the minimum cost data as part of a minimum cost path for regions comprising the origin and destination and, if one or more of the navigable segments of the set are identified as being part of a minimum cost path, exploring from the set only the one or more navigable segments that are identified as being part of a minimum cost path and determining a cost profile of the one or more routes over time from the speed profiles of the navigable segments that are explored.

According to an eighth aspect of the invention there is provided a navigation device comprising a positioning system, a display, a user interface, and a computer device according to the fourth aspect of the invention, wherein the processor is arranged to derive the origin and the destination through inputs on the user interface and display results of the determination on the display. The processor may determine the travel time from input on the user interface, from a current time as indicated by an internal clock or may determine a plurality of routes with different travel times.

According to a ninth aspect of the invention there is provided a method of determining and displaying a route using map data comprising a plurality of navigable segments representing segments of navigable paths of the map data and speed profiles for the navigable segments, the method comprising determining a route along the navigable segments in response to inputs on the user interface, determining an expected speed along navigable segments of the route from the associated speed profiles and displaying the determined route with an indication of the expected speed on at least some of the navigable segments of the route.

According to a tenth aspect of the invention there is provided a data carrier having instructions stored thereon which, when executed by a processor, causes the processor to carry out the method of the fifth aspect of the invention.

According to an eleventh aspect of the invention there is provided a computer device comprising a display, a user interface, memory having stored therein map data comprising a plurality of navigable segments representing segments of navigable paths of the map data and speed profiles for the navigable segments, the speed profiles representing a predicted speed of travel along that segment at different times, and processing apparatus arranged to determine a route along the navigable segments in response to inputs on the user interface, determine an expected speed along navigable segments of the route from the associated speed profiles and cause the display to display the determined route with an indication of the expected speed on at least some of the navigable segments of the route.

The processing apparatus may cause the display to display a travel time that the user can change through interaction with the user interface, wherein in response to changes to the time of travel, the processor determines updated expected speeds along navigable segments of the route for the new travel time and updates the display of the route to indicate the updated expected speeds.

The travel time may be indicated by a slider on the display that the user can move to adjust the time of travel.

The indication of the expected speed may be colour coding of the navigable segments. For example, the navigable segments may be coloured a first colour, for example green, of the expected speed is above a first threshold value (such as within 20% of the speed limit for the navigable segment) and a second colour, for example red, if the expected speed is below as second threshold value. The first and second threshold values may be the same value.

In this way, the user can determine where congestion points may be on a route and, optionally, the affect of altering the travel time on these points of congestion.

BRIEF DESCRIPTION OF THE FIGURES

There now follows by way of example only a detailed description of embodiments of the present invention with reference to the accompanying drawings in which.

DETAILED DESCRIPTION OF THE FIGURES

Figure 22:
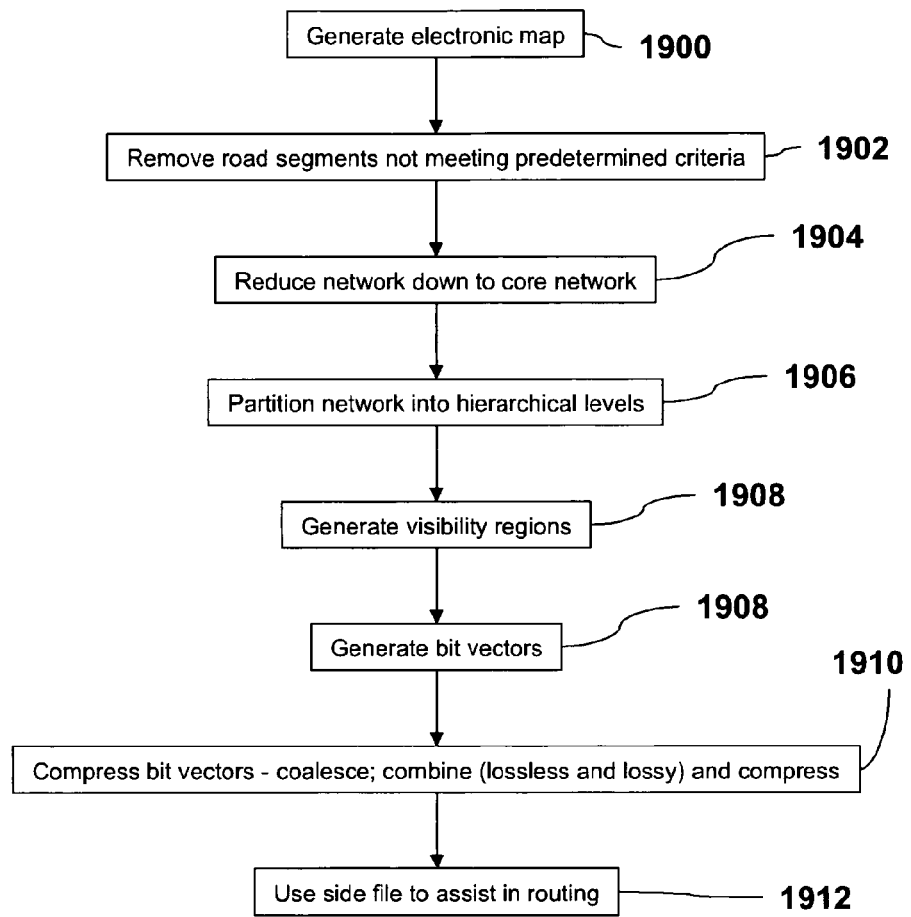
FIG. 22 shows a flow chart outlining steps of the method.

Throughout the following description the same reference numerals will be used to identify like parts. Throughout the description of the various embodiments reference is made to the flow chart of FIG. 22 which has reference numerals in the 19xx series.

Figure 1:
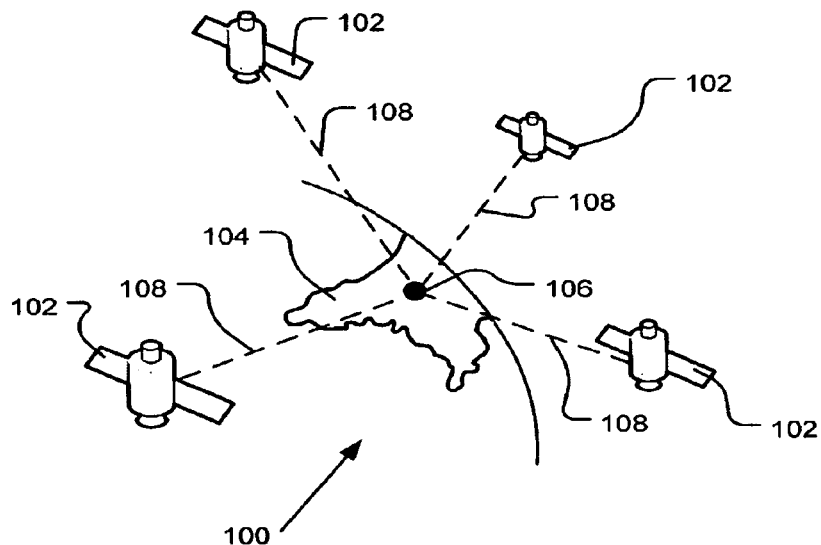
FIG. 1 is a schematic illustration of an exemplary part of a Global Positioning System (GPS) usable by a navigation device.

FIG. 1 schematically shows a Global Positioning System (GPS) which is a satellite-radio based navigation system which may be utilised to determine continuous position, velocity, time, and in some instances direction information for an unlimited number of users. Formerly known as NAVSTAR, the GPS incorporates a plurality of satellites which orbit the earth in extremely precise orbits. Based on these precise orbits, GPS satellites can relay their location, as GPS data, to any number of receiving units. However, it will be understood that Global Positioning systems could be used, such as GLOSNASS, the European Galileo positioning system, COMPASS positioning system or IRNSS (Indian Regional Navigational Satellite System).

The GPS system is implemented when a device, specially equipped to receive GPS data, begins scanning radio frequencies for GPS satellite signals. Upon receiving a radio signal from a GPS satellite, the device determines the precise location of that satellite via one of a plurality of different conventional methods. The device will continue scanning, in most instances, for signals until it has acquired at least three different satellite signals (noting that position is not normally, but can be determined, with only two signals using other triangulation techniques). Implementing geometric triangulation, the receiver utilizes the three known positions to determine its own two-dimensional position relative to the satellites. This can be done in a known manner. Additionally, acquiring a fourth satellite signal allows the receiving device to calculate its three dimensional position by the same geometrical calculation in a known manner. The position and velocity data can be updated in real time on a continuous basis by an unlimited number of users.

As shown in FIG. 1, the GPS system 100 comprises a plurality of satellites 102 orbiting about the earth 104. A GPS receiver 106 receives GPS data as spread spectrum GPS satellite data signals 108 from a number of the plurality of satellites 102. The spread spectrum data signals 108 are continuously transmitted from each satellite 102, the spread spectrum data signals 108 transmitted each comprise a data stream including information identifying a particular satellite 102 from which the data stream originates. The GPS receiver 106 generally requires spread spectrum data signals 108 from at least three satellites 102 in order to be able to calculate a two-dimensional position. Receipt of a fourth spread spectrum data signal enables the GPS receiver 106 to calculate, using a known technique, a three-dimensional position.

Thus, a GPS system allows a user of a device having a GPS receiver 106 to determine his/her position on the planet earth to within a few metres. In order to make use of this information it has become common practice to rely on electronic maps which allow the user's position to be shown thereon. Such maps are exemplified by providers such as TeleAtlas (http://www.teleatlas.com).

Not only do such electronic maps allow a user's position to be shown thereon using a GPS system (or by other means) but they allow a user to plan routes for journeys and the like (routing purposes). In order for this route planning to occur the electronic map is processed by a navigation device, which may be provided by a general computing device.

Specific examples of a navigation device include Satellite navigation devices (Sat. Nav) which are convenient to refer to as Portable Navigation Devices (PNDs). It should be remembered, however, that the teachings of the present invention are not limited to PNDs but are instead universally applicable to any type of processing device that is configured to process electronic maps, generally so as to provide route planning and navigation functionality. It follows therefore that in the context of the present application, a navigation device is intended to include (without limitation) any type of route planning and navigation device, irrespective of whether that device is embodied as a PND, a vehicle such as an automobile, a portable computing resource, for example a portable personal computer (PC), a mobile telephone or a Personal Digital Assistant (PDA) executing route planning and navigation software or a server, or other computing device, providing such functionality across a network.

Figure 3A:
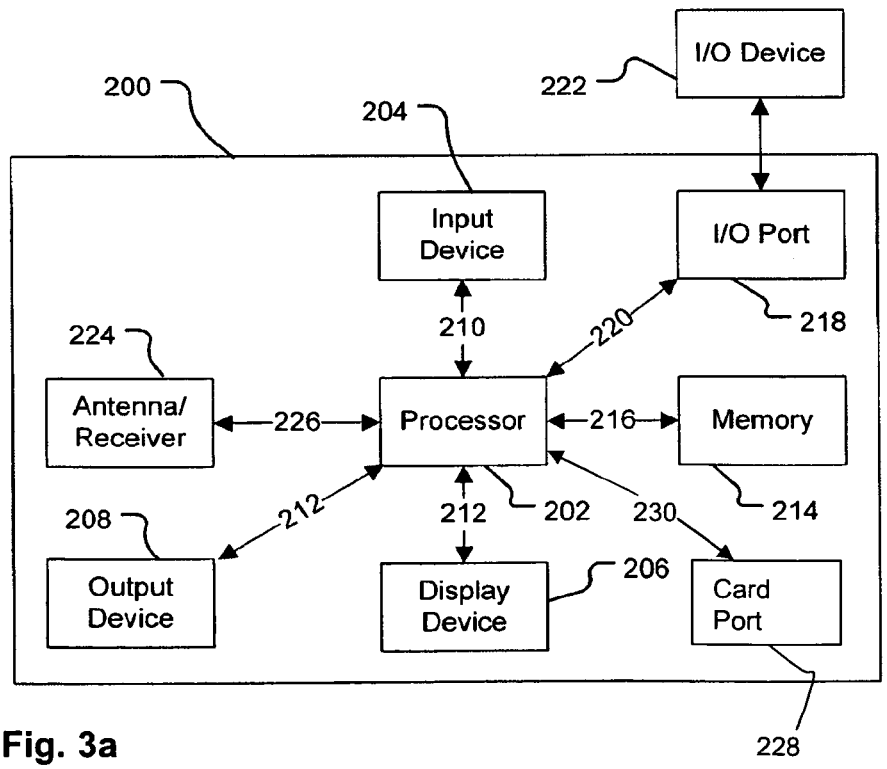
FIG. 3a is a schematic of a navigation device.

An example of such a navigation device in the form of a PND is shown in FIGS. 3a and 4b and it should be noted that the block diagram of the navigation device 200 is not inclusive of all components of the navigation device, but is only representative of many example components. The navigation device 200 is located within a housing (not shown). The navigation device 200 includes processing circuitry comprising, for example, the processor 202 mentioned above, the processor 202 being coupled to an input device 204 and a display device, for example a display screen 206. Although reference is made here to the input device 204 in the singular, the skilled person should appreciate that the input device 204 represents any number of input devices, including a keyboard device, voice input device, touch panel and/or any other known input device utilised to input information. Likewise, the display screen 206 can include any type of display screen such as a Liquid Crystal Display (LCD), for example.

In the navigation device 200, the processor 202 is operatively connected to and capable of receiving input information from input device 204 via a connection 210, and operatively connected to at least one of the display screen 206 and the output device 208, via respective output connections 212, to output information thereto. The navigation device 200 may include an output device 208, for example an audible output device (e.g. a loudspeaker). As the output device 208 can produce audible information for a user of the navigation device 200, it should equally be understood that input device 204 can include a microphone and software for receiving input voice commands as well. Further, the navigation device 200 can also include any additional input device 204 and/or any additional output device, such as audio input/output devices for example.

The processor 202 is operatively connected to memory 214 via connection 216 and is further adapted to receive/send information from/to input/output (I/O) ports 218 via connection 220, wherein the I/O port 218 is connectible to an I/O device 222 external to the navigation device 200. The external I/O device 222 may include, but is not limited to an external listening device, such as an earpiece for example. The connection to I/O device 222 can further be a wired or wireless connection to any other external device such as a car stereo unit for hands-free operation and/or for voice activated operation for example, for connection to an earpiece or headphones, and/or for connection to a mobile telephone for example, wherein the mobile telephone connection can be used to establish a data connection between the navigation device 200 and the Internet or any other network for example, and/or to establish a connection to a server via the Internet or some other network for example.

The memory 214 of the navigation device 200 comprises a portion of non-volatile memory (for example to store program code) and a portion of volatile memory (for example to store data as the program code is executed). The navigation device also comprises a port 228, which communicates with the processor 202 via connection 230, to allow a removable memory card (commonly referred to as a card) to be added to the device 200. In the embodiment being described the port is arranged to allow an SD (Secure Digital) card to be added. In other embodiments, the port may allow other formats of memory to be connected (such as Compact Flash (CF) cards, Memory Sticks™, xD memory cards, USB (Universal Serial Bus) Flash drives, MMC (MultiMedia) cards, SmartMedia cards, Microdrives, or the like).

Figure 2:
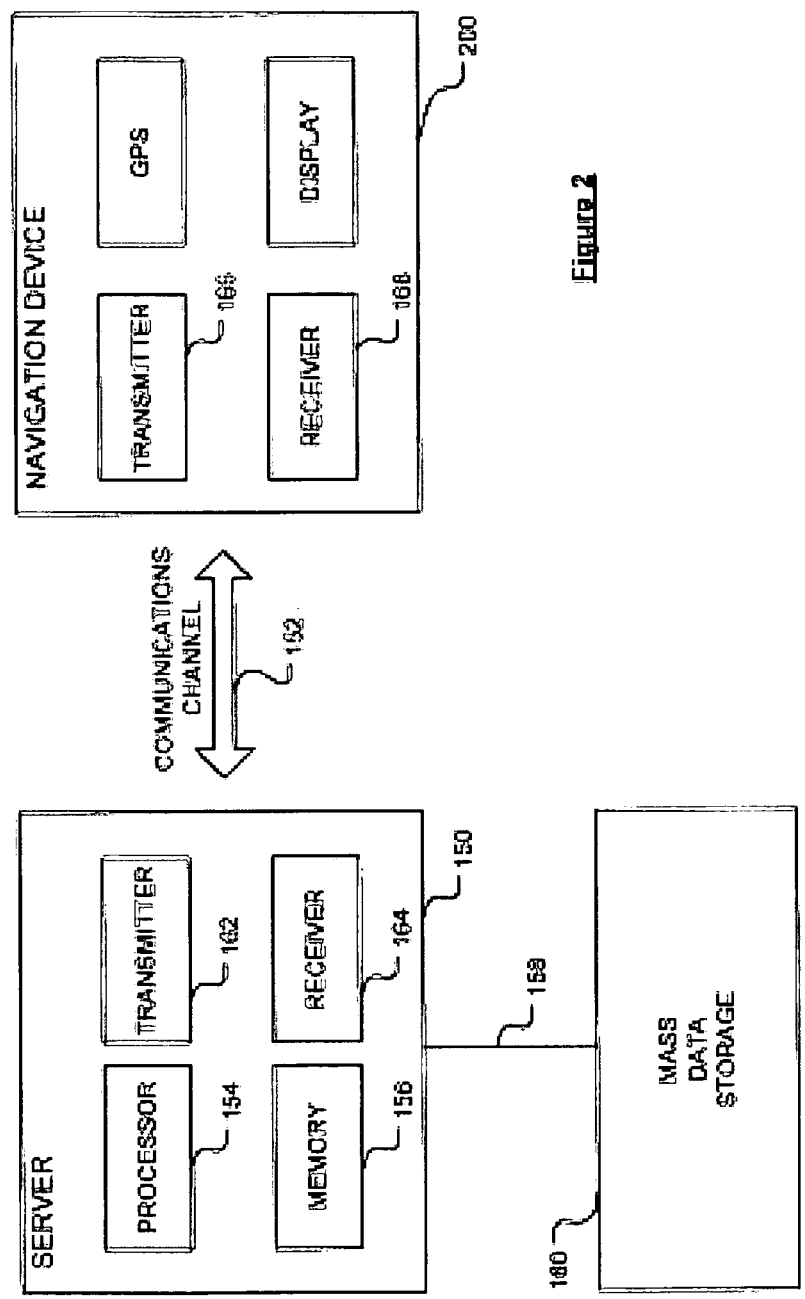
FIG. 2 is a schematic of a server and navigation device in communication across a communications channel.

FIG. 2 illustrates an operative connection between the processor 202 and an antenna/receiver 224 via connection 226, wherein the antenna/receiver 224 can be a GPS antenna/receiver for example and as such would function as the GPS receiver 106 of FIG. 1. It should be understood that the antenna and receiver designated by reference numeral 224 are combined schematically for illustration, but that the antenna and receiver may be separately located components, and that the antenna may be a GPS patch antenna or helical antenna for example.

Figure 4:
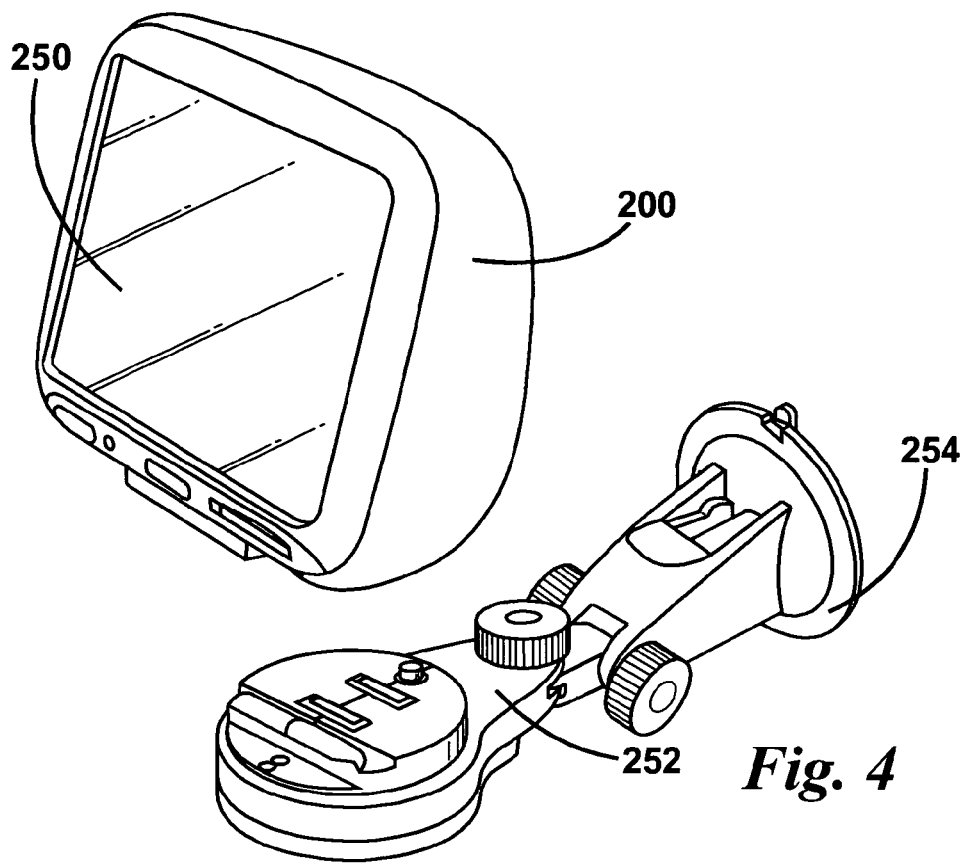

In addition, the portable or handheld navigation device 200 of FIGS. 3 and 4 can be connected or "docked" in a known manner to a vehicle such as a bicycle, a motorbike, a car or a boat for example. Such a navigation device 200 is then removable from the docked location for portable or handheld navigation use. Indeed, in other embodiments, the device 200 may be arranged to be handheld to allow for navigation of a user.

Referring to FIG. 3a, the navigation device 200 may be a unit that includes the integrated input and display device 206 and the other components of FIG. 3a (including, but not limited to, the internal GPS receiver 224, the processor 202, a power supply (not shown), memory systems 214, etc.).

The navigation device 200 may sit on an arm 252, which itself may be secured to a vehicle dashboard/window/etc. using a suction cup 254. This arm 252 is one example of a docking station to which the navigation device 200 can be docked. The navigation device 200 can be docked or otherwise connected to the arm 252 of the docking station by snap connecting the navigation device 200 to the arm 252 for example. The navigation device 200 may then be rotatable on the arm 252. To release the connection between the navigation device 200 and the docking station, a button (not shown) on the navigation device 200 may be pressed, for example. Other equally suitable arrangements for coupling and decoupling the navigation device 200 to a docking station are well known to persons of ordinary skill in the art.

Figure 3B:
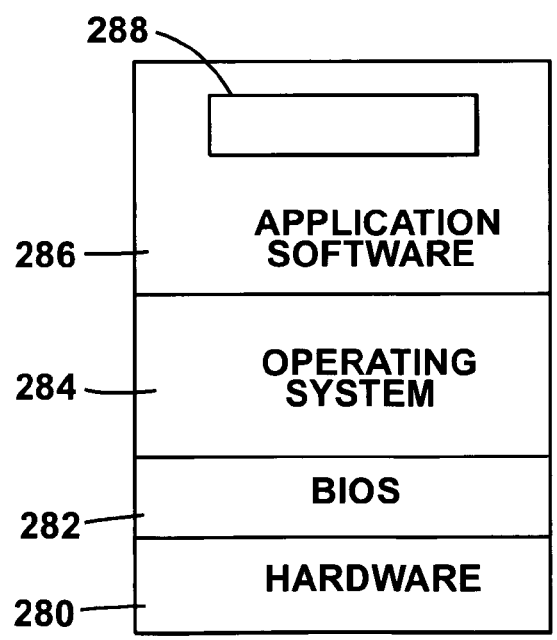
FIG. 3b is a schematic representation of an architectural stack employed by the navigation device of FIG. 3a FIG. 4 is a perspective view of a navigation device.

Turning to FIG. 3b the processor 202 and memory 214 cooperate to support a BIOS (Basic Input/Output System) 282 that functions as an interface between functional hardware components 280 of the navigation device 200 and the software executed by the device. The processor 202 then loads an operating system 284 from the memory 214, which provides an environment in which application software 286 (implementing some or all of the described route planning and navigation functionality) can run. The application software 286 provides an operational environment including the Graphical User Interface (GUI) that supports core functions of the navigation device, for example map viewing, route planning, navigation functions and any other functions associated therewith. In this respect, part of the application software 286 comprises a view generation module 288.

In the embodiment being described, the processor 202 of the navigation device is programmed to receive GPS data received by the antenna 224 and, from time to time, to store that GPS data, together with a time stamp of when the GPS data was received, within the memory 214 to build up a series of positions of the navigation device. Each data record so-stored may be thought of as a GPS fix; ie it is a fix of the location of the navigation device and comprises a latitude, a longitude, a time stamp and an accuracy report. This series of positions may be thought of as positioning data.

In one embodiment the data is stored substantially on a periodic basis which is for example every 5 seconds. The skilled person will appreciate that other periods would be possible and that there is a balance between data resolution and memory capacity; ie as the resolution of the data is increased by taking more samples, more memory is required to hold the data. However, in other embodiments, the resolution might be substantially every: 1 second, 10 seconds, 15 seconds, 20 seconds, 30 seconds, 45 seconds, 1 minute, 2.5 minutes (or indeed, any period in between these periods). Thus, within the memory of the device there is built up a record of the whereabouts of the device 200 at points in time.

In some embodiments, it may be found that the quality of the captured data reduces as the period increases and whilst the degree of degradation will at least in part be dependent upon the speed at which the navigation device 200 was moving a period of roughly 15 seconds may provide a suitable upper limit.

Further, the processor 202 is arranged, from time to time, to upload the record of the whereabouts of the device 200 (ie the GPS data and the time stamp) to a server. In some embodiments in which the navigation device 200 has a permanent, or at least generally present, communication channel connecting it to the server the uploading of the data occurs on a periodic basis which may for example be once every 24 hours. The skilled person will appreciate that other periods are possible and may be substantially any of the following periods: 15 minutes, 30 minutes, hourly, every 2 hours, every 5 hours, every 12 hours, every 2 days, weekly, or any time in between these. Indeed, in such embodiments the processor 202 may be arranged to upload the record of the whereabouts on a substantially real time basis, although this may inevitably mean that data is in fact transmitted from time to time with a relatively short period between the transmissions and as such may be more correctly thought of as being pseudo real time. In such pseudo real time embodiments, the navigation device may be arranged to buffer the GPS fixes within the memory 214 and/or on a card inserted in the port 228 and to transmit these when a predetermined number have been stored. This predetermined number may be on the order of 20, 36, 100, 200 or any number in between. The skilled person will appreciate that the predetermined number is in part governed by the size of the memory 214/card within the port 228.

In other embodiments, which do not have a generally present communication channel the processor may be arranged to upload the record to the server when a communication channel is created. This may for example, be when the navigation device 200 is connected to a user's computer. Again, in such embodiments, the navigation device may be arranged to buffer the GPS fixes within the memory 214 or on a card inserted in the port 228. Should the memory 214 or card inserted in the port 228 become full of GPS fixes the navigation device may be arranged to delete the oldest GPS fixes and as such it may be thought of as a First in First Out (FIFO) buffer.

In the embodiment being described, the record of the whereabouts comprises one or more traces with each trace representing the movement of that navigation device 200 within a 24 hour period. Each 24 hour period is arranged to coincide with a calendar day but in other embodiments, this need not be the case.

The server 150 is arranged to receive the record of the whereabouts of the device and to store this within a mass data storage for processing. Thus, as time passes the mass data storage accumulates a plurality of records of the whereabouts of navigation devices 200 which have uploaded data. Generally, the server will collect the whereabouts of a plurality of navigation devices 200.

The server may then be arranged to generate speed data from the collected whereabouts of the or each device. This speed data may comprise s time varying speed profile showing how the average speed along navigable segments of a map vary with time.

Figure 6:
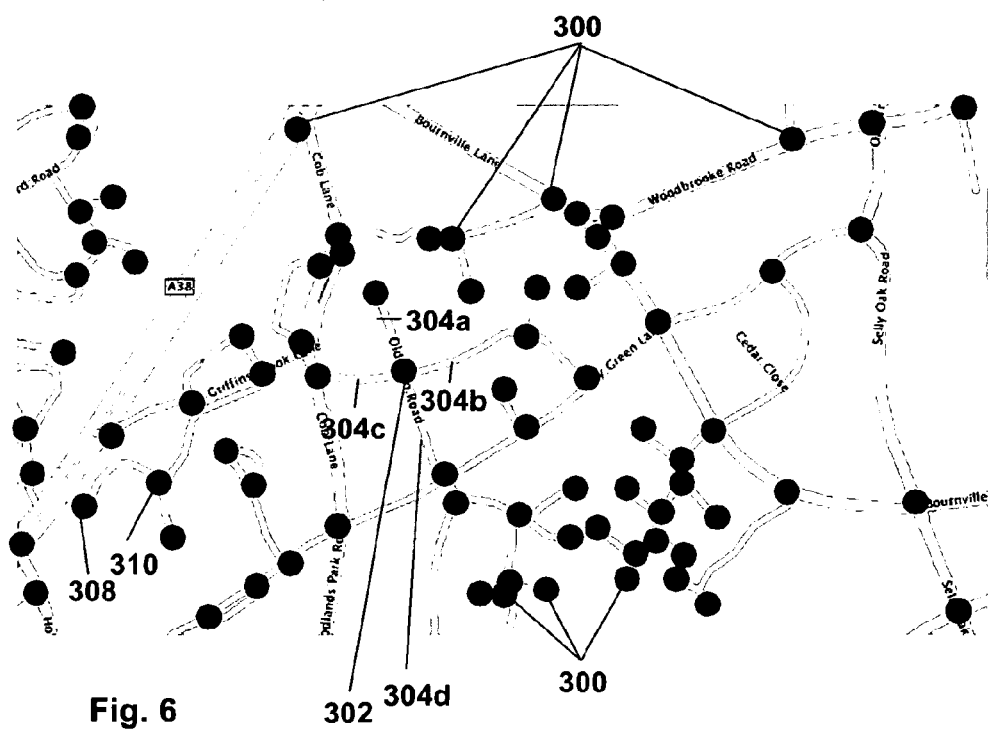
FIG. 6 shows the map of FIG. 5 on which nodes used for routing are shown.
Figure 7:
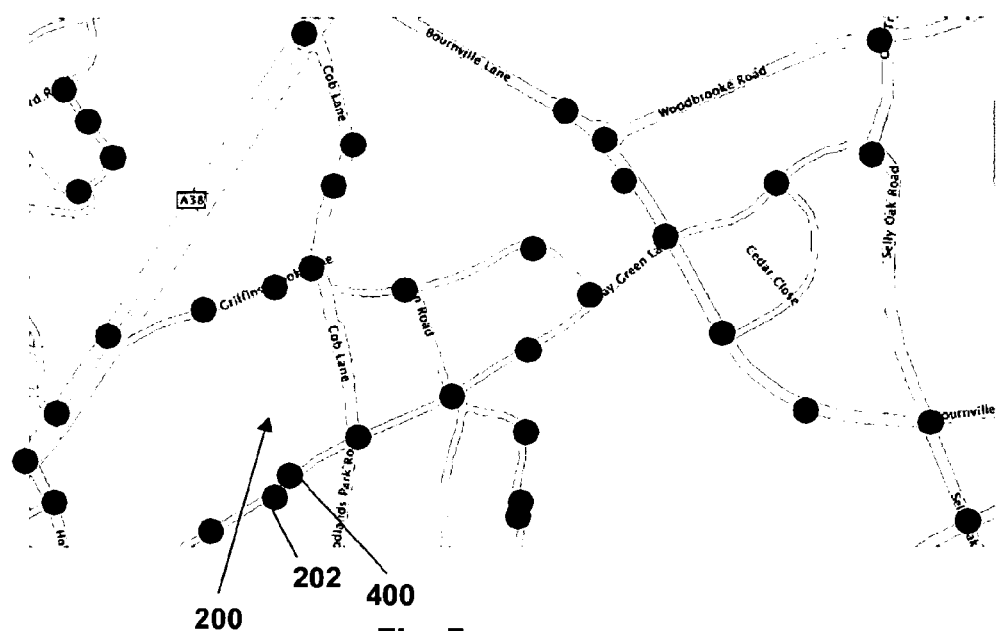
FIG. 7 shows the map of FIG. 5 following processing.

FIG. 7 shows an example of an electronic map which, in the embodiment being described, is viewed on a navigation device across a network which in this case is the Internet. A first step in any of the embodiments being described herein is generation of such an electronic map 1900. The map may be viewed at: http://routes.tomtom.com/?Lid=1#/map/?center=55.01%2C-3.445&zoom=4&map=basic In order for the electronic map of FIG. 7 to be used for routing purposes it has a series of nodes therein which are not typically seen by a user of the electronic map. As such, the nodes, etc. may typically be referred to as map data. However, some of the nodes 300 are shown in FIG. 6 for ease of understanding. These nodes are provided at intersections, end regions of navigable segments, in this case road segments, etc. and are used for routing purposes When a user asks his/her navigation device to plan a route between two or more points the navigation device plans the route between the relevant nodes of the map. As such, the map data can be used to generate a route according to at least one criterion set by a user of the navigation device.

The skilled person will appreciate that the electronic map also comprises further nodes which provide the shape of road segments, the location of entrances to buildings, etc.

Thus, each node 300 has at least a single, and generally a plurality, of road segments which a user may travel along emanating therefrom. For example, the node 302 has four such road segments 304$a,b,c,d$. In other embodiments, the navigable segments may represent the segments of paths that are not roads, such as footpaths, cycle paths, canals, railway road segments, tracks, or the like. For convenience however reference is made to a road segment. Thus, the map as shown in FIG. 7 shows to a user thereof a plurality of road segments, each of which represents a portion of a navigable route in the area covered by the map.

Route planning methods (such as the Dijkstra method, A* method or Moore/Pape methods) are known. However, these can be prohibitively slow in terms of calculation times. An example of how the speed of such route planning may be increased is shown in U.S. Pat. No. 6,636,800, the teaching of which are hereby incorporated by reference.

Embodiments being described herein generate, in a preprocessing step, a so-called side file containing minimum cost data which is used by the navigation device to accelerate generation of a route when processing the electronic map. This information may be held as binary data in what may be termed a bit-vector, ie a string of 0's and 1's. As such, the side file may also be thought of as map data but the side-file may be supplied with or without the electronic map (for example, as shown in FIG. 7). Thus, some embodiments of the invention may provide the map data as a map separable from a side file, whereas other embodiments of the invention may combine the map and side file data.

However, the skilled person will appreciate that if a side file is used then it should be used with the electronic map for which the side file was generated. If this is not performed then it is conceivable that incorrect routes will be obtained (eg routes which do not minimize the cost formula set by a user thereof).

Also, different embodiments of the invention may specify different parameters for the generation of the minimum cost data (in this embodiment a series of bit vectors). As such, if subsequent route planning using the generated map data uses different parameters to those used to create the minimum cost data the minimum cost data is unlikely to be useful for that route planning.

For example, some embodiments may generate minimum cost data for travel through the map by car. If subsequent route planning is used to generate a route for walking then the car specific minimum cost data is unlikely to be useful. In another example, some embodiments may generate the minimum cost data assuming that a user is happy to travel along a motorway, toll road, etc. If, in subsequent route planning, a user requests a route which does utilise motorways, toll roads, etc. then the minimum cost data is unlikely to be useful.

Some embodiments of the invention may generate a plurality of sets of minimum cost data each having a different set of predetermined criterion. For example, embodiments of the invention may generate roughly any of the following: 2, 3, 4, 5, 6, 10, 15, or more sets of minimum cost data.

Thus, in some embodiments and to generate the side file, in a map pre-processing step the nodes are divided into a plurality of regions and as such, any map is divided into a known number of regions—for example N—and minimum cost paths between the regions are determined. This pre-processing generates data which can be utilised along-side the map in order to increase the speed of the route planning methods.

Typically the pre-processing is performed before the map data is used regardless of whether the map data is to be used on a web site or on a device such as a PND. As such, the pre-processing step is often referred to as a server side process.

Whilst any general computing device would be suitable for performing the pre-processing, the skilled person will appreciate that the higher the performance of the apparatus, the faster the pre-processing will be performed. Typically X86 architecture computing device will be utilised for the pre-processing. Such an X86 architecture device would typically run an operating system (OS) such as Microsoft™ Windows™, UNIX, LINUX, OSX™ etc. However, other embodiments may use other computing platforms such as a RISC architecture.

Also, as discussed elsewhere the pre-processing may be performed in parallel and as such may be performed on a plurality of computing devices, or at least on a plurality of processor cores (which may be virtual or real processor cores).

As a next pre-processing step, each road segment (eg 304a-d) within a region is processed to determine whether it is part of a minimum cost path to each of the number of regions (N) within the map and a bit vector is generated (the minimum cost assessment). Thus, the bit vector, for each road segment within a region, comprises a bit for each region of the map. That is the bit vector comprises N−1 bits (1 for each region less the region in question) which are either set to 0 or 1 depending on whether that road segment forms part of the minimum cost path to the region represented by the bit. Some embodiments, may add additional bits to provide further information such as headers, visibility areas, neighbouring areas, and the like.

The skilled person will appreciate that in this sense the minimum cost path can be determined against a number of different cost criterion. For example the minimum cost may be judged against any of the following criterion: shortest distance; shortest travel time; least expensive (in terms of environmental impact); least petrol used; least $CO_2$ generated, etc. In the current embodiment the minimum cost is judged against the shortest travel time.

Thus, the skilled person will appreciate that for a map covering a significant area N is likely to be large. Thus, the pre-processing can take a significant amount of time.

Thus, in an example map, for example covering Western and Central Europe there might typically be 40,000,000 nodes having 100,000,000 road segments. Assume that there are 100 regions within the map then N equals 100 and there are 100,000,000×100 (N); ie $10×10^9$ bits are needed to store the 99 (ie N−1) bits for each road segment of the map. Using embodiments of the invention described below, such a map may use roughly 500 Mb of storage.

WO2009/053410 discusses a method which assigns speed profiles which give the speed along a navigable segment of a map as a function of time. The contents of this application are hereby incorporated by reference. As such, and for routing purposes, whether or not a navigable segment constitutes part of the fastest route to another region will vary as a function of time. That is, as the traffic density increases/decreases, for example in rush hours and the like, it will become less/ more desirable respectively to use a navigable segment.

Some embodiments may store a plurality of bit vectors for each road segment. The skilled person will appreciate that the higher the resolution at which the speed is recorded the higher the number of bit vectors required. However, other embodiments may make an assessment of the fastest route utilising a time varying function much as described in WO2009/053410.

When route planning across the electronic maps it is believed that it is necessary to be able to do this using a time granularity of roughly centi-second accuracy; that is to be able to specify the time of departure from a node to an accuracy of 0.01 of a second in order to correctly determine the lowest cost route.

Thus, when considering this level of accuracy it will be appreciated that for the map considered above having 40,000,000 nodes and 100,000,000 road segments has $100,000,000^2$ possible routes therethrough. When the time dimension is further considered the number of routes is further increases: 7 (ie days per week)×24 (ie hours per day)×3600 (ie seconds per hour)×100 (ie cent-seconds per second)×$100,000,000^2$=604.800.000.000.000.000.000.000 (sextillion) possible routes. At current processing levels and using a naive approach in which each segment is explored at each time interval would take 19.178.082.191.780.821 years. The map of Western and Central Europe that the applicant currently sells has 120,000,000 road segments thereby increasing this further.

Thus, it will be appreciated that a significant amount of data is required in order to store and process the data in the pre-processing stages.

As such, embodiments of the present invention use techniques in order to significantly reduce the amount of pre-processing. These techniques are now described in more detail and some embodiments of the invention may utilise all, whereas other embodiments may utilise only some of the techniques.

Different embodiments of the invention may use different combinations of the features outlined below. As such, some embodiments may utilise all of the techniques described to reduce the amount of information. At the other extreme, other embodiments may utilise none of the techniques to reduce the data.

Some embodiments of the invention do not calculate bit vectors for road segments which do not meet predetermined criterion—as shown as step 1902. For example, road segments may not have bit vectors calculated for them if it is not possible to travel along that road segment in a predetermined class of transport.

Thus, in an example where criterion of mode of transport is set to a car the following road segments may not have bit vectors calculated for them:
  railways;
  segments present in the map data which do not correspond
    to road segments;
  one way road in wrong (illegal) direction;

road-segments that are non-navigable by a form of transport (eg pedestrian zones, footpaths, when considering drivability by car);

road segments at a non-decision point (ie no turns away from road segment);

Reduction of Network

One technique is to reduce the size of the network that is considered for the assessment as to whether road segments forms part of a minimum cost path; reducing the number of road segments reduces the amount of time it takes to make the calculation as shown at step 1904.

To illustrate this technique, the road network as shown in FIG. 7 is also shown in FIG. 6 but with road segments which are not useful for the minimum cost assessment deleted therefrom. This reduction of the network aims to provide the smallest sub network on which the minimum cost assessment should be made.

In mathematical terms the network that is left, and as illustrated in FIG. 7, can be described as the largest biconnected component of the undirected representation of the largest strong component of the road network of FIG. 7. The core network is determined by applying standard techniques for both strong-connectivity (also known as bi-connectivity) with adaption to road traffic regulations such as turn restrictions and local access. The skilled person will appreciate that strong-connectivity indicates that travel is possible in both directions between two nodes (ie from A→B as well as B→A).

Figure 5:
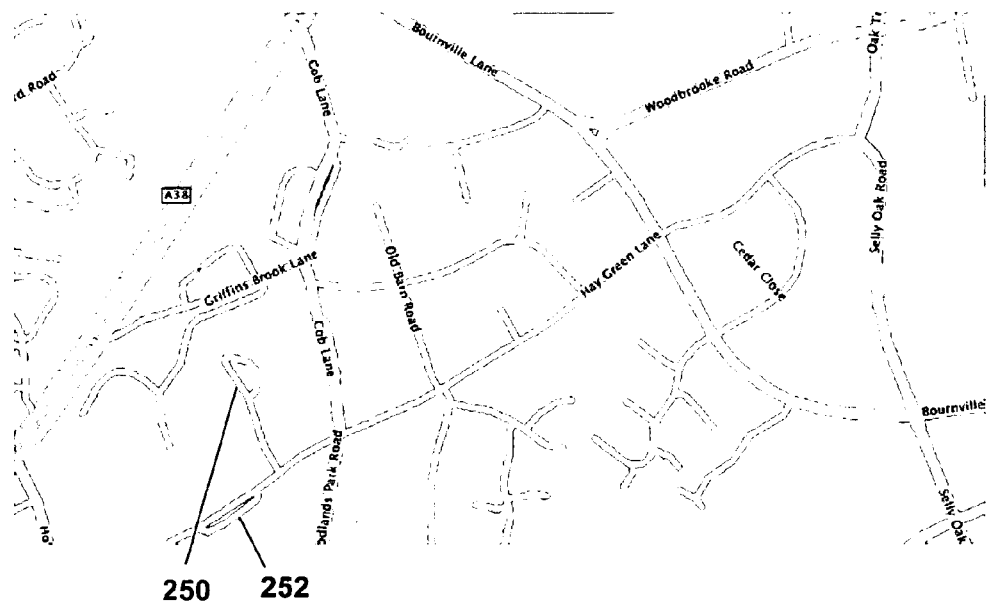
FIG. 5 shows a portion of an example map as generated by embodiments of the invention.

Thus, referring to both FIGS. 5 and 7 it can be seen that dead-ends such as the cul-de-sac 250, redundant loops 252, etc. have been deleted. However, it will be seen that a node (eg 400 in FIG. 7) remains at the origin of the road-segments that have been removed. This is for reasons discussed hereinafter.

Subsequent to the reduction down to the core network (eg as shown in FIG. 7), the core network is partitioned to provide the regions described above. In the embodiment being described, the network is partitioned according to multiway arc separators. The skilled person will appreciate that in such a network if the road segments (ie the arcs) which are bisected by region boundaries are removed then the road segments that remain in any one region would not be connected to any other region.

Partitioning Network—Step 1906

However, before partitioning is performed the following steps are made:

1. Islands are determined and partitioned independently. Islands tend to be physically separated from other parts of the network and link thereby by means such as ferry links, etc. These behave differently from typical road segments (ie average speeds are significantly lower, etc) and if such links are included in the partitioning then the method does not perform as well as may be expected.
2. Crossings, roundabouts and other junctions, which are represented by more than one node in the network are contracted so that nodes belonging to the same crossing, etc. do not end up in different regions.
3. Simple paths (ie connections between two nodes without turn possibilities) where all navigable segments share the same set of characteristics (eg ferry, NoDriving, Nothrough, etc) are contracted to reduce the input size of the network passed to the partitioning system. For example, looking at FIG. 6, node 308 may be collapsed onto road 310.

Embodiments of the invention being described employ a divide and conquer approach which is outlined at http://labri.fr/perso/pelegrin/scotch. The methods outlined herein divide the map to comprise a number of regions which are not based upon an area of the map but which are based upon the number of nodes contained within a region. Having nodes which are so organised has the advantage that it can help to make routing using the regions more efficient because it helps to deliver regions having similar local search diameters.

Each node has identity numbers associated therewith including a region ID and as such, nodes in the same region have same region ID numbers. Nodes belong to regions at L hierarchical levels. Level 0 is by convention the coarse level (used for long distance routing). Level L-1 is the detailed level.

Rather than setting an absolute number of nodes to be contained within any one region it is convenient to set a cap on the maximum number of nodes and allow some flexibility below this. For example, the method may specify a maximum number of 100 nodes per region which could result in a spread of nodes per region of typically 60 to 100 nodes. A cap is felt advantageous over a set number of nodes since a set number can result in regions of forced shapes which in turn lead to sub-optimal routing when using the regions.

Multiple Levels

Figure 9:
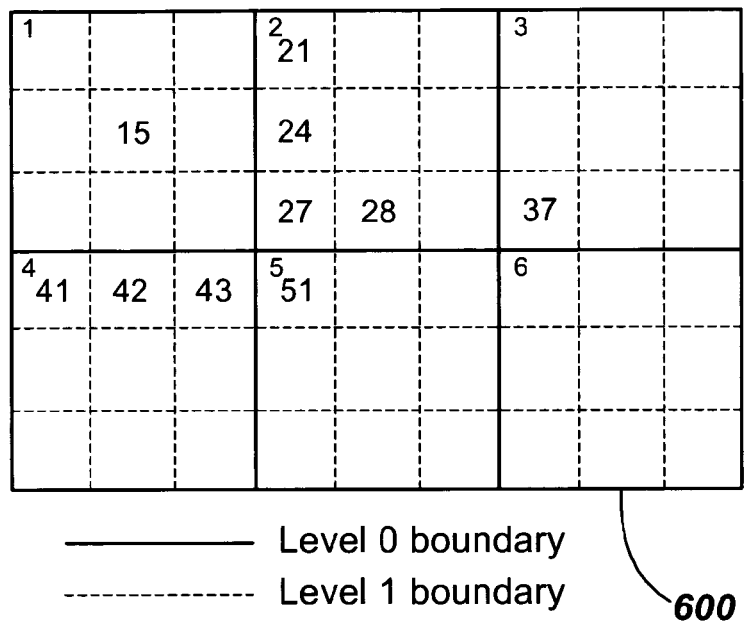
FIG. 9 illustrates an example of how a map may be partitioned into a plurality of nested regions.

In the embodiment being described, the partitioning is performed to provide a plurality of levels of nested regions which is conceptually exemplified in FIG. 9. It will be clear from FIG. 9 that a hierarchical nature exists with the lowest level (0) being subdivided to provide level 1, which is in turn subdivided to provide level 2.

The number of nodes in each region varies between levels and the coarser levels (which tend to cover a larger geographical area) have more nodes therein than lower levels. As such, the coarser level in the embodiment being described (eg level 0) is typically used for long range routing purposes whereas the finer levels (eg level 2) are used for routing at short range.

A portion of the bit vector for each road segments comprises bits for each of the levels. The number of bits is the number of regions in each level.

To give an idea of the amount of data to encode (in a typical embodiment the number of levels would typically be L=3):

global level=0 would typically have 100 regions.

intermediate level=1 would typically have 10 regions for each region of level 0 (ie 100×10).

most detailed level=2 would typically have 5 regions for each region of level 1 (ie 100×10×5).

Use of hierarchical levels is advantageous since it reduces, perhaps significantly, the amount of processing that is required. In the current embodiment being described 100× 10×5 regions (ie 5000 regions). Thus, in a flat structure, having the same number of regions would require methods outlined herein to refer to 5000 regions. However, embodiments described herein this can be reduced by referring to nodes in the appropriate level.

The number of levels and number of regions per level will typically be tuned once various factors are known for a map. For example, how much storage can be allocated to the map and speed at which routing should be performed. The skilled person will appreciate that there is a compromise in that as the amount of pre-processing is increased then the larger the map size becomes to hold the data, but the faster routes can be calculated using that map.

In one embodiment, there are 3 levels of regions. However, in other embodiments there may be any number of levels. For example, there may be roughly any of the following number of levels: 1, 2, 4, 5, 6, 7, 8, 9 or 10.

Thus, using the example above, a map of Western_and_Central_Europe which typically has 40,000,000 nodes and 100,000,000 road segments, using the most naive encoding would use fixed size encoding for region ID for every node at each level, and fixed size bit vector (arp-flags) for each road segment at each levels. Thus, the size of such a basic encoding can easily be calculated as follows:

each node region ID at level 0 would use log_2(100) bits=7 bits each node region ID at level 1 would use log_2(10) bits=4 bits each node region ID at level 2 would use log_2(5) bits=3 bits each bit vector (arp-flags) at level 0 would use 100 bits (100 region minus 1 for the current region)

each bit vector (arp-flags) at level 1 would use 10 bits (10 region minus 1 for the current region)

each bit vector (arp-flags) at level 2 would use 5 bits (5 region minus 1 for the current region)

FIG. 9 shows a coarsest level of region 600, which in the Figure provides 6 regions 1-6. Each of these regions is sub-divided into further regions, in this embodiment nine sub-regions, as represented by the dashed road segment within the coarse level of region 600. In the embodiment being described a further level of subdivision is used in which each of the regions provided by the dashed road segments are also sub-divided, thus providing three levels of partitioning but these are not shown in FIG. 9 for ease of reference. Other embodiments may of course use more levels (eg 4, 5, 6, 7, or more levels) or fewer levels (eg 1 or 2 levels).

Thus, embodiments of the invention introduce so-called visibility areas for finer-level regions step 1908. A visibility area of a k-region is a set of (k−1) regions, where the region is distinguishable on its own bit in the flag sets. Naturally, the visibility area always includes the (k−1) region to which the given k region belongs. Additionally, it may contain some neighboured (k−1) regions. The visibility areas are to be computed during the pre-processing and stored in association with the bit vector.

The relation between k regions and their (k−1) level visibility areas can be also seen from the opposite side: each (k−1) region knows its outskirts consisting of k level regions lying in the neighbourhood. Seen this way, it can be seen that the flag sets of the road segments are no more of fixed length throughout the whole map; instead, the bit vectors in each 1-region have their specific length A+B+C+Noutskirts 0+Noutskirts 1. Where A refers to the coarsest level of regions, B refers to the middle granularity regions and C refers to the finest granularity of regions (in an embodiment in which there are three levels).

Sub-sequent pre-processing computes the visibility areas prior to the shortest path calculations to generate the bit vectors. The method of finding the visibility area can be described as follows:

For each k-region, start a breadth-first search in the region adjacency graph; then for each visited k-region, which lies close enough to the start region, add its containing (k−1)-region to the visibility area.

The "closeness" relation should take both the geographical metric (e.g. distance between the region median points) and graph-theoretical distance into account (Thus, a region may be "close" if it geographically far but linked to the current region by fast connections. Likewise a region may be thought of as "distant" even if it is geographically close if it is difficult to travel between regions).

The exact threshold values may be subject to experimental tuning, as they depend on the map specific characteristics like the average diameter of metropolitan areas, which are most susceptible for negative effects described above such as increased preprocessing, etc.

Navigable segments with extraordinarily long traveling time (like ferries or NoDriving road segments) are hidden during the adjacency graph traversal, this way visibility areas are always confined to single islands or small archipelagos belonging to the same region.

Thus, the regions visited during the breadth first search constitute the neighborhood of R. The inclusion-minimal set of the regions of the next coarser level completely covering the neighborhood is called visibility area of R. The reverse relation is called vicinity: the vicinity list of a region Q (at level L) consists of all regions at level L+1 having Q in their visibility areas.

To give a specific example and referring to FIG. 9, examples of the visibility areas are as follows:

If we decide that the minimal distance between each 1-region and the border of its visibility area should be at least 1, then the visibility areas for some selected 1-regions will consist of the following 0-regions (the own 0-region can be omitted, as it is always there):

15:

(ie level 1 region no. 15 has no visibility areas since it is at a centre of its level 0 region).

28: 5

(ie level 1 region no. 28 has a single visibility region which is region (level 0) no. 5)

37: 2, 5, 6

(ie level 1 region no. 37 has three visibility regions which are level 0 regions 2, 5 and 6)

In addition to considering the level 0 neighbours of a level 1 region, the level 1 neighbours are also determined for each level 0 region. Thus as an example,

1: 21, 24, 27, 28, 41, 42, 43, 51

(ie for the level 0 region no. 1 the level 1 regions are: 21, 24,27,41,42,43, 51).

Thus, in this example, it can be seen that region 28 is listed despite it not being in the leftmost column of region 2. This for example might be because region 28 has fast links to region 1 and as such is close when considered in terms of time rather than distance. The skilled person will appreciate that closeness may be judged against other metrics such as greenness (least $CO_2$ or the like), etc.

Encoding of Neighbour Lists

Figure 9A:
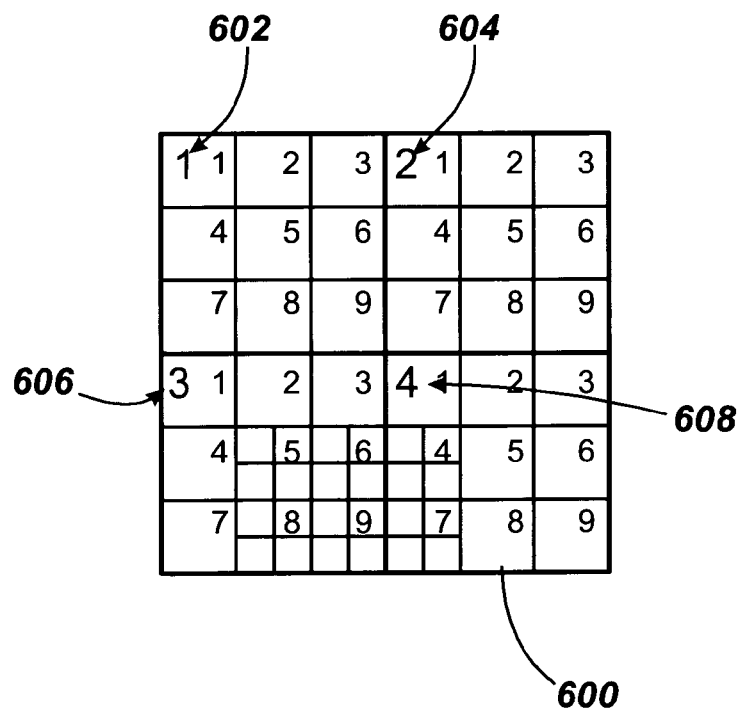
FIG. 9a illustrates an enhancement of the partitioning of FIG. 9.

FIG. 9a shows more detail of the levels that may be employed when compared to FIG. 9. Level 0 is the coarsest level and may be thought of as level k−1. For ease, in FIG. 9a only regions 1 to 4 are shown (ie 602; 604; 606; 608). Each of these k−1 regions is further divided into 9 regions (1-9) which may be referred to a k level regions or level 1 regions. Further, each of these level 1 regions is divided into 4 k+1 level regions (ie level 2 regions).

Generation of Bit Vector

Once the network has been partitioned into the three levels of regions it is processed to determine the minimum cost path to each of the regions and a bit vector is created for each road segment within a region step 1910. Thus, as discussed above each road segment within any one region is analysed with respect to a cost formula to determine whether it is part of a minimum cost path to every other region. A bit vector is generated for every road segment in a region as is shown in FIG. 7 which, for ease of comprehension, shows a simplified bit vector.

It should also be appreciated that the minimum cost path is determined, not just a single time period, but is calculated for a plurality of time periods as described hereinafter.

This calculation is performed for the network shown in FIG. 7 (ie the reduced network). Portions of the network which have been removed are effectively collapsed onto the node from which they originated. For example, the region 250 shown on FIG. 5 is collapsed onto the node 400 in FIG. 7.

It will be seen that each bit vector comprises three columns: a leftmost column 700 containing an identity number for the node at the start of the road-segment under consideration; a second column 702 containing the identity number for the node at the end of the road-segment under consideration and a third column 704 containing the bit vector for that road segment. Thus, it will be seen that each road segment is identified by two nodes, one at each end thereof.

Any suitable routing method may be used to determine whether a road segment is part of the lowest cost route. In this particular embodiment the well known Dijkstra method is used to explore the whole network.

However, the amount of processing time may be reduced by employing various strategies. The skilled person that the techniques for reducing the network described above will also reduce the amount of processing time. Embodiments of the invention may employ any one or more of the following:
- calculate all bit vector entries corresponding to a region at once. The shortest path tree in reverse graph for each boundary node. Such an approach is advantageous as each region may be processed in parallel thereby decreasing the processing time.
- reduce recalculations of similar shortest path subtrees.
- do not recalculate bit vectors which have already been generated.

Thus, in summary one embodiment may perform the following in order to generate the bit vectors:

Preparation Steps:
1. As the skilled person will appreciate the search through the electronic map can be represented by a directed acyclic graph (DAG). This graph and the adjoined data structures (turn costs and long extension tables) are reversed.
2. The simple road segments with respect to the finest level are contracted (ie the end nodes are collapsed onto one another as discussed elsewhere). A road segment is called simple if it consists of one or more nodes of degree=2, all lying in the same region of the given level, and the navigable segments have identical attributes: for example "is a ferry", "is NoThrough", and "IsNoDriving".
3. For each region, the road segments of the road network are sorted into three groups: outbound, inbound, and inner road segments, depending on whether the head (ie from_node) and/or tail (ie to_node) node belongs to the region. That is, if both the head and tail are within the same region the road segment is termed an inner road segment; if the head is within the region but the tail is not then the road segment is termed an outbound road segment; and if the tail is in the region but the head is not then the road segment is termed an inbound road segment.
4. Special turn restrictions are put on all road segments leaving the NoThrough and NoDriving areas.

The pre-processing routine proceeds in bottom-up manner, starting with the finest partitioning level—ie level 2 in the embodiment being described. At each level of regions, the following steps are repeated for each region R:
1. Determine the exploration area of R. At the topmost level (eg region 0 in the embodiment being described) it is the entire graph, on finer levels it is the subgraph confined by the visibility area of R (as described above).
   Thus, at the intermediate level (ie level 1) the following steps are only performed for the visibility area of the level 0 region in which those level 1 regions are contained. At level 0, which should be remembered is used for long range routing, the road segments of the entire graph are considered.
   Collect the inbound road segments of the visibility area, that is, road segments leading from nodes outside the area into the area. Then collect the frontier road segments, that is, road segments following the inbound road segments. The road segment L 2 is called following L 1 (and L 1 preceding L 2) if head(L 1)=tail(L 2) and the turn from L 1 into L 2 is not forbidden. The complex crossings are contracted to single nodes for the purpose of finding the frontier road segments. Ferry road segments and road segments with "NoDriving" attribute are not considered as frontier road segments.
   Collecting the inbound road segments in this manner can reduce, perhaps significantly, the amount of processing required in the exploration steps described hereinafter. The exploration step(s) can reduce exploration of the graph to consider those routes to a given region which include an inbound route.
2. For each outbound road segment of R, find the root road segments and the number of exploration steps. If the outbound road segment is a sole successor of at least one of its predecessors lying within R, this outbound road segment is the only root road segment, and a single exploration step is performed. Otherwise, if the outbound road segment is bidirectional (that is, drivable in both directions), then the road segment itself and its opposite (inbound) road segment are taken as root road segments of a single exploration step. Otherwise, if the outbound road segment is unidirectional, then each preceding inner road segment (and, if present, its opposite road segment) is taken as a root road segment for a separate exploration step. Finally, regardless of the kind of the outbound road segment, for each traffic extension path running through the outbound road segment, the starting road segment of the extension (if it lies within R) is taken as a root road segment for a separate exploration step.
   On finer levels (ie all levels except level 0), the outbound ferry road segments are treated specially. As noted above, ferry road segments are ignored when determining the region's neighbourhood. If the head region of a ferry road segment does not belong to the visibility area of R, then a single exploration step will be performed with the ferry road segment being the sole root road segment and the exploration area being constrained to the head region itself.
3. Perform the scheduled exploration steps (described below).
4. Trace back the shortest paths from the road segments within the exploration area to the root road segments. At all levels except the topmost (ie Level 0), the ordering of the road segments at which the respective trace starts is affects the results. Suppose R is a level-L region (where L>0), then the outbound road segments of level-(L−1) regions are processed first, then the remaining outbound road segments at level L, and so on towards the finest level; road segments which are inner with respect to the finest level (and have not yet been removed) are processed last. Whenever a road segment is encountered that has already been visited in an earlier trace, there is no need to follow that path a second time. While tracing, the appropriate target bit vectors are set for each visited road segment. At all but the topmost level (ie level 0), additional actions take place:

- after the path has first crossed some level-L region boundary, that boundary road segment and all further road segments on the way to the root road segment are marked with a transit road segment flag;
- the nodes where the shortest path makes a U-turn are marked with a U-turn flag.

Finally, at all but the finest level, the correlation matrix entries are filled.

After all regions of the level are processed, the graph is simplified for the next level. First, all road segments not marked as transit road segments are removed. Then the accruing new simple paths are contracted; nodes marked as U-turn nodes are preserved.

Finally, the bit vectors are propagated to the road segments removed before processing this level, according to the correlation matrix.

Correlation Matrix

Some embodiments of the invention use a correlation matrix which stores relationships between target regions needed to set the bit vectors on the road segments. At each level L except the finest level, a new correlation matrix is created and used. At level L, the rows of the matrix are indexed by level-(L+1) regions, the columns are indexed by level-L regions, and each matrix entry is a set of zero or more level-(L+1) regions. At the lower levels, most matrix entries are equal to the empty set, i.e. the matrices are sparse.

The purpose of a correlation matrix is to help setting bit vectors on road segments which have been deleted at earlier stages. These road segments are not contained in the directed acyclic graphs resulting from the level-L exploration steps, but they would be if they had not been deleted. More precisely, the correlation matrix is used to set bit vectors to some level-L region S (where L is not the finest level) on road segments in the exploration area of S which have been deleted during the computations at some level>L. For a level-(L+1) region R contained in the exploration area of S, the matrix element M[R, S] will finally be a set of level-(L+1) regions at the boundary of the visibility area of R, such that all shortest paths (in the reversed graph) from S to R pass through one of those regions.

When the matrix is created, all entries are initialized to the empty set. Then, for all level-L regions S, the following two actions are performed.

1. Matrix build-up: For each exploration step with a root road segment l in or on S and the resulting directed acyclic graph D, for each level-(L+1) region R contained in the exploration area of S, and for each inbound road segment l' of R, the matrix element M[R, S] is updated as follows:

Denote by A the exploration area of R (as computed earlier for level L+1). Trace the path in D from l' back to l and check whether it leaves A: if a road segment on this path goes from a level-(L+1) region T to a level-(L+1) region T', where T is still contained in A, but T' is not, then T is added to the set M[R, S], and the next l' is processed.

2. Reading the matrix: for each road segment in the exploration area of S which had been deleted before the level-L computations started, let R be the level-(L+1) region where that road segment ends (again, with respect to the reversed graph). Now the bit vector bit for region S on that road segment is set to the logical OR of the bit vector bits for region T, where T ranges over all elements of M[R, S].

Note that the bit vector bit for each T will have been set at an earlier level either directly from some directed acyclic graph or in the analogous procedure involving a correlation matrix at some lower level.

Exploration

The exploration step consists of building a directed acyclic graph of minimum cost paths rooted at the given road segment (pair). This is accomplished by using a variation of the well-known Dijkstra method for minimum cost computation. The objective function to be minimized can be freely chosen, for example, as the travel time or estimated fuel consumption, or any of the other factors discussed elsewhere.

One embodiment uses a weighted sum of travel time, path length, and other penalty terms suppressing undesired turns and manoeuvres.

The following modifications are made to the classical (Dijkstra) method:

1. It works on the road segment graph, i.e. the items being visited, relaxed, etc. are road segments, not nodes. This is useful to allow the method to account for turn restrictions and/or traffic extensions.
2. The objective function in the label is a vector of pairs (travelling time, cost) for a fixed set of arrival time slots at the root road segment. The time slots are chosen such that all relevant traffic modes are covered (free flow, weekday morning rush hour, evening rush hour, etc.). This is expanded on further below in the discussion about assessing the cost at a plurality of time periods.
3. More than one label can be stored for a given road segment. If the sets of pending (unfinished) traffic extensions on two labels are not equal, then the labels itself are called independent and both keep propagating over succeeding road segments. Otherwise, if the relation between cost function values for different arrival time slots is not alternating, i.e. one label is unambiguously better than another, the worse label is discarded. Otherwise, a new label is created by merging the better values for each time slot, which is propagated in lieu of the original one. The predecessor set of the merged label is then the union of the predecessor sets of original labels.
4. Special U-turn labels are created on each bidirectional road segment. They encode the possibility of starting the real (non-reversed) route in both directions. U-turn labels are not propagated and may not be merged with normal labels. However, they influence the backtracking phase when the bit vectors are set: a shortest path is flagged only if the starting label is not worse than the U-turn label on the same road segment.

At the finer levels, where the exploration area is restricted to a set of regions, the frontier road segments, as defined above, are permanently watched. As soon as all frontier road segments are reached by the search front, the watch comb is built up from the largest (=worst) cost function values per time slot. Then a label on a road segment outside the exploration area, when popped off the heap, is propagated only if its cost function value lies below the current watch comb in at least one time slot. If an exploration area stretches over several islands, a separate watch comb is maintained for each island.

Time Varying Functions

Some embodiments of the current invention may calculate the bit vector showing the minimum cost paths across the network at a plurality of time periods rather than at a single time. The skilled person will appreciate that the lowest cost route through a road network may vary with time due to the influence of traffic density, etc. Therefore, for any one node there may be two or more minimum cost paths, each one for a different time. In this embodiment, the bit vector is not coded with a time reference for when the minimum cost paths are applicable. The bit vector is simply set to identify a navigable segment as either being part of a minimum cost path or not. Therefore, when routing using the minimum cost data, the routing algorithm will have to consider all possible minimum cost paths from a node. This process is now briefly described with the aid of FIG. 10*a*.

In a standard Dijkstra exploration of a network, as the network is explored, the method uses the total cost incurred to date to get to that point in the network plus the expected cost yet to be incurred.

Thus, some embodiments utilise a function as opposed to a discrete value to make the cost evaluation at each node. Thus, in FIG. 10*a* each node (eg 750) of the graph 751 that is being explored has a cost function associated therewith which identifies how the parameter being explored (eg time, fuel expended or the like) varies with time.

The cost function may be associated with a road segment as opposed to node.

The method then processes the expended cost to add the estimated costs by summing the function at the current node with the cost that has been accumulated to date to generate new function. The example shown in FIG. 10*a* at 752 shows a cost function that has been generated at node 750 by the search method and shows how the travel time (y axis) varies with the departure time (x axis). It will be seen that the cost function increases at points 754 and 756 due to the morning and evening rush hours.

In one particular embodiment, the cost function (for example the average speed on a road segment) is stored at 5 min. intervals; ie it is a quantised rather than continuously varying function with a time period of 5 min.

The bit vector for a road segment is set if that road segment is part of the lowest cost route at any time period.

Projecting Core Data to Full Network

Above it was described how the network contained in the map was reduced in order to reduce the number of road segments and nodes that must be considered by the partitioning method. However, the nodes that were deleted in the reduction step should also be considered further in order that routing methods can still generate routes to or from the deleted road segments and nodes.

As such, the deleted nodes and road segments are assigned to the same regions as the node to which they are connected in the core network.

Compression

As discussed, the generated bit vectors are significant in size and therefore it is desirable to compress the information. Embodiments of the invention may perform this in different manners.

However, one embodiment utilises various techniques to compress, coalesce and/or correlation of the bit vectors followed by a subsequent Huffman encoding of the bit vectors.

Thus, some embodiments may try and ensure that there is an uneven distribution of bit vectors since this can help to ensure that the Huffman encoding is more efficient than would otherwise by the case.

For example if the bit vectors are distributed as follows:
00000 . . . (49% of the time)
11111 . . . (49% of the time)
????? . . . (2% of the time)
then it may be desirable to manipulate the bit vectors prior to Huffman encoding to having a more uneven distribution such as:

00000 . . . (79% of the time)
11111 . . . (19% of the time)
????? . . . (2% of the time)

Reduction in Generated Bit Vectors

In order to reduce the amount of Bit Vectors that need to be generated embodiments of the invention may use any one or more of the following strategies:

region IDs are not used for all nodes and are only generated for navigable nodes (eg nodes corresponding to railways are ignored).

bit vectors are not needed for all road segments and may be used for decision road segments around decision nodes. Decision nodes & decision road segments can be determined by looking at road segment data (as described in this document).

even though there are many possible bit vectors, some are far more frequent than others, so special encoding can be used for the most frequent ones (eg 000 . . . 000 and 111 . . . 111).

bit vectors that are not 000 . . . 000 or 111 . . . 111 still often have either most of their bit set to 1, or most of their bit set to 0. So Huffman code of partial blocks should encode them fairly efficiently.

bit vectors are often identical in nodes close to each other, so delta encoding can encode them efficiently.

different regions can be made to have more similar bit vector patterns by reordering destination region IDs per source region (idea is described in this document)

Or of all bit vectors around road segments of a node should always give 111 . . . 111. That properly can be used to encode bit vectors more efficiently.

Some of these are discussed in further detail below.

It is worth noting at this point that techniques described here aim to reduce the size of the bit vectors. However, it is noted that random access to the data is required by devices which use the map data for routing purposes. Generally, efficient encoding of data requires a variable size which would however prevent random access to the data.

As such, embodiments of the invention may use a trade-off in which data is encoded as a series of pages, which are indexed, and then utilises variable encoding within those pages. In such embodiments, random access is achievable to each page (through the indexing). Once a page has been accessed embodiments, may subsequently decode the entire page. This provides a trade-off between efficiency and map size—increasing the number of nodes per page reduces the map size but slows data access. One particular embodiment of the invention uses 16 nodes per page. It will be appreciated that any one node may well have a different number or road-segments leaving that node. As such, even though there may be the same number of nodes there may be a variable amount of road segments per page. Further, different compression may well occur for each of the bit vectors stored on each page.

Figure 11:
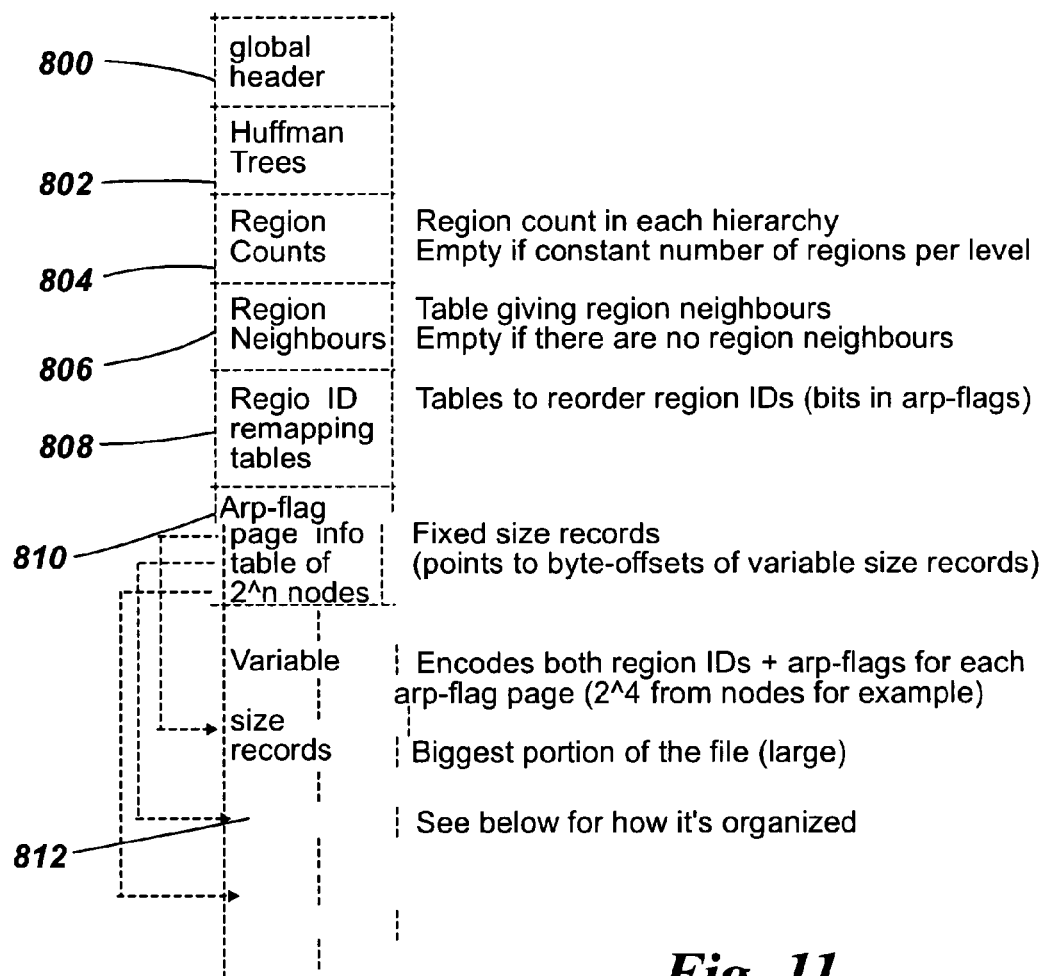
FIG. 11 shows an example file format for a file of an embodiment of the invention.

Such a structure may lead to a map format as shown in FIG. 11. In this Figure, reference to Arp Flag is synonymous with bit vector. The number 'n' is stored within the header and may be altered for different maps in order to optimise the performance for that map.

Tuning 'n' is a trade-off between map size and access speed when decoding map data:

a large value of n will group many nodes together which is good for map compression, but bad for speed of random access to the data.

a small value of n will group few nodes together which is good for speed of random access of the data but bad for map compression.

Figure 10:
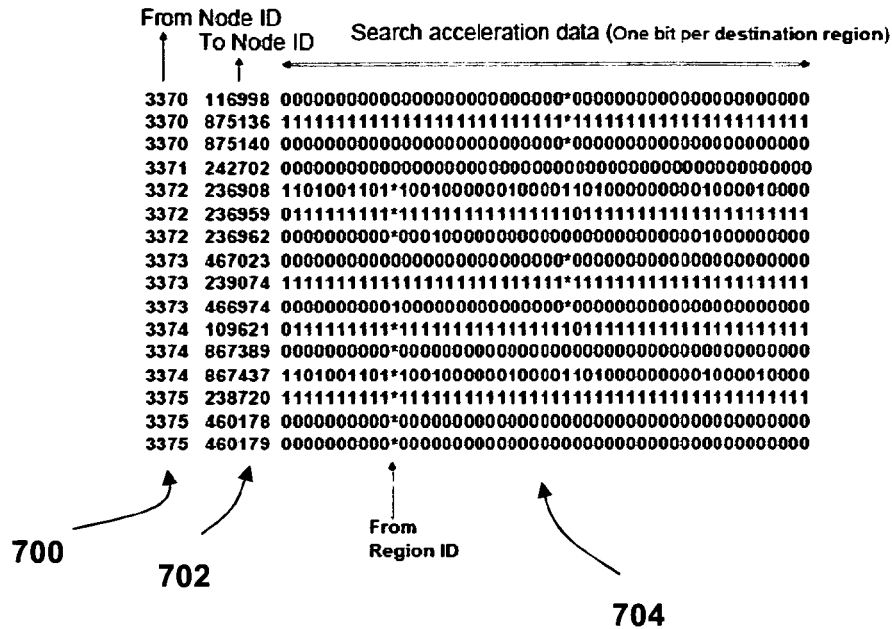
FIG. 10 shows an example set of bit vectors utilised by embodiments of the invention.

'n' may be set to 4 for example i.e. pages of 16 from-nodes (a from node being at start end of a road segment—ie column 700 of FIG. 10) but keep in mind that each from-node has several to-road segments so assuming 3 to-road segments on average, each means that each page store the equivalent of ~48 road segments.

Figure 12:
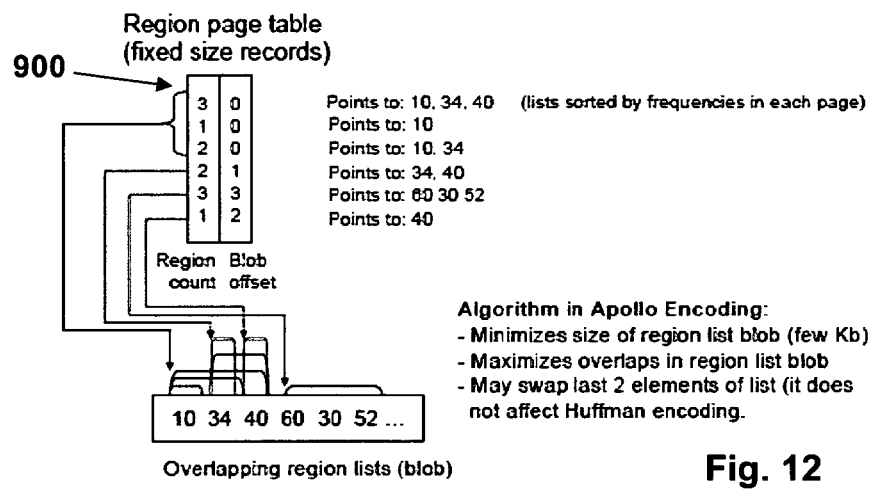
FIG. 12 shows an embodiment of how the region remap table and region ID lists of FIG. 11 may be encoded.

In this format, there is a different format for data depending upon the level of region that is encoded. FIG. 12 shows an example of a format for level 0 (ie the coarsest regions) and FIG. 12 shows an example format for other levels of region.

The bit vectors and related information are stored in a data structure, the format of which is shown in FIG. 11 which comprises the following: a header 800; Huffman trees 802 used in Huffman encoding described later; region count in each hierarchy 804 (empty if constant number of regions per level); Region neighbours 806 (empty if no region neighbours); region ID remapping tables 808; bit vector page index ($2^n$ nodes) 810; and the region ID and bit vectors 812. The data structure holding the bit vectors may be held within a single file or may be held within a plurality of files.

In some embodiments the map header 800 is arranged to contain further information indicating the following:
   maximum number of levels
   length of the shortest neighbour list.
   length of the longest neighbour list.
   byte offset of the section which contains all the neighbour lists.

The or each file holding the information may have a section to encode the neighbour lists. The size of all lists is encoded first. Each length of list is encoded relatively to the shortest list length, on a fixed number of bits determined by BitsRequired(longestListLength−shortestListLength). Notice that if all list have the same length, then no bit is needed to encode the lengths.

Then follow the content of all lists. Each list is made of several tuples of neighbour region IDs: pairs at level 0, 3-element tuples at level 2, etc.

Notice that the from-region tuples (portion before ':' in ASCII file) are not encoded. They are implicit since lists are stored for all regions in ascending order. For example, if a map has 3 levels with 100×10×5 (100 regions at level 0, 10 regions at level 1, 5 regions at level 2), then:
   at level0, the lists are stored for from-regions 1, 2, 3, ... 100 (100 lists in that order). Each of these lists contains pairs.
   at level 1, the lists are stored for from-regions 1.1, 1.2, 1.3, ... 1.10 ,2.1 ,2.2 , ... 2.10, 3.1, ... 100.9, 100.10 (1000 lists in this order). Each of these lists contains 3-element tuples.
   at level2: nothing is stored since it's the last level so there are no neighbours.

Each component in a tuple is stored as n bit. The number of bits for each level is determined from the number of regions at the corresponding level. So it is possible to access a list at random. In the case of 3 levels 100×10×5, encoding a tuple a.b.c would use 7 bits for a (because there are 100 regions at level 0), 4 bits for b (because there are 10 regions at level 1), and 3 bits for c (because there are 5 region at level 2).

EXAMPLE let's assume a partitioning of 100×10×5 regions: 100 regions at coarse level 0, 10 at intermediate level 1 and 5 at detailed level 2.

In file at level 0, the section containing the neighbour lists will contain:
   100 numbers indicating the length of the lists for the 100 regions at level 0. Number of bits is computed from BitsRequired(longestListLength−shortestListLength).
   Each number is relative to the shortest list at the level (shortest list being stored in header).

Then follow the content of the 100 lists (100 pairs). The first element of each pair is encoded on 7 bits (because there are 100 regions at level 0) and the second element of each pair is encoded on 4 bits (because they are 10 regions at level 1).

In file at level 1, the section containing the neighbour lists will contain:
   100*10=1000 numbers indicating the length of the lists for the 1000 regions at level1.
   the follow the content of the 1000 lists (10003-element tuples). The first element of each tuple is encoded on 7 bits (because they are 100 regions at level 0), the second element of each tuple is encoded on 4 bits (because they are 10 regions at level 1 in each level-0 region) and the third element of each tuple is encoded on 3 bits (because there are 5 regions at level 2 in each level-1 region).

In file at level 2, nothing needs to be stored since it is the last level.

For the encoder input file, either form of lists may be adopted.

Thus, once the partitioning into the three levels has been performed, each node is assigned to one region per level; ie three regions.

Header 800

Typically, the header used in embodiments of the invention is small, and as such the size does not need to be optimized in order to reduce its size. Typically everything is byte or word aligned for convenience:
   (4 bytes) encoding version (increased every time map format changes)
   (4 bytes) map flags (to turn on or off features, 0 initially but can be used later if we need to add optional features)
   (4 bytes) total number of nodes in map
   (4 bytes) total number of road segments in map
   (4 bytes) byte offset of section Huffman trees
   (4 bytes) byte offset of section region blob
   (4 bytes) byte offset of section region page infos
   (4 bytes) byte offset of section bit-vector page infos
   (4 bytes) byte offset of section variable size records
   (4 bytes) maximum bit vector (arp-flag) page in bits (can be used by route planning methods to pre-allocate worse case for bitstream decoder at startup)
   (4 bytes) average bit vector (arp-flag) page size in bits (used to interpolate bit-vector page position)
   (4 bytes) minimum bit vector (arp-flag) page delta (used to make all deltas>=0, avoiding to store bit sign)
   (2 bytes) maximum size of bit vector (arp-flag) history (can be used by route planning methods to pre-allocate history buffer at startup)
   (2 bytes) maximum number of road segments per page (currently not used)
   (1 byte) Apollo level of this file.
   (1 byte) bits per bits vector (arp-flag)
   (1 byte) bits per bit vector (arp-flag) page delta (field in fixed size record of bit vector (arp-flag) pages)
   (1 byte) bits per blob index (field in fixed size record of region page info)
   (1 byte) bits per region count (field in fixed size record of region page info)
   (1 byte) bits per non trivial bit vector (arp-flag) block
   (1 byte) log_2( )of region node page size
   (1 byte) log_2( ) of bit vector (arp-flag) page size (1 byte) number of Huffman trees to encode local region IDs (1 byte) number of Huffman trees to encode bit vector (arp-flag) history codes Huffman Trees 802

Huffman tree to encode number of road segments around each node: tiny, only 10 codes or so, only present in file at level 0)

Huffman tree to store a block of non trivial bit vector (arp-flag): largest Huffman tree, the larger the better for compression but the more memory is required in route planning methods (trade-off between map compression and memory usage in route planning methods).

Huffman tree of bit vector (arp-flag) delta codes when history size is 0: tiny, only 3 codes Huffman tree of bit vector (arp-flag) delta codes when history size is 1: tiny, only 4 codes Huffman tree of bit vector (arp-flag) delta codes when history size is >=n: tiny (number of Huffman trees stored in header)

Huffman tree for region ID when there are 3 regions in a region page: tiny, only 3 codes Huffman tree for region ID when there are 4 regions in a region page: tiny, only 4 codes Huffman tree for region ID where there are >=n regions in a region page: tiny (number of Huffman trees stored in header).

Region Remap Table 804 and Region ID Lists 806

Figure 14:
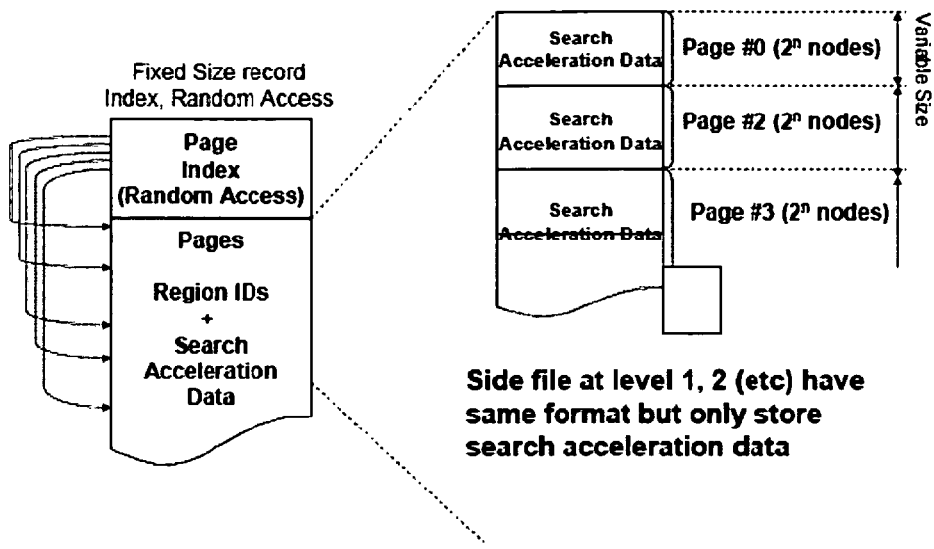
FIG. 14 shows an example file format for nested regions other than the coarsest.

Although smaller than other parts of the file format of FIG. 11, the region ID's 806 may also be compresses as is exemplified in FIG. 14. In this, geographical correlation may be used in order to reduce the amount of data used.

Each region page stores a list of the distinct regions in that region page. This list is expected to be small in most cases (in fact many pages are likely to contain only 1 region at least at level 0). Lists of region have variable size. The data within the pages should be accessible on a random basis (ie Random Access) and as such a fixed table size is used to allow this.

Each list of distinct regions is ordered by frequency of nodes in each region: the first element of the lists corresponds to the region with the largest number of node in the page, the last element of the list is the region with the least number of nodes in the page.

Each nodes in region pages, we can encode its region ID using a local region ID (local to the page). This local ID is the index of the region in the page (which is a small integer, often 0 since 0 corresponds to the most popular region in the region page.

Region IDs of nodes are stored as follow:

A Region Array, containing region ID', stores all possible overlapping lists of regions in pages. Lists of region are consecutive region IDs in that array. Lists can (and do) overlap. The array does not store the start and end of each list (this is done by the region page info table).

The region page info table is a fixed size record table (hence accessible at random) and each record contains the index in array of beginning of a list+number of items in the list.

Each node contains a local node ID (local to its page).

Each of these concepts is further defined hereafter.

Region Array

The region array encodes all possible region lists of pages. It is a simple array of region IDs where list of region IDs can overlap. Its size should be small since lists overlap. The region array is further described in the section Region page infos.

Region Pages Infos

Specifying a list of region IDs in region page table uses 2 fields in the fixed size record of region page info table:

a region count (number of regions in this page, expected to be small).

an offset into an array of region lists (where list of region begins).

In one embodiment, this is described in FIG. 12.

The offset field points into the region array: fixed size records with 1 byte per region ID are enough, for example, assuming that there are always less than 256 regions in each level, which is a fair assumption (but making it larger than 8 bits is easily possible if 256 bits per level is deemed too restrictive). The region count in the region page table record indicates how many regions are to be considered in the array at the specified offset.

If several regions have the same list, they can point to the same location, which should be compact since we can expect many pages to either share to same lists, or to share portions of the same lists.

This is explained in more detail with reference to FIG. 12 which shows an embodiment having pages of 2^nr nodes (nr=9 for example to group 512 nodes).

Notice how compact the array 900 of region IDs can be because several pages can point to the same location or overlapping locations in the array (labelled region blob in the figure). In fact, increasing the number of pages may not increase the size of the array because each page then overlaps fewer regions so the possibility of combinations is reduced. So this array should allow the creation of many pages without requiring too much map space or too much memory on the device in which the generated map data is loaded.

The method aims to keep the array 900 containing list of region ID as small as possible. The method aims to reuse the same list of region ID as often as possible in the array. The method is free to reorder the last 2 elements of the list since they would not influence the size of Huffman codes.

For example, when a list contains 2 regions 10 and 34, it is equivalent to store the list 10, 34 or 34, 10 (regardless of the frequencies) since the Huffman tree uses only 1 bit in all cases when there are 2 nodes only. In other words, the ordering by frequency is relaxed for the last 2 regions. Similarly, a list of 3 elements 10, 34, 40 can also be stored as 10, 40, 34, since only the first code 10 (most frequent) will use 1 bit and the other codes 40 and 34 and both use 2 bits (regardless or the order).

Thus, looking at FIG. 12, it can be seen that the array 900 stores two values: a length and an offset from the beginning of the region data. Thus, taking the first row (3:0), this refers to three pieces of data offset by 0 from the start of the file (ie 10, 34, 40). Taking as a further example, the array entry (1:2) refers to a single region (ie a length of 1) with an offset of two from the beginning of the file; (ie region 40).

In an alternative embodiment, the region page information is encoded according to the following method:

This section encodes the number of sub-regions in each region. The number of sub-regions may be variable per level. However, often the number or sub-regions is constant for each level. The number of sub-regions is encoded relatively the min number of regions at each level and using log_2(max_number_of_regions−min_number_of_region) bits. So if the number of regions is constant, then 0 bits are used to encode the region count and this section is empty. The min and max number of regions are stored in the header of the side-file.

Encoding of region neighbours section (neighbourhoods being discussed in relation to FIGS. 6 and 6*a*)

This section encodes for each region hierarchy at given level L a list of region neighbours at the more detailed level L+1. For example, a region 3.9 at level L=1 may have the following list of neighbours at level L=2: 3.5.4 3.6.3 3.6.4 4.7.1 4.7.3. As discussed elsewhere the list of neighbours may be used to increase the speed of the pre-processing used to generate the or each side-file.

This section is split into 2 sub-sections:
- a subsection to encode length of all neighbour lists (as many as there are regions at the given level). The length is encoded relatively to the shortest list and then umber of bits is computed as log_2 (length_longest_list-length_shortest_list). If all lists have same length, then 0 bits is used to encode lengths (and thus section is then empty).
- a subsection to encode all the neighbour lists (as many as there are regions at the given level).

Encoding of Region ID Remapping Tables

This section is encoded in the side-file of level 0 only. It encodes a bi-dimensional table which is used to reorder and coalesce bits in each region at level 0 (in order to encode bit-vectors efficiently, coalescing and bit reordering are described further below in this document). Reordering and coalescing of bits in bit vectors is done to optimize Huffman encoding of bit vectors. This table is used by route planning methods to find the bit position in the bit vector to decode when knowing:
the from-region ID of the current node
the original to-bit index (i.e. bit index after decoalescing bit vector bits)

The 2 indices of the bi-dimensional table are:
from-region ID
destination-bit index (region of destination)

This section is made of 2 sub-sections:
- a section to encode the number of coalesced bits for each region at level 0. The number of bits used to encode each number is log_2(max_number_of_coalesed_bits)
- a section to encode the bit remapping table. Since when routing, the destination-bit does not change (destination remains the same while routing) but the from-region ID changes (depending on nodes explored while routing) the matrix stores by rows of destination-bit. In each row, the bit-reordering number is stored for each from-region. Route planning methods should typically load only 1 row in memory corresponding to a given routing destination while routing. The route planning method does not need to store the entire bidimensional matrix in memory. Route planning methods can access that row at random. The number of bits used to encode each remapping entries is computed as log_2(max number of coalesced bits).

Figure 13:
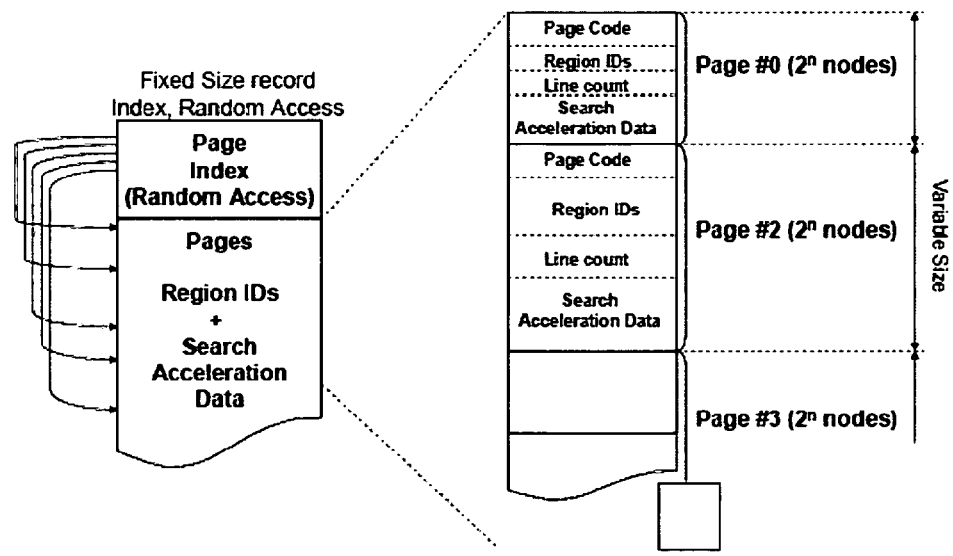
FIG. 13 shows an example file format for the coarsest nested region as illustrated in FIG. 3.

FIG. 13 expands the bit vector section 812 of the file shown in FIG. 11 for the level 0 region (see FIG. 9). It is seen that each page comprises a road segment count, regions ID's and the bit vectors.

FIG. 14 expands the bit vector section 812 for the file shown in FIG. 11 for levels other than level 0. It can be seen that for other regions on the bit vectors are stored and not the road segment count or regions ID's which are stored for level 0.

In view of the difference in area covered by the regions of each level, the number of nodes per page may be varied per level. For example, as a region within level 0 covers a large area there may be more nodes per page per region for level 0 . For example, some embodiments may store 512 nodes per page per region for level 0. As such, a more detailed level may have a smaller number of nodes—for example 256 node, 128 nodes, 64 nodes, 32 nodes, 16 nodes, or the like. Indeed, some embodiment may utilise 1024 nodes, 2048 nodes, or 4096 nodes per page.

Encoding of Bit Vectors 810, 812

The table 810 contains fixed size records. From-node IDs are grouped in pages of $2^n$ together.

It is convenient to group data in pages of multiple consecutive nodes because it is expected that bit vectors have similar patterns for several road segments in the same neighbourhood. By using pages, it is possible to encode several road segments in delta and achieve good compression. Similarly, it is possible to encode region IDs of nodes in delta in pages. On the other hand, it means that accessing data of one road segment requires to unpack data of several road segments (no direct random access).

Having to unpack several nodes or road segments to access the data of one road segments or node may be deemed acceptable since:
- data can be cached so extra data read when accessing one road segment is often not useless. It may be that that this extra data will be useful shortly afterwards (this is similar to read-ahead parameter of disk caching).
- Routing using the bit vectors reduces the size of the expansion search by an order of magnitude when compared to Dijkstra A* routing. By grouping data by pages, only a small portion of the map still needs to be decoded (pages along the actual path).
- it should significantly reduce the encoded data size thanks for delta compression of region ID & bit vectors.
- pages reduce the size of indexing since the data will be stored in a side-file as described.

Each record within the table 810 contains a 'delta' field which is used to find the position of the beginning of the variable size of each page (delta to an interpolated position). The number of bits for each delta is stored in the header.

In order to access the region ID and bit vectors 812 a decoder may compute the estimated offset of the beginning page by doing a linear interpolation:
interpolated_offset=from_node_id*avg_page_size Where avg_page_size is the average page size in bits stored in the header (possibly in fixed point to improve precision). The offset of the data can then be computed as follows:
offset=interpolated_offset+min_delta+delta Where min_delta is the minimum value of all delta fields for all pages (stored in header) and delta is the unsigned field stored in the page. The min_delta value ensures that all delta fields are positive value (no bit sign to store).

Variable size records are accessed through 'delta' field of the previously described bit vector page infos.

Each record contains the data of $2^n$ nodes (region IDs of from-nodes and bit vectors of their attached road segments at all levels). The same indexing scheme will thus be used for all levels.

Variable Size Records Store:
- page code—a code indicating for the entire page as to whether or not the nodes within that page are part of the same region;
- the number or road segments around each node in the bit vector page (only stored at level 0 since it would be the same for all levels).
- region IDs of the from-nodes in the page, one ID per level (information for all levels stored in file at level 0{{ap_o_*.dat)
- bit vectors of road segments around nodes in page (only around nodes which have >2 attached road segments) at level i only. This is the biggest portion of data.

Encoding of number of road segments around each node

For each of the $2^n$ nodes in a bit vector page, a Huffman code encodes the number of road segments around the node. This information is not specific to all levels and it is only stored in the file at level 0 (ap$_{-0}$_*.dat).

Knowing the number of road segments around node is used to decode the bit vectors (see 1000, FIG. 13). This information is redundant with information already present in the in other files but it makes it easier and faster to decode bit vectors in pages without having to look up that information elsewhere; thereby a small increase in size provides an increase in performance.

Encoding of Region IDs in Variable Size Records

Region ID of nodes 1002 are encoded in the variable size records right after encoding of number of road segments 1000 around each node (see encoding layout). In order to perform routing using the bit vectors generated in the pre-processing access is generally needed to region IDs 1002 at all levels for a given node, region IDs of all levels are stored in the same file near each other rather than splitting them in different files per level.

A bit vector page of $2^n$ nodes (n=4 for example) and with 3 Apollo levels would thus store node IDs as follows:

node#0: local_region_id_level_0 local_region_id_level_$_{-1}$ $_{local}$_region_id_level_2 node#1: local_region_id_level_0 local_region_id_level_1 local_region_id_level_2 node#2: local_region_id_level_0 local_region_id_level_1 local_region_id_level_2 . . .

node#15: local_region_id_level_0 local_region_id_level_1 local_region_id_level_2

Additionally:

Nothing is encoded around nodes with 1 or 2 attached road segments (i.e. for nodes for which we store 0 as number of attached road segments).

When the bit in page code is set at a given level, then it is knows that all nodes are in the same region ID at that level and the region ID at that level is then encoded only once (for the first node with >=3 attached road segments). The number of bits to encode the region ID is log_2(regionCount−1).

Except for the first node in a page where a region ID is encoded, a bit is also encoded before encoding each region ID. This bit indicates whether the region ID is identical to previously encoded node ID at the same level. When this bit is set, there is no need to encode the region ID since it is the same as previously encoded at that level. When this bit is 0, we encode a region ID with log_2 (regionCount−1) bits. Since many consecutive nodes are in the same region, we often only need 1 bit to encode the region ID.

Huffman encoding of the local region index is efficient because:

regions are sorted by frequencies in each region page (so local index 0 is more frequent than local index1, . . . )

there are distinct specialized Huffman trees for each number of regions in a page (1 Huffman for 3 regions in page, 1 Huffman tree for 4 regions in page, etc). Huffman trees are small and as such it is possible to store several without using significant amounts of memory.

having 3 regions or more should be rather rare anyway, at least at level 0 (but it won't be rare at other levels).

Encoding of Bit Vectors in Variable Size Records

Each variable size record contains bit vectors for all road segments around the page in the page. Bit vectors are encoded only around nodes with 3 or more attached road segments (road segments). For nodes with 1 or 2 attached road segments, routing methods can implicitly give bit vectors values 111 . . . 111) to those nodes.

The to-nodes are not encoded.

With reference to FIG. 10, it is noted that a road segment may be specified by two nodes; one at each end thereof. Thus, when direction is considered a node at the beginning of a direction may be referred to as a from_node and a node at the end may be referred to as a to_node.

Various properties about the bit-vectors are used within the encoding to make it efficient:

Many of the bit vectors are 000 . . . 000 or 111 . . . 111.

For other values of bit-vectors (ie non 000 . . . 000 or 111 . . . 111) there is likely to be repetition and the same value will likely be repeated.

Also the OR of all bit vectors around a given node should be 111 . . . 111.

Bit vectors are encoded as a first Huffman code and optional further Huffman codes. The first Huffman code indicates whether the bit vector is:

code 0 for trivial bit vector 000 . . . 000 code 1 for trivial bit vector 111 . . . 111 code 2 or to indicate a non-trivial bit vector not yet encountered in the page. In that case, and only in this case, other Huffman code follow to encode the newly encountered bit vector.

a code>=2 when bit vector is identical to a previously encountered bit vector in the current page (ignoring trivial bit vectors 000 . . . 000 and 111 . . . 111). This encoding thus uses the history of previously encountered code in the page. The code then actually gives the index in history of all previously encountered codes.

Other than this Huffman code, more information needs to be encoded only in the case of non-trivial bit vectors not found in history (code=2). In that case, right after Huffman code==2, is encoded:

a negated bit

Several Huffman codes to encode by blocks of N bits the bit vectors for n regions (N and n are given in the map header). For example. Encoding 100 regions (99 bits bit vectors) using blocks of 11 bits requires encoding 9 Huffman codes (9×11=99).

Since most bit vectors contain either mostly 0s or either mostly 1, the negated bit indicates whether the bit vector is stored negated or not. This enables storage of codes in Huffman tree containing by far mostly 0s (thus improving Huffman encoding of the blocks). The negated bit exists only if the size of the blocks is smaller than the number of regions, which is the case in practice at level 0 but at level 1 or 2, the whole bit vector might be encoded in 1 block only so negated bit is not needed.

If there are 100 region; N=100 (hence 99-bit bit vectors), the first block encode bits for destination regions 1 to 11, the second block encodes region 12 to 22, etc. In the first block, the LSB (0x1) corresponds to destination region 1, the next bit (0x2) corresponds to region 2, the next bit (0x4) corresponds to region 3, etc.

For bit vectors using history, the depth of the history array is the number of previously encountered distinct bit vectors in the page (without taking into account trivial bit vectors 000 . . . 000 and 111 . . . 111). A different Huffman tree is used whether the history vector contains 0 elements, 1 element, 2 elements, 3 elements, etc. Multiplying the Huffman trees is acceptable since all the Huffman trees are small and as such significant storage is not required:

when history has 0 elements, Huffman tree has 3 codes: 0 for 000 . . . 000, 1 for 111 . . . 111, 2 for new bit vector.

when history has 1 element, Huffman tree has 4 codes: 0 for 000 . . . 000, 1 for 111 . . . 111, 2 for new bit vector, 3 for same as element #0 in history.

when history has 2 elements, Huffman tree has 5 codes: 0 for 000 . . . 000, 1 for 111 . . . 111, 2 for new bit vector, 3 for same element #0 in history, 4 element #1 in history. etc.

The size of the bit vector page is expected to be small (2" from-nodes for example) so the number of Huffman tree is expected to be small.

However, it is possible to limit the size of the Huffman tree to a maximum value: eg. whenever history contains more than H elements, a single Huffman tree will be used (value H is stored in map header).

This encoding encodes only distinct bit vectors in each page+some codes.

The encoding is more efficient in size with large index pages but at the cost of slowing down decoding in order to use the bit vectors for routing purposes (more bit vectors to decode in pages).

Statistics

Here are detailed statistics for a file format when encoding Benelux in 254 regions (1 level). The following input parameters were used:
 number of bits per bit vector block: 11
 number of nodes per bit vector page: 2^=16
 number of nodes per region page: 2^9=512

Statistics are provided to give an idea of the map form in term of map size and illustrate the description of the map format on some real data:

Global statistic counters:

| | | |
|---|---:|---:|
| node count | 1598632 | |
| line count | 1598632 | (100.000%) |
| skip lines around nodes with 1 lines | 220180 | (13.773%) |
| skip lines around nodes with 2 lines | 727138 | (45.485%) |
| Stats at level = [0]: | | |
| Map counters | 87437736 | (100.000%) |
| encoded trivial arp-flags 000 . . . 000 | 1310914 | (31.651%) |
| encoded trivial arp-flags 111 . . . 111 | 913348 | (22.052%) |
| encoded trivial arp-flags in history | 362432 | (8.751%) |
| encoded trivial arp-flags not in history | 607717 | (14.673%) |
| negated blocks | 235171 | (5.678%) |
| Map size (in bits) | 87437736 | (100.000%) |
| global header | 496 | (0.001%) |
| Huffman trees | 28808 | (0.033%) |
| region blob | 52664 | (0.060%) |
| region pages infos | 56216 | (0.064%) |
| arp-flag page infos | 2497880 | (2.857%) |
| variable size records | 84801672 | (96.985%) |
| line count around nodes | 2847844 | (3.257%) |
| node region IDs | 2112451 | (2.416%) |
| arp-flags | 79841370 | (91.312%) |
| code trivial 000 . . . 000 | 1689322 | (1.932%) |
| code trivial 111 . . . 111 | 1826696 | (2.089%) |
| code found in history | 1668053 | (1.908%) |
| not found in history | 74657299 | (85.383%) |
| code not found in history | 1463183 | (1.673%) |
| negate bit | 607717 | (0.695%) |
| blocks | 72586399 | (83.015%) |

All sizes are in bits. Total map size is 87,437,736 bits (10,929,717 bytes).

The indentation reflects the hierarchy. The variable size record information is by far the largest piece of information (96.975% of map size). In the variable size records, the sub items (indented) give more details. The bit vectors are by far the biggest piece of information to store in variable size records (91.312%). And in the bit vectors, storing the non-trivial bit vectors not yet encountered in history constitutes the biggest portion of the map (83.015%).

Statistics on Huffman trees

This section gives statistics for Huffman trees when encoding Benelux in 255 regions (ie for the map data shown above).

Huffman Tree of the Number of Road Segments Around Each Node

| [Huffman trees: NrLines] | | | |
|---|---|---|---|
| bits: | 1 value: | 3 code | 0 |
| bits: | 2 value: | 2 code | 10 |
| bits: | 3 value: | 1 code | 110 |
| bits: | 4 value: | 4 code | 1110 |
| bits: | 5 value: | 5 code | 11110 |
| bits: | 6 value: | 6 code | 111110 |
| bits: | 7 value: | 7 code | 1111110 |
| bits: | 7 value: | 8 code | 1111111 |

Most nodes have 3 attached road segments, but in 2nd and 3rd position in the Huffman tree we find nodes with 2 and 1 attached road segments (which are not decision nodes).

Huffman Tree of Non-Trivial Bit Vector Blocks

This is the biggest Huffman tree since storing blocks of trivial bit vectors is the biggest map size contributor by far (83.015% in the example of Benelux 255 region).

| [Huffman trees: NonTrivialArpFlagBlock] | | | |
|---|---|---|---|
| bits: | 1 value: | 0 code | 0 |
| bits: | 6 value: | 1 code | 100000 |
| bits: | 6 value: | 2 code | 100001 |
| bits: | 6 value: | 4 code | 100010 |
| bits: | 6 value: | 8 code | 100011 |
| bits: | 6 value: | 16 code | 100100 |
| bits: | 6 value: | 32 code | 100101 |
| bits: | 6 value: | 64 code | 100110 |
| bits: | 6 value: | 512 code | 100111 |
| bits: | 6 value: | 1024 code | 101000 |
| bits: | 7 value: | 128 code | 1010010 |
| bits: | 7 value: | 256 code | 1010011 |
| bits: | 7 value: | 384 code | 1010100 |
| bits: | 8 value: | 5 code | 10101010 |
| . . . snip, too large . . . | | | |
| bits: | 24 value: | 1534 code | 111111111111111111111011 |
| bits: | 24 value: | 1717 code | 111111111111111111111100 |
| bits: | 24 value: | 1741 code | 111111111111111111111101 |
| bits: | 24 value: | 1830 code | 111111111111111111111110 |
| bits: | 24 value: | 1973 code | 111111111111111111111111 |

Storing a block made of all 0 is the most frequent pattern and is encoded in only 1 bit according the above Huffman tree (which means 50% or more of blocks encode value 0, even though trivial bit vectors 000 . . . 000 are not encoded by blocks). This is because most non-trivial bit vector contains either
 mostly 0s (and a few 1s)
 or mostly 1s (and a few 0s)

The encoding scheme negates (~) bit vectors containing mostly is so in the end, encoding blocks of bit vectors mostly encodes blocks containing 000 . . . 000 in 1 bit only. The next most frequent blocks are blocks where only 1 bit is set (1, 2, 4, 8, 16, 32, 64 . . .). They have more or less the same frequencies hence same (or almost the same) number of bits.

Huffman Trees of Local Region IDs Since list of regions are stored by frequency in each page, we can see that storing local region ID 0 takes less bits (in fact only 1 bit) than other location region IDs. The different Huffman trees correspond to pages with 3 regions, 4 regions, 5 regions, etc.

| [Huffman trees: Regions__0] | | | |
|---|---|---|---|
| bits: | 1 value: | 0 code | 0 |
| bits: | 2 value: | 1 code | 10 |
| bits: | 2 value: | 2 code | 11 |
| [Huffman trees: Regions__1] | | | |
| bits: | 1 value: | 0 code | 0 |
| bits: | 2 value: | 1 code | 10 |
| bits: | 3 value: | 2 code | 110 |
| bits: | 3 value: | 3 code | 111 |
| [Huffman trees: Regions__2] | | | |
| bits: | 1 value: | 0 code | 0 |
| bits: | 2 value: | 1 code | 10 |
| bits: | 3 value: | 2 code | 110 |
| bits: | 4 value: | 3 code | 1110 |
| bits: | 4 value: | 4 code | 1111 |
| [Huffman trees: Regions__3] | | | |
| bits: | 1 value: | 0 code | 0 |
| bits: | 2 value: | 1 code | 10 |
| bits: | 3 value: | 2 code | 110 |
| bits: | 4 value: | 3 code | 1110 |
| bits: | 5 value: | 4 code | 11110 |
| bits: | 5 value: | 5 code | 11111 |
| ... snip ... | | | |
| bits: | 4 value: | 4 code | 1101 |
| bits: | 4 value: | 5 code | 1110 |
| bits: | 5 value: | 6 code | 11110 |
| bits: | 5 value: | 7 code | 11111 |
| ... snip ... | | | |

Huffman Trees of Bit Vector History Codes

Code 0 (meaning trivial bit vector 000 . . . 000) is the most frequent (and encoded in 1 bit only in most cases). Code 1 (trivial bit vector 111 . . . 111 is then the next most frequent (and encoded in 1 bits only). The next most frequent code (2) is for non-trivial bit vector encoded by blocks. The other codes (>2) for bit vector found in history.

| [Huffman trees: ArpFlag__0] | | | |
|---|---|---|---|
| bits: | 1 value: | 0 code | 0 |
| bits: | 2 value: | 1 code | 10 |
| bits: | 2 value: | 2 code | 11 |
| [Huffman trees: ArpFlag__1] | | | |
| bits: | 1 value: | 0 code | 0 |
| bits: | 2 value: | 1 code | 10 |
| bits: | 3 value: | 2 code | 110 |
| bits: | 3 value: | 3 code | 111 |
| [Huffman trees: ArpFlag__2] | | | |
| bits: | 1 value: | 0 code | 0 |
| bits: | 2 value: | 1 code | 10 |
| bits: | 3 value: | 2 code | 110 |
| bits: | 4 value: | 3 code | 1110 |
| bits: | 4 value: | 4 code | 1111 |
| [Huffman trees: ArpFlag__3] | | | |
| bits: | 1 value: | 0 code | 0 |
| bits: | 2 value: | 1 code | 10 |
| bits: | 3 value: | 2 code | 110 |
| bits: | 4 value: | 3 code | 1110 |
| bits: | 5 value: | 4 code | 11110 |
| bits: | 5 value: | 5 code | 11111 |
| [Huffman trees: ArpFlag__4] | | | |
| bits: | 1 value: | 0 code | 0 |
| bits: | 2 value: | 1 code | 10 |
| bits: | 3 value: | 2 code | 110 |
| bits: | 4 value: | 3 code | 1110 |
| bits: | 5 value: | 4 code | 11110 |
| bits: | 6 value: | 5 code | 111110 |
| bits: | 6 value: | 6 code | 111111 |
| [Huffman trees: ArpFlag__5] | | | |
| bits: | 2 value: | 0 code | 00 |
| bits: | 2 value: | 1 code | 01 |
| bits: | 2 value: | 2 code | 10 |
| bits: | 4 value: | 3 code | 1100 |

Influence of Input Parameters on Map Size

There are a number of input parameters which control the file format shown in FIG. 11 and which can influence map size. Tweaking the parameters can be a trade-off between map size and memory usage or speed of decompression depending on parameters.

Embodiments of the invention may use the following input parameters:

region page size bit vector page size bit vector block size bit vector Huffman codec count region Huffman codec count Influence of Bit Vector Block Size

| value | map size (bits) | |
|---|---|---|
| 4 | 35548192 | |
| 5 | 33648792 | |
| 6 | 32290344 | |
| 7 | 30853616 | |
| 8 | 31103200 | |
| 9 | 30436696 | (default) |
| 10 | 30051792 | |
| 11 | 29266784 | |
| 12 | 28934696 | |

Increasing the Huffman block size for the bit vectors improve map compression. The higher the block size, the better the compression. But increasing block size comes at the price of requiring more memory to store a bigger Huffman tree of $2^n$ values. The above table illustrates this.

Influence of this parameter is expected to become more significant when we introduce the optimization to remap region IDs per source region: this optimization will hopefully result in significant maps size reduction when using large bit vector block size.

Influence of Bit Vector Page Size

| value | map size (bits) | |
|---|---|---|
| $2^1$ | 55563944 | |
| $2^2$ | 42502936 | |
| $2^3$ | 34898840 | |
| $2^4$ | 30436696 | (default) |
| $2^5$ | 27389952 | |
| $2^6$ | 25165032 | |
| $2^7$ | 23635936 | |

Increasing page size helps to compress maps better. But big pages unfortunately slow decompression of the data in the file format by routing methods, since accessing bit vector of a random road segment requires to decode all road segments in page. The above table illustrates this.

Influence of Bit Vector Huffman Codec Count

| value | map size | (bits) |
|---|---|---|
| 1 | 30866920 | |
| 2 | 30748024 | |
| 3 | 30634168 | |
| 5 | 30504504 | |
| 7 | 30467944 | |
| 9 | 30436696 | (default) |
| 11 | 30423688 | |

Increasing the number of bit-vector Huffman codec helps to increase compression slightly and this is illustrated in the above table. There is almost no drawback to increasing the value since those Huffman trees are small anyway. Increasing beyond 9 Huffman trees (default value) does not give any significant improvement. Increasing this parameter might be more effective with larger bit vector pages.

Coalescing & Reordering Bits in Bit Vectors

Bit vectors have patterns. Those patterns differ significantly for each source region (i.e. region of the node where bit vector is stored). The number of bits to store N-bits bit vectors can be reduced by storing small translation tables for each source region. These tables perform 2 functions further described in this section:

bit coalescing bit reordering

The idea can be understood intuitively as follows: when in Spain, it is clear that a road segment which leads to Sweden (bit=1 for destination region Sweden) is most likely to also lead to Norway (i.e. bit for destination Norway is then also 1). If another road segment does not lead to Sweden (bit=0), then it also does not lead to Norway in most cases. So when in Spain, the values of the bit vector bits for the destination regions Sweden and Norway are almost always equal. In fact, they are even always strictly equal for many destination regions. Which bits are well correlated with which bit depends greatly on the from region.

When in Finland for example, bits for destination region Norway and Sweden are far less correlated. On the other hand, in Finland, bits for destination region Spain and Portugal are likely to be 100% correlated (or at least very close to 100%).

Bit coalescing exploits the property that some bits are always equal (fully correlated). Those bits can be coalesced into a single bit. Coalescing bit reduces the number of bits to encode in each region.

Bit reordering exploits the property than some bits are fairly well correlated (but not 100% correlated) in order to shuffle bits in such a way as to optimize Huffman encoding of bit vectors (and/or reduce size of Huffman trees).

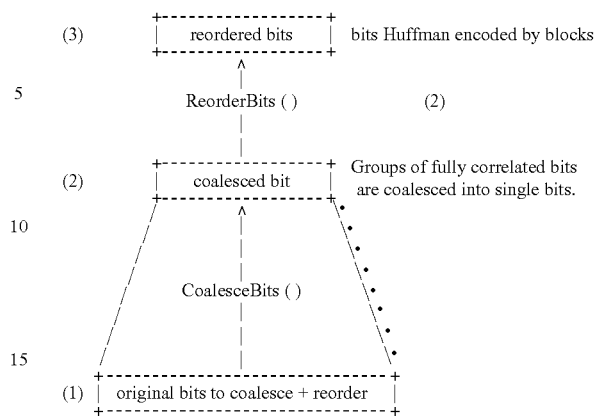

Before computing tables to coalesce bits and reorder bits, the correlations of all pair of bits in all from-regions is calculated. The number of distinct pairs is:

$C(N, 2) = N!/(2!*(N-2)!) = N*(N-1)/2$

... where N is the number of regions. This number is thus fairly high when the number of regions is high. Computing all bit correlations is the slowest part of the method to generate the file format shown in FIG. 11. The complexity of the method is n*N*N where n is the number of bit vectors and N is the number of regions. For each pair of bits (i.e. pair of distinct columns in bit vectors) in each region, we compute a tri-dimensional table:

bitCorrelation[fromRegionId][bitI][bitJ].

Each entry in table contains a struct of 4 fields which counts:

the number of times bitI=0 and bitJ=0 in all bit-vectors of fromRegionId the number of times bitI=0 and bitJ=1 in all bit-vectors of fromRegionId the number of times bitI=1 and bitJ=0 in all bit-vectors of fromRegionId the number of times bitI=1 and bitJ=1 in all bit-vectors of fromRegionId Although expensive in terms of processor time (and therefore slow) to compute, this process can be easily parallelized since computing bit correlations for each from-region is completely independent from other from-regions.

Embodiments of the present invention use multi-threading to speed up computation of correlation of all bits to efficiently use SMP (Symmetric Multiprocssing) machines. In one system, a 1-CPU machine computing bit correlation of Benelux with 300 regions takes about 8 minutes. But parallelism scales well and when enabling threads and using the 4 CPUs computing bit correlation then takes 2 minutes (4 times less).

Bit Coalescing

When several bits are fully correlated (i.e. always all 0 or all 1), we can coalesce them into only 1 bit without loosing any information. Referring to a set of bits which are fully correlated in a given region as a 'group' then bit vectors of a given region are made of several groups. If N-bit bit vectors are made of n groups, then encoding N-bit bit vectors uses n-bits+a small table to indicate which bits are equivalent in each region.

Such bit coalescing has the advantage that size of the resultant file is reduced in a lossless manner. This advantage is likely to be increased as the number of regions increases since more bits are likely to be coalesced. So map size increases in a sub-linear way with number of regions.

In one embodiment the following data was obtained:

|  | minimum number of groups | average number of groups | maximum number of groups |
|---|---|---|---|
| Benelux 255 regions | 12 | 84 | 152 |
| Benelux 300 regions | 13 | 90.017 | 163 |

As such, in the Benelux example having 255 regions there is at least 1 region which has only 12 groups (i.e. requires only 12 bits to encode its 255 bits bit vectors (ie the bit vector is the same length as the number of regions) even before Huffman encoding (and thus even less after Huffman encoding).

On average, regions require 84 bits for Benelux 255 regions. In this example, the worst region requires 152 bits (152 groups) before Huffman encoding.

As another example and taking region Id=3 in the above 255 region Benelux example which has the following 18 groups as taken from the encoded data.

```
regionId= [3] has (18) groups:
#1 ( 0 )
#1 ( 1 )
#1 ( 2 )
#141 ( 3 4 5 7 8 11 12 15 16 19 20 21 22 23 24 25 26 27 28 29 30
      31 32 33 36 37 38 39 40 42 43 44 45 46 50 51 59 60 62 63 66
      67 69 71 72 73 74 :75 76 80 81 82 83 84 86 88 89 90 95 96 97
      98 100 101 102 103 104 105 106 108 110 112 113 119 120 123
      127 129 130 133 135 136 139 142 143 147 148: 149 150 151 154
      155 156 157 159 160 165 166 167 171 172 173 174 176 177 178
      179 181 182 183 190 192 200 203 205 207 210 211 212 213 214
      215 218: 219 220 221 222 226 227 229 235 237 241 242 243 244
      245 247 249 250 252 )
#1 ( 6 )
#1 ( 9 )
#1 ( 10 )
#30 ( 13 14 35 48 49 57 68 85 93 109 115 117 118 128 131 134 138
      153 158 164 168 169 187 189 195 209 217 224 238 239 )
#59 ( 17 18 47 53 54 56 65 91 92 99 107 114 116 121 124 125 126 132)
      137 140 141 144 145 146 152 161 162 163 170 175 180 184 185
      186 191 193 194: 196 198 199 201 202 204 206 208 216 223 225
      228 230 231 232 233 234 236 240 246 248 251 )
#1 ( 34 )
#5 ( 41 78 79 111 197 )
#3 ( 52 77 87 )
#1 ( 55 )
#3 ( 58 61 94 )
#1 ( 64 )
#1 ( 70 )
#1 ( 122 )
#1 ( 188 )
```

Each road segment represent a group (18 groups for regionId=3). The numbers in parentheses are bit indices which coalesced in each group. The number after # is the number of bits in each group.

In this example, 1 group is very large and contains as many as 141 regions. This is not unusual. In general, regions on the border of the map coalesce more bits than region in the middle of the map.

In this example, the number of bits has been reduced on average by a factor ~3 (~=255/84). Of course that does not mean that map size is reduced by a factor 3 since the remaining bits to encode have more entropy than original bits (so are more difficult to encoder with Huffman blocks). But bit coalescing bits may still reduce map size, perhaps significantly.

Figure 15:
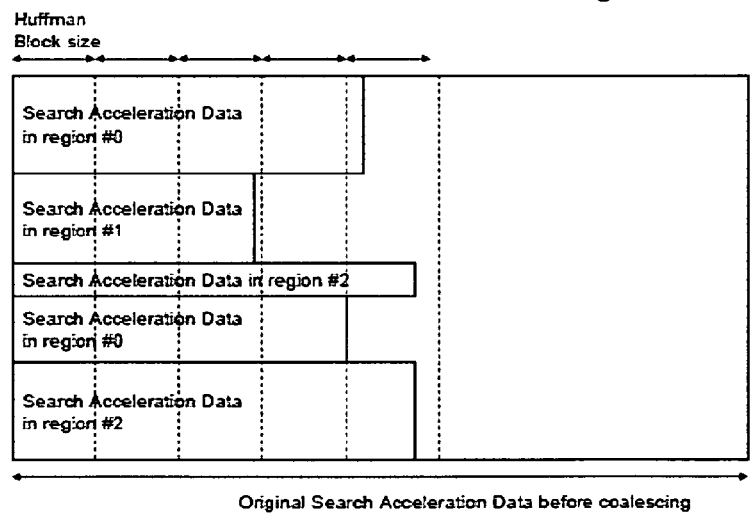
FIG. 15 exemplifies coalescence of bits within an encoding scheme.

When coalescing bits in each region, bit vectors in each region have different number of bits as result (but identical number of bits for bit vectors of a given from-region) as illustrated in FIG. 15. The shading illustrates the from-region ID of each bit-vector.

Once table bitCorrelation has been computed, identifying groups of fully correlated bits is fairly easy and fast. All pairs of bits where we find no 01 or 10 patterns are fully correlated and can be coalesced into 1 bit.

To give a further example of bit coalescing, the table below gives an example of 6 bit vectors, each of 15 bits. These have not been coalesced.

```
100111101111100
000001101110100
011001010010111
111110010001011
011000010000011
000000101100000
...
```

These 15-bit bit vectors can be coalesced into only 4 groups—hence 4 bits per bit vector before Huffman encoding. This is shown in the following table:

| 1 | 2 | 3 | 4 | 5 | 6 | 7 | 8 | 9 | 10 | 11 |   | 1·3·9 | 2·11 | 5·7 | 4·8·10 |
|---|---|---|---|---|---|---|---|---|---|---|---|---|---|---|---|
| 1 | 00 | 11 | 1 | 1 | 0 | 11 | 1 | 1 | 1 | 00 | → | 1 | 0 | 1 | 1 |
| 0 | 00 | 00 | 1 | 1 | 0 | 11 | 1 | 0 | 1 | 00 | → | 0 | 0 | 1 | 1 |
| 0 | 11 | 00 | 1 | 0 | 1 | 00 | 1 | 0 | 1 | 11 | → | 0 | 1 | 0 | 1 |
| 1 | 11 | 11 | 0 | 0 | 1 | 00 | 0 | 1 | 0 | 11 | → | 1 | 1 | 0 | 0 |
| 0 | 11 | 00 | 0 | 0 | 1 | 00 | 0 | 0 | 0 | 11 | → | 0 | 1 | 0 | 0 |
| 0 | 00 | 00 | 0 | 1 | 0 | 11 | 0 | 0 | 0 | 00 | → | 0 | 0 | 1 | 0 |

The heading of the right hand portion of the table shows which bits the 4-bit coalesced vector in the left hand portion of the table. To clarify, the first bit of the 4-bit coalesced vector represents the 1st, 3rd and 9th columns of the left hand portion. As such, since the 1st, 3rd and 9th bits of the left hand portion (ie the 15-bit original vector) are always the same in the above example, they may be represented by the 1st column of the right hand side of the above table.

Thus, in summary a table of concordance between the left and right hand sides is as follows:

| original bit | coalesced bit |
|---|---|
| 0 | 0 |
| 1 | 1 |
| 2 | 1 |
| 3 | 0 |
| 4 | 0 |
| 5 | 3 |
| 6 | 2 |
| 7 | 1 |
| 8 | 2 |
| 9 | 2 |
| 10 | 3 |
| 11 | 0 |
| 12 | 3 |
| 13 | 1 |
| 14 | 1 |

What coalescing bits effectively does, is to group nearby destination regions and destination regions in the same angle sector from the from-region as illustrated in FIG. 16.

Figure 16A:
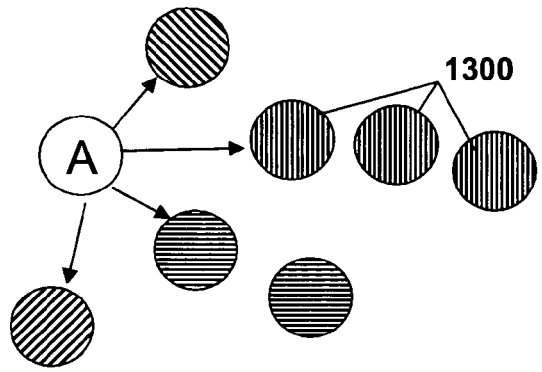
FIG. 16 exemplifies the effect of coalescing bits.
Figure 16B:
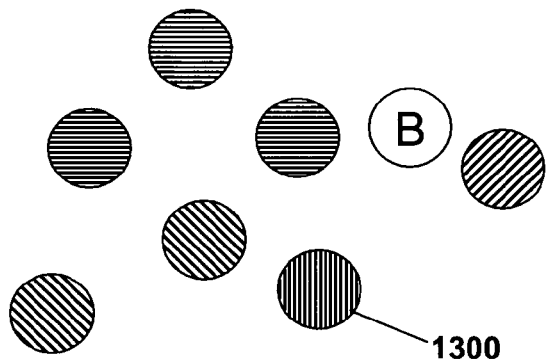

The shading in FIG. 16 indicates groups of regions which are coalesced together. The 2 Figures (ie FIGS. 16a and 16b) show the same regions coalesced from the point of view of 2 different from-regions: A and B. Which region coalesced together depends on the region ID of the from node as shown by the Figure. In this Figure, the 8 regions are coalesced into 4 groups. Coalescing bits is different from the point of view of from-region A or from-region B in these Figures. Notice how the vertical striped region (1300) are coalesced because they are in the same direction when seen from the from-region A.

Figure 17:
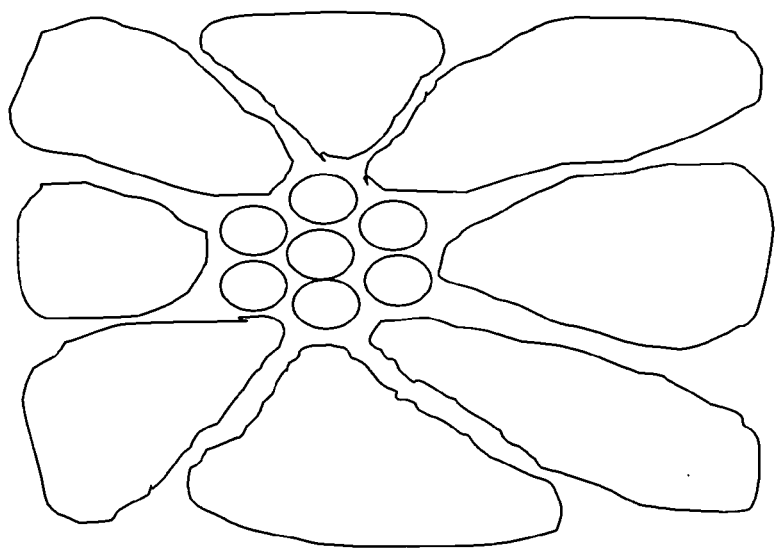
FIG. 17 also exemplifies the effect of coalescing bits.

This is further exemplified in FIG. 17 which illustrates that coalescing bits groups nearby destination regions and destination regions in +/− the same angle sector, from each from-region point of view.

After coalescing bits, the number of bits to encode for bit vectors differ for each region. In the case of Benelux 255 regions for example, the number of bits bit vector for each region is:

| from region -> coalesced bits |
|---|
| 1 -> 57 |
| 2 -> 93 |
| 3 -> 18 |
| 4 -> 12 |
| 5 -> 63 |
| 6 -> 75 |
| ... snip ... |
| 251 -> 21 |
| 252 -> 46 |
| 253 -> 117 |
| 254 -> 80 |

The method is exact (it is not a heuristic). It thus finds the ideal number of groups of bits.

In some embodiments, coalescing bits is implemented in a lossless way: region are only coalesced when they always have the same bits. But in other embodiments, this may be extended to make it lossy; ie such that full recovery of the original data is not possible. Such lossy embodiments may introduce a threshold: if a pair of bits differ by less than X times, then we could coalesce the bits if replacing one or more 0's with a 1 in some of the bit vectors allowing those bit vectors to be coalesced.

An example of such a lossy coalescence would be to coalesce 0000001100 with 0000001110. An advantage of such an approach is that there is better compression of the data but a disadvantage is that further road segments will be assessed by routing methods using the bit vectors since extra 1's will indicate that a road segment is part of a fastest route.

In the case of lossless coalescing, the threshold is 0. Increasing the threshold would allow to coalesce further regions, at the cost of introducing a few bits 1 in the bit vectors. But if the threshold is kept low, it would have almost no impact on the speed at which routing may be performed using the data format. For example, if 2 bits are almost always identical in thousands of bit vectors, except for say only 1 bit vector, it my be acceptable to alter this unique bit vector where it differs to make it possible to coalesce more bits. The higher the threshold, the more map compression we can expect.

Bit Reordering

In some embodiments, once bits have been coalesced as described above, bits may be reordered. Reordering bits does not reduce the number of bits to encode (before Huffman encoding) but helps to make Huffman encoding more efficient, hence reducing map size and also can help to reduce the number of distinct codes in bit vector Huffman codes, hence reducing memory requirement for Huffman trees.

Unlike bit coalescing, bit reordering is a heuristic method so it finds a good reordering but it may not find the best one.

Bit vectors are encoded by blocks. Block size is customizable and stored in the map header 800. In the explanation given below, and as an example, the block size is set to 11 bits. The number of bits in bit vectors may not be divisible by 11, so the last block may be smaller than 11 bits. The last block uses a different Huffman tree than the one for full blocks of 11 bits. Encoding each bit-vector thus encodes:

several full blocks using a Hufman code for 11 bit-blocks (in this example)

1 last block which may another Huffman code when less than 11 bits remain.

The following picture depicts the bits to Huffman encode by blocks with bit vectors in 2 regions (which have different number of bits after coalescing):

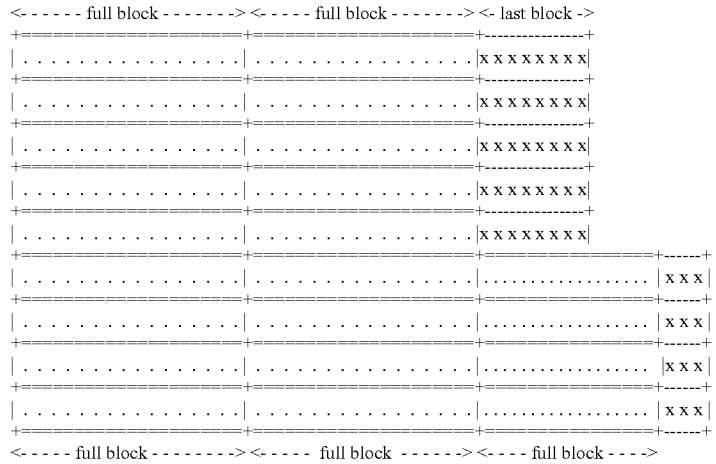

Having Huffman trees for each region would likely be too expensive in memory. So in some embodiments, the same Huffman tree is shared for all regions. Since correlated bits are different in each region, it pays-off to reorder bits in each region, so that the correlated bits are put systematically at the same positions in all regions. So sharing of Huffman tree across all regions becomes more efficient.

The table to reorder bits for each region is stored in map data. Note that we do not need to encode a separate table to coalesce bit and table to reorder bit but we can instead encode only 1 table which is the composition of both transformations (coalescing+reordering).

The method to reorder bits in full blocks proceeds as follows: for each region, find the pair of bits most correlated. Since fully correlated bits have already been coalesced, none of the remaining bit are fully correlated. However, some pair of bits are far more correlated than other. The most correlated pair of bits (a, b) are remapped to bit #0 and #1 in the first full block:

As a result of grouping pairs of bits most correlated, Huffman trees of full blocks have less distinct codes (which has the advantage of using less memory to store the data) and the statistics are more skewed (making Huffman encoding more efficient). Rather than containing random sequences of bits, the first 2 bits for example contain in the vast majority of the cases either 00 or 11 but almost never 10 or 01 (same for other bits). Without reordering bits, the first 2 bits would contain all kind of patterns 00, 01, 10, 11.

After remapping the first 2 bits, method then finds the next most correlated (c, d) pair of bits and remap them to store them in the first 2 bits of the second block:

Then method finds again the next most correlated (e, f) pair of bits and remap them to store them in the first 2 bits of the third block:

When reaching the last full block, the method goes back to the first full block and remaps the next most correlated pair of bits (g, h). If several pairs have same correlation, a tie breaker selects the pair most correlated with the previous pair in the same block (i.e. pair most correlated with (a, b)):

```
+====================+====================+====================+-----+
|a b g h . . . . . . . . . . . .|c d . . . . . . . . . . . . . . .|e f . . . . . . . . . . . . . . .|x x x|
+====================+====================+====================+-----+
```

The algorithm method proceeds as above until all pair of bit in full blocks have been remapped:

```
+====================+====================+====================+-----+
|a b g h m n s t y z .|c d i j o p u v A B .|e f k l q r w x C D.|x x x|
+====================+====================+====================+-----+
```

In this example, since block size has an odd number of bits (11 bits) a non-remapped bit still exists in each full block. The method then finds the bit most correlated with 'z' and stores it in the first block. Then finds the bit most correlated with B and stores it in the second block, etc. until all full blocks are remapped:

```
+====================+====================+====================+-----+
|a b g h m n s t y z E|c d i j o p u v A B F|e f k l q r w x C D G|x x x|
+====================+====================+====================+-----+
```

At this point, all bits are remapped in full blocks. The method then remaps bits in the last block trying to group the pair of bits most correlated as was done for the full blocks. Reordering bits in the last block can help to reduce map size but it does not help as much as reordering bits in the full blocks for 2 reasons:

- Full blocks are more important. In this example, each code uses 3 Huffman codes for full blocks whereas it uses only 1 Huffman code for the last block, so it is normal that full blocks contribute more to the overall map size than the last incomplete last block and it is more useful to optimize Huffman encoding of full blocks.
- Since we already picked all the most correlated bits to remap them in the full blocks, the bits left to remap in the last block are less correlated. So entropy of bits in the last block is thus higher than for bits in the full blocks. In other words, Huffman encoding of the last block is not as efficient as Huffman encoding of the full blocks.

```
+====================+
|a b g h m n s t y z E|
+====================+
|c d i j o p u v A B F|    (3 full blocks using same Huffman codec)
+====================+
|e f k l q r w x C D G|
+====================+

+-------+
|H I J|                    (1 last block using another Huffman codec)
+-------+
```

The reason for the method to remap first bits of each block (rather than remapping all bits in first block before jumping to second block) should be clearer when seeing the above figure. Since the same codec is used for all full blocks, it is desirable to have all codes for all blocks as identical as possible. If we were to remap all bits in first block, then all bits in second block (etc), then each block would have quite different patterns: first blocks would have the most correlated bits, second block would have less correlated bits, third block would have

```
+====================+====================+====================+-----+
|a b g h m n s t y z E|c d i j o p u v A B F|e f k l q r w x C D G|H I J|
+====================+====================+====================+-----+
```

It should be remembered that the same Huffman tree is used for all full blocks of all regions. Encoding the bit vector in the above example thus encodes with the same Huffman codes all the full blocks and finally encodes the last block with a different Huffman codec:

even less correlated bits, etc. It would be possible to create several Huffman codec for each column of the full blocks but that is believed to be too expensive in memory. The method so-far outlined works well while sharing the same Huffman codec for all full blocks.

Possible Other Optimizations

Pages of Pages

The bit vector page info stores a delta field which is used to find the beginning offset of each bit vector page. The delta field is stored using a road linear interpolator of the offset. But the offsets are not very road linear because bit vectors around small node ID's (level 0, motorways) require more bits than bit vectors around high node ID's (level 5, destination roads).

Encoding of bit vector page info is not as advantageous as may be desired because the interpolator does not precisely predicts the actual offset. By improving the interpolator, it would be possible to improve the encoding of the bit vector page info table to make it more efficient.

Some embodiments of the invention may use bit vector pages (and possibly region pages) having 2 levels rather than only 1 level. The pages of $2^n$ nodes to group the data (let's call them subpages) can be grouped into pages of $2^N$ subpages.

As such, the linear interpolation parameters would be stored per page rather than globally (in header). For example, index level 2 might group $2^4$=16 nodes as earlier in subpages, and index 1 might group $2^{10}$=1023 of those subpages in pages. The linear interpolation then happens for 1024*16=16K nodes rather than on the entire node count (40,000,000 nodes in a map of Western_and_Central_Europe) so the linear interpolation of variable size offsets becomes much more accurate and the delta fields in index2 are thus smaller.

The size of the extra index1 is small if pages are large (small enough to fit in memory). Being able to fit within a memory of a device is advantageous since it should not slow down routing using the data. Rather than storing the average page size in header, the average page size could then be stored for every entry in the index1 table.

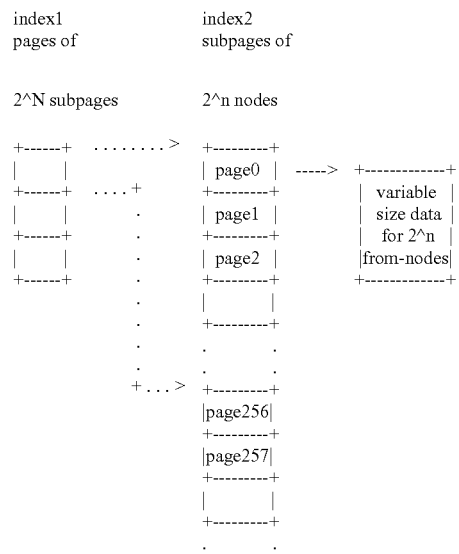

Interleave Bit-Vector Pages

As described above, the interpolator for page offset is not accurate because bit vectors are different for important roads (many non trivial flags) and minor roads (many trivial flags). One simple way to make the interpolator more linear is to interleave pages of different network levels and this may be used in embodiments of the invention.

The file described in the above embodiments stores the following pages:

```
#0
#1
#2
#3
#4
...
#n – 3
#n – 2
#n – 1
```

In other embodiments which may be more efficient it is possible to store in an interleaved manner as follows:

```
#0
#n – 1
#1
#n – 2
#2
#n – 3
#3
#n – 4
...
```

To access page #x (for example by a route planning application) the page is accessed by loading page #x' where:

x'=2*x (when x is even)

x'=2*(x−(n−1)) (when x is odd)

Such an embodiment should be advantageous since it will reduce size of indexing by several bits per page. However, data may be less well grouped for caching which may slow down data access (less hits in file system cache).

Do Not Store Region IDs for All Nodes

Region IDs does not need to be stored for nodes at dead ends and nodes with 2 attached road segments. These nodes can be ignored for routing. Going to one of these nodes can be transformed into going to their neighbour decision nodes.

Store Extra Information at Page Level and or at Node Level

Looking at map data, there are lots of bit vector pages which only contain trivial bit vectors 000 . . . 000 or 111 . . . 111. Some embodiments may store 1 bit for each page to mark those pages, then storing bit vectors in those pages can be more efficient since we only need a single bit for each bit vector to indicate whether it's 000 . . . 000 or 111 . . . 111. Not only it will reduce size of pages which only contain trivial bit vectors, but it will also make Huffman tree of bit vector codes better optimized for pages which have non-trivial bit vectors (the number of bits to indicate non trivial vectors will be reduced since the frequency of those codes will significantly increase in percentage). In the finer network level (eg level 3), most of the pages only contain trivial bit vectors so there may be only 1 bit vector per page in about half of the pages.

Store Bit Vectors Only at Decision Nodes

As discussed above, some embodiments might not store bit vectors for nodes with 1 or 2 attached road segments. However, other embodiments may be more aggressive and generalize the idea to only store bit vectors around decision nodes.

Concepts of decision node and decision road segment are introduced because they can be advantageous in encoding of map data:bit vectors do not need to be encoded for non-decision road segments as is now discussed.

A decision node is node where there is an incoming road segment for routing such that there are multiple choices to leave the node (without making a U-turn).

A non-decision node is a node which is not a decision node. So regardless of the where routing comes from, there is always only one way out to leave the node.

A decision road segment is a road segment which is legal in order to leave a decision-node.

A non-decision road segment is a road segment which is not a decision road segment.

All decision road segments are thus around decision nodes. But not all road segments around decision nodes are decision road segments. All road segments around non-decision nodes are non-decision road segments.

Bit vectors will be encoded only for decision road segments. Bit vectors are implicit (000 . . . 000 or 111 . . . 111) for non decision-road segments since routing techniques using the data can make a determination from information already present in road segments.

How to determine whether a node is a decision node? The criterion we can be reduced to:

is DecisionNode=(lineCount>=3) && (lineGoingOutCount>=2)

Where:

lineCount: is the total number of lines attached to node ignoring non routable line types (railways, reference lines), ignoring lines closed in both directions and ignoring no-through roads (residential areas).

lineGoingOutCount: is the number of lines attached to a node which are legal to take for leaving the node.

Whether or not it is legal to take a road segment to leave the node depends on road segment attributes:

road segment type (railways & reference road segments are always illegal)

forward/backward flow of way (stored in road segment flags)

no-through attribute in road segment flags (no-through road segments do not have any bit vectors)

In some embodiments ignoring non decision road segments can discards roughly 40% of the road segments. It has been found that this percentage is quite consistent regardless of the map. Avoiding to encoding of 40% of bit vectors is advantageous but it saves less than 40% of the map size, since it mostly removes trivial bit vectors.

Removal of bit vectors around nodes with less than 3 attached road segments (dummy nodes) removes non-trivial bit vectors, so a map size saving for this category of non-decision road segments can be bigger than for the non-decision road segments. On the other hand, filtering requires a decoder (such as a routing method using the map) to decode road segment types and road segment flags of road segments and apply a logic on them in order to figure out bit vectors that are implicit, which may slow down the process.

In theory embodiments could also look at manoeuvres (ie turn restriction) to decide whether a road segment going out is legal, but such a technique adds complexity. Ignoring manoeuvre means that embodiment may encode more bit vectors than strictly necessary but a simplification in the method is achieved.

Example of Non Decision Nodes a--<-->--b--<-->--c

In this example, (b) is attached to 2 road segments navigable in both directions. (b) is not a decision node, because there are <=2 attached road segments.

So bit vectors of both road segments leaving node (b) will not be encoded. Decoder can implicitly set them to 111 . . . 111.

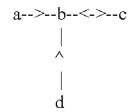

Arrows > in this example show the legal direction of flow. (b) is not a decision node, because there is only one way out. So none of the road segments around (b) need bit vectors.

Bit vectors for the road segment (b)->(c) leaving node (b) are not encoded, it will implicitly be 111 . . . 111. Bit vectors for illegal road segments leaving (b) are not encoded either, they will implicitly be 000 . . . 000.

Examples of Decision Nodes

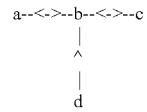

(b) is a decision node because when coming from (d), there is a choice: routing can continue towards (a) or toward (c).

Notice that in this example, when coming from (a), there is no choice: routing can only continue toward (c). But node (b) is still a decision node because there is at least a choice when coming from (d) so bit vectors should be stored for the 2 decision road segments around node (b).

Bit vectors are stored for road segment (b)->(a) and road segment (b)->(a) since they are decision road segments.

A bit vector is not stored for road segment (b)->(d) since this road segment is illegal to take according to backward/forward flow of traffic. It is implicitly 000 . . . 000.

OR-ing Bit-Vectors

Let's suppose that a node has 3 attached road segments and that the first 2 decoded road segments have the following bit vectors:

00000000000000000000
00000000000000000000

Then the third bit vector does not need to be encoded because it can only be:

11111111111111111111

This can only work if bit vectors of road segments around node a happen to be in this order: all bit vectors 000 . . . 000 and the last one is 111 . . . 111. In practice it seems to happen fairly frequently in the finer level (eg level 0) network (which is where most of the road segments are).

Taking the first 2 bit vectors to be:

00000000000000000000
00000000000000000000

Then the third bit vector has can only have all its bits set to 1 except 2 bits which are unknown and need to be somehow encoded.

11111111111111111??1

Since in the above example, most of the bits are already known, it should be possible to use this information to encode the 2 unknown bits more efficiently than encoding the whole bit vector. Thus, in this example, it is only necessary to encode 2 bits.

A possible fast decoding scheme using this property would be to compute a bit-mask of all decoded bit vectors in the road segments of the current nodes by OR ing all previous bit vectors in the road segment. Using the same example as earlier, if a node has 3 attached road segments and if the previous 2 road segments have the following bit vectors:

00000000000000000110
00000000000000000010
. . . then the OR bit mask is:
00000000000000000110

Taking the 3rd and last bit vector to encode around the node as:
11111111111111111001

Instead of encoding the Huffman code of 11111111111111111001 which may be rare, the encoder is free to encode any other code (otherCode) as long as:
value_to_encode=~bitMask|otherCode In this example, otherCode=0000000000000*0000000 qualifies since:
value_to_encode=11111111111111111001=~00000000000000* 000110|00000000000000*000000

Encoding 00000000000000000000 is much more efficient than encoding 11111111111111111001 since 00000000000000000000 is far more frequent. Decoding is fast, since decoding only needs to compute the bitmask (or operation) whenever it decodes a bit vector and apply the bitmask to the last decoded bit vector:

actual bit vector = bitmask & decoded bit vecor

= ~00000000000000000110 &

00000000000000000000

= 11111111111111111001

This optimization works well if road segments around nodes are stored in such a was so as to have the one with most 1 in the bit vector at an end region. However, this can prove difficult:
- sorting road segments around a node is performed before computing bit vectors (unless we use the bit vector information a posteriori to re-encode)
- road segments are already sorted by road names. It is possible to sort road segments around nodes when road names are identified.

Using Network Levels

There should be a strong correlation between bit vectors and network levels of road segments around from-nodes: routing to another region will generally prefer to take the coarse level network (the 1 level will generally be the coarse level network and the 0 on the finer level network).

The following example depicts an intersection with road segments at different network levels:

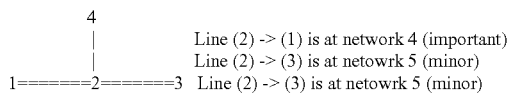

```
      4
      |               Line (2) -> (1) is at network 4 (important)
      |               Line (2) -> (3) is at netowrk 5 (minor)
1======2======3       Line (2) -> (3) is at netowrk 5 (minor)
```

The bit patterns are likely to be as follows:

| 2 | 1 | ? | ? | ? | ? | ? | ? | ? | ? | ? | ? | ? | ? |
| 2 | 3 | ? | ? | ? | ? | ? | ? | ? | ? | ? | ? | ? | ? |
| 3 | 4 | 0 | 0 | 0 | 0 | 0 | 0 | 0 | 0 | 0 | 0 | 0 | 0 |

Not Storing Bit Vectors for Nodes at Finer Network Levels

Routing almost never go through unimportant road segment network levels, such as network level 5, except close to the destination or starting point. Thus, it is possible not to store bit vectors at level 5 and as such, there should be a minimal impact on routing, even though the number of road segments at level 5 is large. Routing in most cases will only explore few road segments at the most unimportant network level at the start or the end of a route since it will quickly reach some more important road segment network levels, and the search acceleration data on those nodes will almost always tell the router to skip a navigation segment that goes back to the most unimportant network level and to use a navigation segment that leads to or stays on the more important network levels. This is true at the most important network level since that network level is used when the destination is still far away.

In addition to dropping bit vectors at the most unimportant road segment (eg level 5), we could also not encode region IDs at that network.

Transform a Few 0s Into 1s in Bit Vectors

This is also a lossy compression scheme.

If a bit vector only contains only one 0 (or possibly less than a small threshold), then it may be possible to transform it into 1 if it results in (ie setting that road segment to be part of a fastest route):
- a trivial bit vector 111 . . . 111 (since trivial bit vector are encoded in a more compact way than non-trivial bit vector)
- or a bit vector already found in the history of the current bit vector page (since those are also encoded more efficiently)

Transforming 0s into 1s in bit vector does not affect the routing outcome, it only makes it slower by having routing consider more road segments (because they are now set to be part of the fastest route). However, some embodiments of the invention may employ this method—particularly if the map saving is large with a small performance hit in terms of routing speed.

Routing

Figure 18:
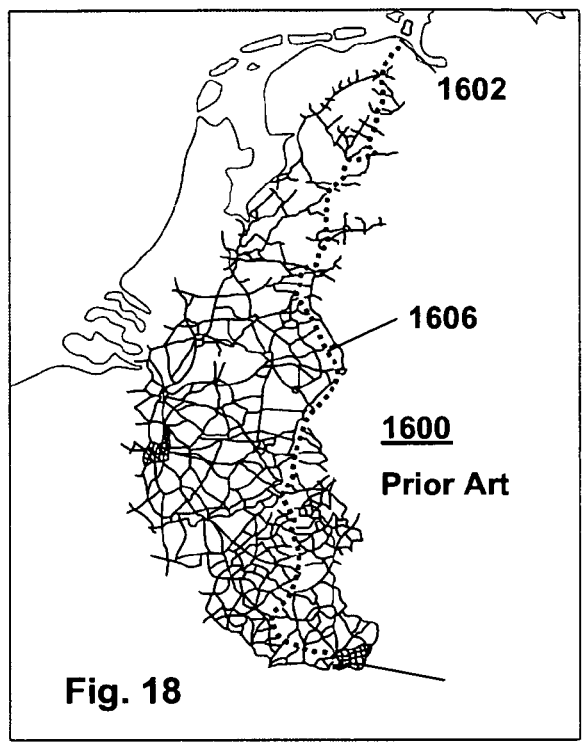
FIG. 18 shows a map highlighting routes considered using PRIOR ART routing techniques.

FIG. 18 a shows a map 1600 covering an area and having a start node 1602 and a destination node 1604 together with a plurality of road segments that have been explored by the prior art A* search method. The selected route is shown by the dotted line 1606.

Figure 19:
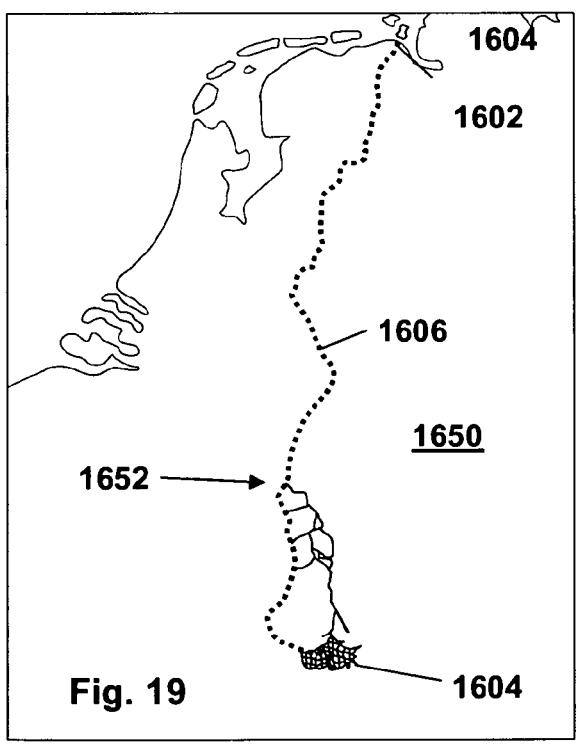
FIG. 19 shows a map highlighting routes considered by embodiments of the current invention.

FIG. 19 shows a map 1650 covering the same area as the map of FIG. 18 and also showing the same start node 1602 and destination node 1604. The Figure also highlights the roads that were explored using an embodiment of the present invention which utilised the same road network and same criterion as used to generate the route of FIG. 18 (eg both are travelling by car, wishing to use speed as the cost function to minimise, etc.). The route selected by the method is again shown with the dotted road segment 1606 and it should be noted that the road segment is the same as that calculated in FIG. 18. As such, it is noted that the routes calculated by embodiments of the current invention may be so-called mathematically exact and find the best/optimal route with respect to the given cost model that was selected to be minimised. Thus, it will be apparent that the road-segments explored by the embodiment of the current invention is significantly less when compared to the prior art. As such, the method of the embodiment of the invention is quicker, and generally significantly quicker, than the prior art A* method.

It should also be noted that as the route 1606 approaches the destination 1604 more routes are explored when compared to the beginning; ie when the route 1606 proceeds beyond the point 1652 roads are explored other than the lowest cost route. One explanation of this is that the method has switched from the level 0 region to the level 1 region at point 1652. It will further be seen that further road segments are explored in the vicinity of the destination 1604. Again, this can be explained by noting the route planning method will switch from level 1 to level 2 in this vicinity.

Thus, when routing at long range, there will typically be only one fastest route. However, as the method switches to a finer level (eg from level 0 to 1) there may be more than one route which is marked as the 'lowest cost' and therefore needs to be explored.

Once the map data has been created and the bit vectors calculated and stored, it can be used for calculating routes between two points.

Figure 20:
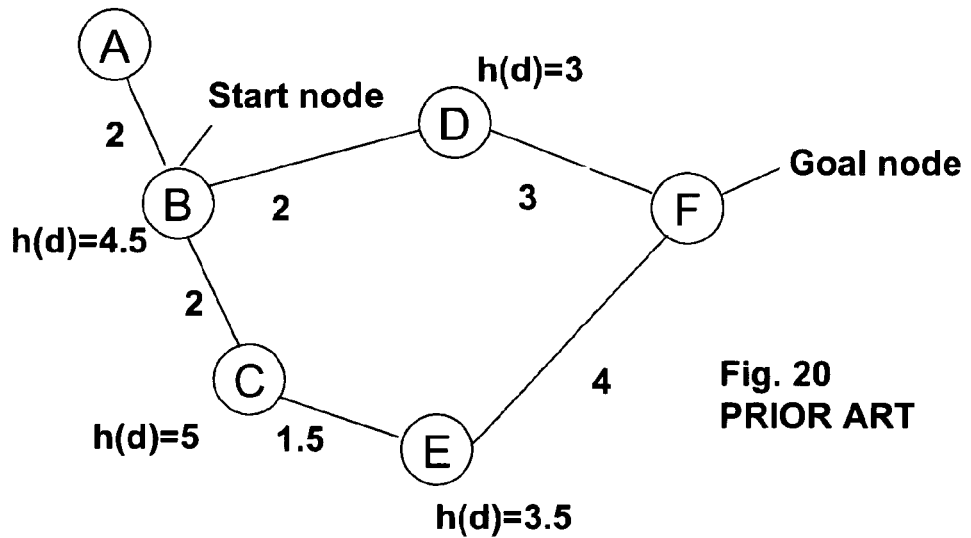
FIG. 20 shows an example of the A* search method (PRIOR ART)

FIG. 20 shows the prior art A* method in which as a network is explored by a route planning application wherein a decision is made at a node as to which road segment to explore further. In order to achieve this the cost to travel to the next node is added to the estimated cost of moving from the next node to the goal. The path having the minimum cost from a given node is then explored further. The methods keep a total of the cost that has so far been incurred as the method proceeds and at each iteration the minimum cost is considered.

For example, starting at node B, it can be seen that both nodes C and D are 2 cost units away from B, the start node. However, from node D the estimated cost of reaching node F is 3 units and from node C the estimated cost of reaching node F is 5 units. Thus, the A* method would explore the route to node D in preference to the route to node C since the cost to the next node plus estimated cost to goal is less for the road segment to node D. (ie BC=2+5=7 whereas BD=2+3=5).

When considering route planning is performed using the minimum cost bit vectors of embodiments of the present invention, the bits for each road segment (ie column 704 of FIG. 10) identify which road segments are candidates for being part of a minimum cost path to a destination region. As such, the A* method described in relation to FIG. 20 is modified to that shown in FIG. 21.

Figure 21:
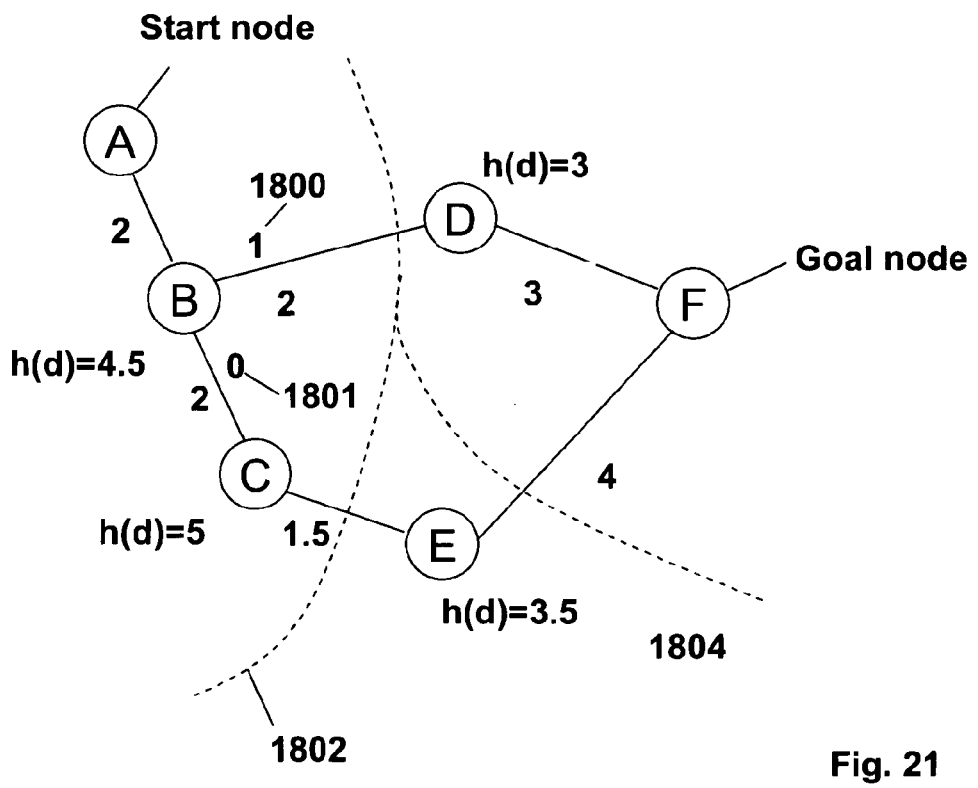
FIG. 21 shows a modification to FIG. 20 used by at least some embodiments of the invention.

Typically route planning is performed using the bit vectors as described in relation to FIG. 21. However, some embodiments of the invention may allow route planning to fall back to A* (or other prior art method) in various circumstances. Different embodiments may utilise any of the following: bit vectors information is missing (thereby allowing the system to function even in the absence of the bit vectors); a cost function is used; the routing other than the cost function for which the bit vectors were calculated (typically fastest route but not necessarily so); a user specifies criterion different to those used to pre-calculate the bit vectors (for example user wishes to avoid motorways); the vehicle type is different to that used for the pre-calculation of the bit vectors (eg. the user is on foot and not in a car); and the route is below a threshold length (eg the start and end points of the route are within the same region).

Two extra digits, 1800, 1801 are shown on FIG. 21 when compared to FIG. 20. Additionally, regions are denoted on the Figure by the hashed road segments 1802 and 1804. The '1' 1800 indicates that the road segment BD is part of one minimum cost path from node B to the region in which the goal node is situated. The '0' 1801 indicates that the road segment BC is not part any minimum cost path from node B to the region in which the goal node is situated.

As such, when starting from node A embodiments of the invention would use the A* outlined above to explore nodes from A. However, once node B had been reached there is no need to use the exploration further since there is an explicit notation that only the road segment BD is a possible part of the minimum cost path. As such, once the A* method has been used and found the minimum cost path it will subsequently select the minimum cost path by looking at the relevant bits within the bit vectors.

However, the minimum cost data may identify more than one minimum cost path between a pair of the regions if different minimum cost paths exist between the pair of regions at different times. Therefore, a routing between a start node and goal node (origin and destination) may find more than one minimum cost path and have to decide between competing minimum cost paths, for example if both digits 1800 and 1801 for road segments BD and BC have a value "1" indicating that each road segment is part of a minimum cost path at a certain time. In this embodiment, the bit vector does not identify the time at which each road segment is part of a minimum cost path. Accordingly, the routing algorithm carries out a cost analysis for both possible minimum cost paths based on a time at which segments of the path are travelled. This time may be determined from a time of departure from the origin/start node.

Figure 10A:
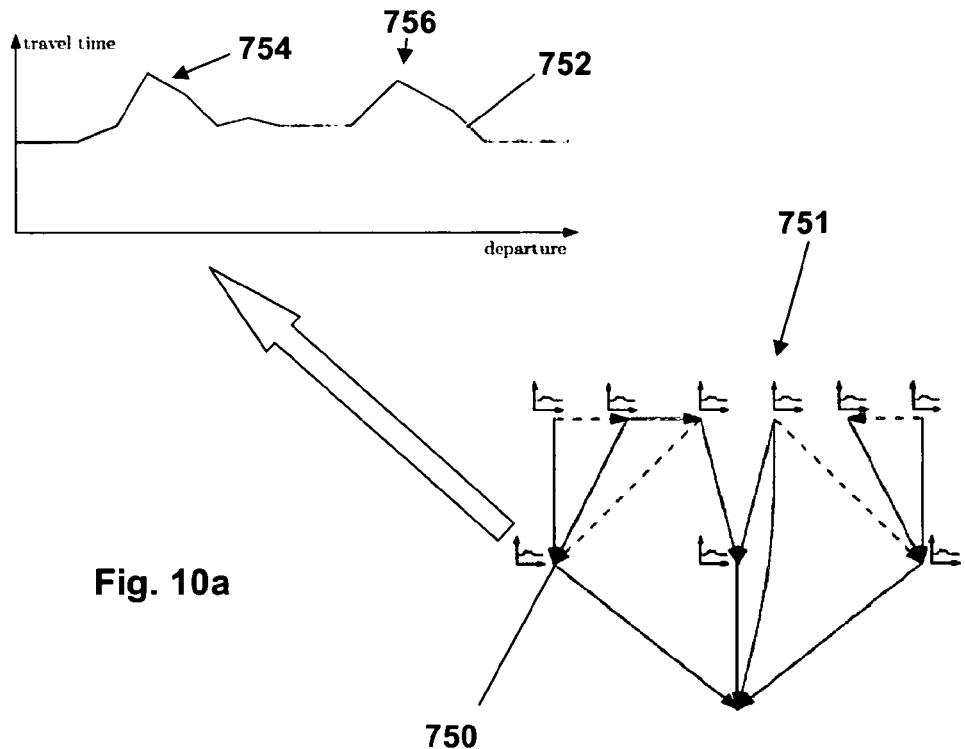
FIG. 10a illustrates how time profiled information is utilised during a Dijkstra exploration of a network.

Associated with each segment is a speed profile, as shown in FIG. 10*a*, of how the expected speed of travel through the segment varies with time. From these speed profiles, the expected speed at the relevant time can be determined and this can be used to determine the cost of travelling along that road segment at that time. By summing up the costs of travelling the road segments of each minimum cost path, the cost for each minimum cost path can be determined. The navigation device may then select for the route the minimum cost path having the lowest cost for that time.

Figure 23:
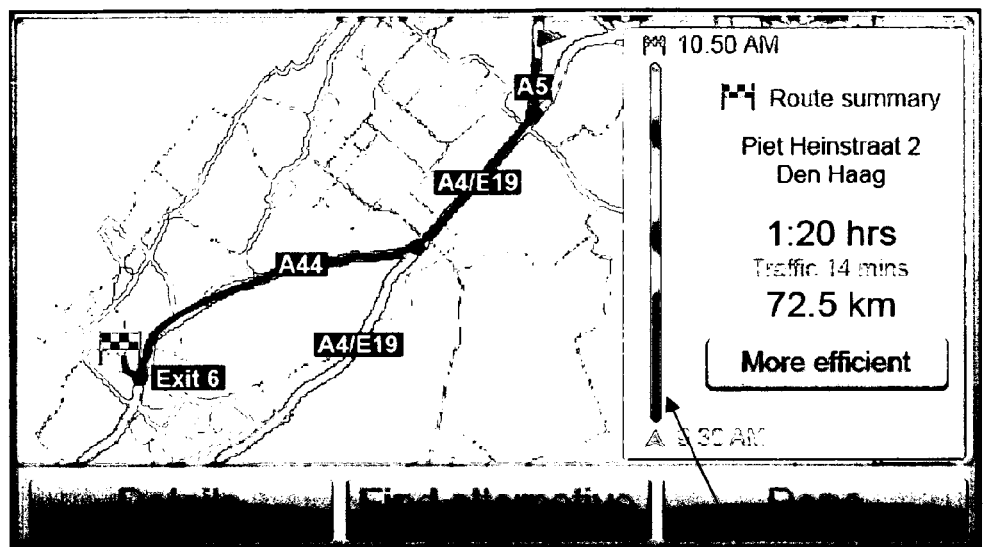
FIG. 23 shows a display of a navigation device illustrating expected speeds on the navigable segments of the route.

The determined route may be displayed on display 206. FIG. 23 is an example of how the route may be displayed on the map data.

In this embodiment, the display comprises an indication of the expected speed on at least some of the navigable segments of the route. For this embodiment, these indications are a colouring of the route and a time bar 2000 at the side of the image of the map to show the expected speed along the route. For example, the navigable segments may be coloured a first colour, for example green, if the expected speed is above a first threshold value and a second colour, for example red, if the expected speed is below as second threshold value.

An alternative method of determining a route is will now be discussed with reference to FIGS. 10*a* and 24 to 31. Rather than determining a cost for the routes at a particular time, a cost profile could be determined representing changing costs with time. In this embodiment, multiple values rather than a single value of the speed profile for each navigable segment is used to determine a cost profile for the routes.

For example, referring to FIG. 21, rather than having a single value for each road segment BC, CE, etc, the cost of each route is a distribution of how cost varies with time. These cost distributions are summed to determine a cost profile for the route. The propagation of cost profiles through a tree is also shown in FIG. 10*a*.

In this embodiment, each navigable segment has a speed profile associated therewith comprising 12 time bins for each hour, each time bin containing an expected speed of travel through the navigable segment for that time. A cost for the expected speed of each bin is determined and the costs for each relevant bin are summed for the navigable segments of a route to determine the cost profile. The values that are summed for each segment may not be from the bins for the same time as the expected time of travel along each segment will vary depending on when the user is predicted to arrive at each navigable segment. For example, it may be predicted that the user will take 5 minutes to travel along navigable segment BD, therefore, the bin values summed together for segments BD and DF may be the bin values that are separated by 5 minutes, ie the value of time bin T for BC is added to the value of time bin T+5 for DF.

Only navigable segments that are part of a minimum cost path are explored over competing navigable segments that are not part of a minimum cost path. Therefore, for both paths BDF and BCEF to be considered, both paths must be identified by the minimum cost data as minimum cost paths.

Figure 30:
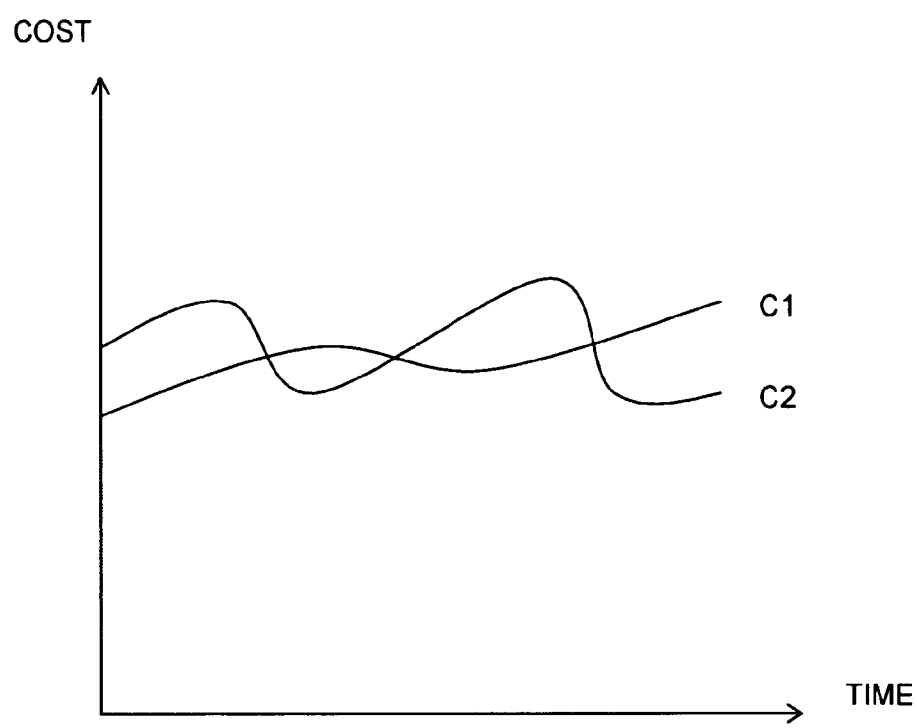
FIG. 30 shows a graph illustrating a cost profile of two competing routes at an intersection node.
Figure 31:
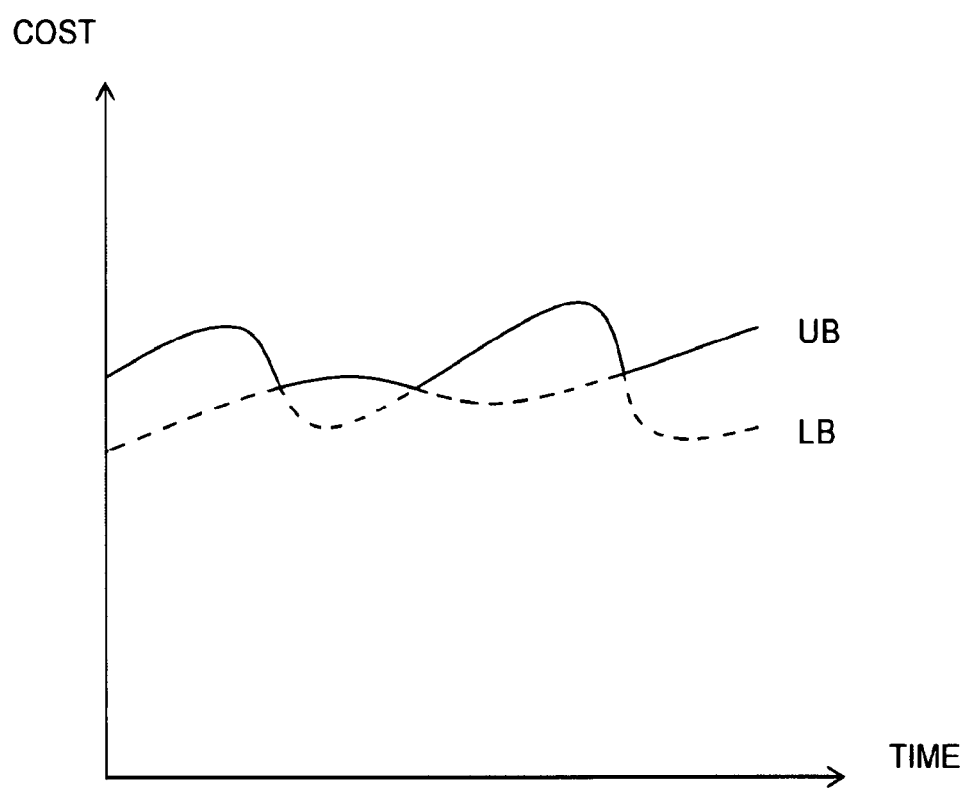
FIG. 31 shows upper bounded and lower bounded cost profiles derived from the cost profiles shown in FIG. 30.

If both paths BDF and BCEF are minimum cost paths at different times, then at node F where the two routes intersect, the cost profiles for BDF and BCEF need to be retained to some degree and possibly propagated further. To achieve this, the processor carries out calculations that are equivalent to superimposing the two cost profiles, C1 and C2 on-top of each other and determining an upper bound distribution UB (shown in solid lines) and a lower bound distribution LB (shown in dotted lines). This is shown in FIGS. 30 and 31. The UB and LB distributions are then used for further propagation allowing a maximum and minimum cost profile for each route to be determined.

Further propagation of the upper bound distribution and lower bound distribution occur in a similar manner with cost values for subsequent navigable routes being added to these profiles. If, the explored routes divide and then intersect again at a later node similar to node F, then the two upper bound profiles and two lower bound profiles for each incoming path are again processed by overlapping the two upper bound profiles to determine a single new upper bound profile and by overlapping the two lower bound profiles to determine a single new lower bound profile. In this way, an increase in the number of profiles is kept to a level that does not unduly hinder the time it takes to determine a route or require large amounts of memory (as memory is limited on PNDs).

In another embodiment, only one of the upper and lower bound profiles is retained for further propagation along the route. In a further embodiment, an average of the two incoming profiles is determined to result in an averaged profile for further propagation along the route.

Once a cost profile has been determined for an entire route, one for the upper or lower profiles is selected as the final cost profile, which is used to determine a display on the navigation device, as will now be explained.

Figure 24:
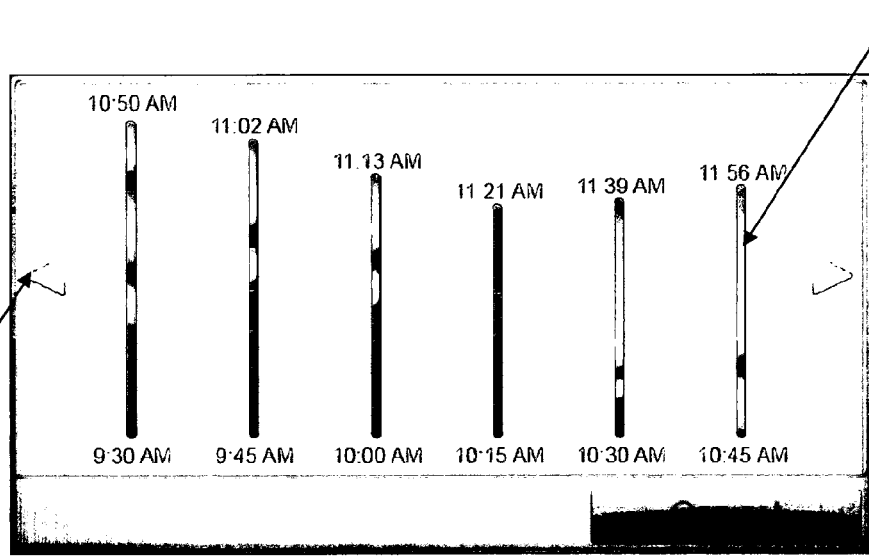
FIG. 24 shows a display of a navigation device illustrating a cost profile for one or more routes between an origin and destination.
Figure 25:
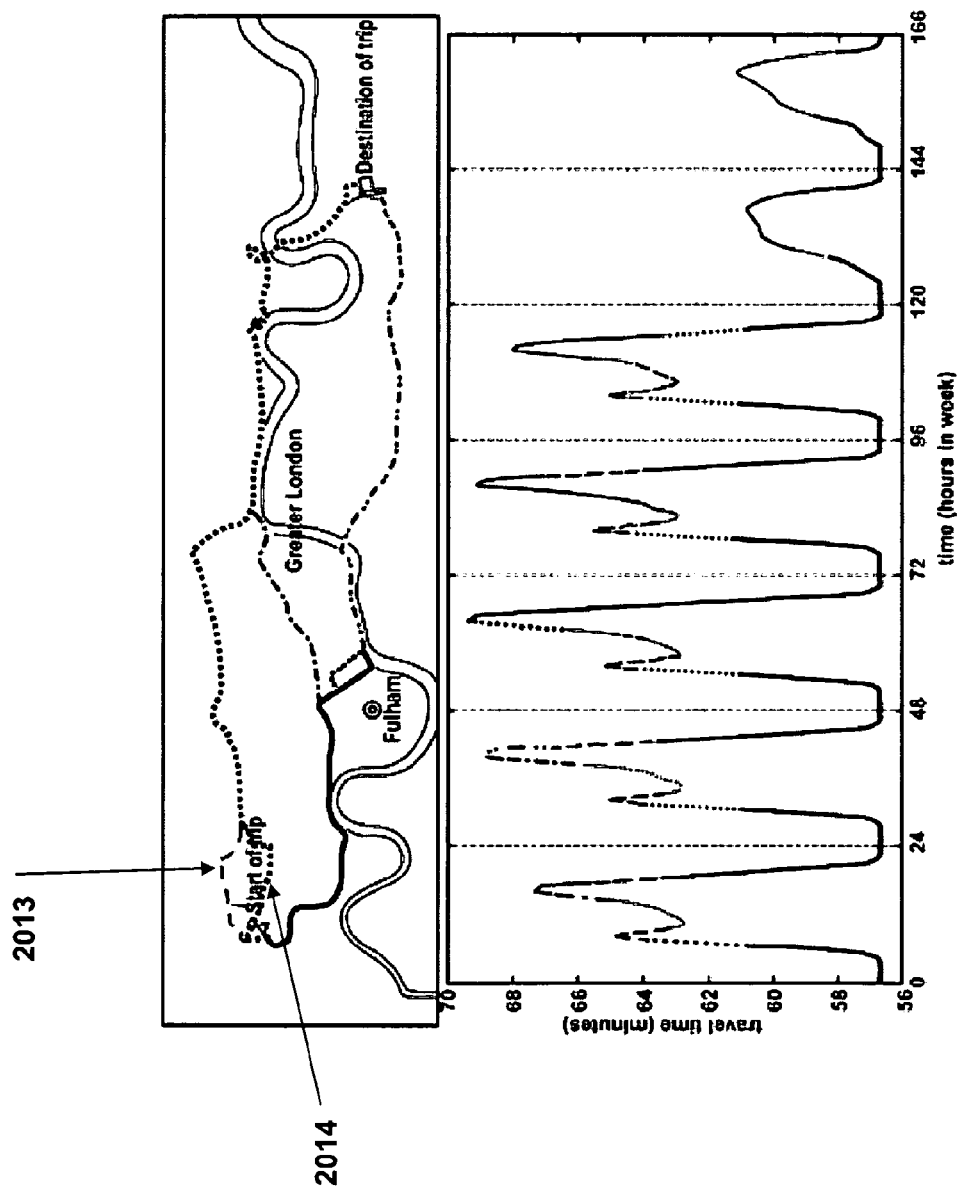
FIG. 25 shows a display of a navigation device illustrating a cost profile of one or more routes between an origin and a destination.

FIGS. 24 and 25 illustrate ways in which multiple values of the cost profile may be displayed.

In FIG. 24, the cost profile is illustrated by displaying time of departure from the origin and arrival time at the destination together with time bars for discrete departure times separated by a predetermined amount, in this embodiment 15 minutes. Like the time bar 2000 in FIG. 23, each time bar is colour coded to indicate the expected speeds along different parts of the route. Arrows 2001, 2002 are provided, which when selected by a user causes the display to display departure time and arrival time pairs and time bars for earlier or later start times (selection of the left arrow 2001 causing earlier start times to be displayed and selection of right arrow 2002 causing later start times to be displayed). Selecting a time bar may cause a display, like that shown in FIG. 23, to be displayed for the selected start time.

In FIG. 25, the cost profile is displayed as a continuous graph over a set period of time, in this example over 168 hours (equivalent to a week). This graph is displayed together with a map illustrating the routes from the origin to the destination that contribute to form this cost profile. The graph and routes are colour coded (as illustrated by the solid and dotted lines) such that a user can determine which routes are to be used at what times. For example, the graph between 7 hrs 40 mins and 9 hrs 15 minutes is coloured to show that at the start of the route the dashed route 2003 should be followed rather than first part of the dotted route 2004. Such a display allows the user to easily see how the cost of travelling between the origin and destination changes with time and how this affects the route.

Figure 26:
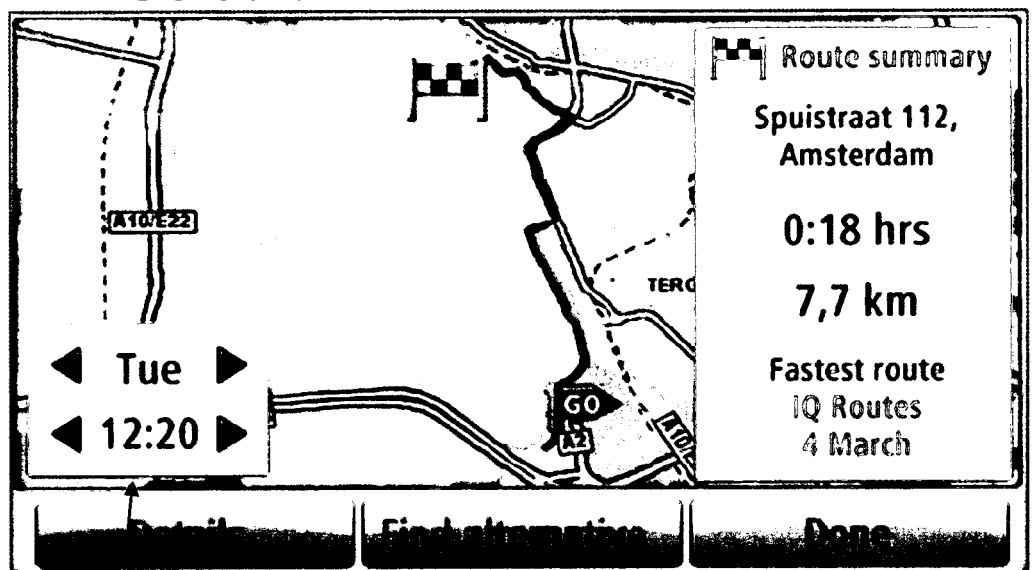
FIG. 26 shows a display of a navigation device illustrating a route between an origin and destination for a particular travel time and a control for changing the travel time.
Figure 27:
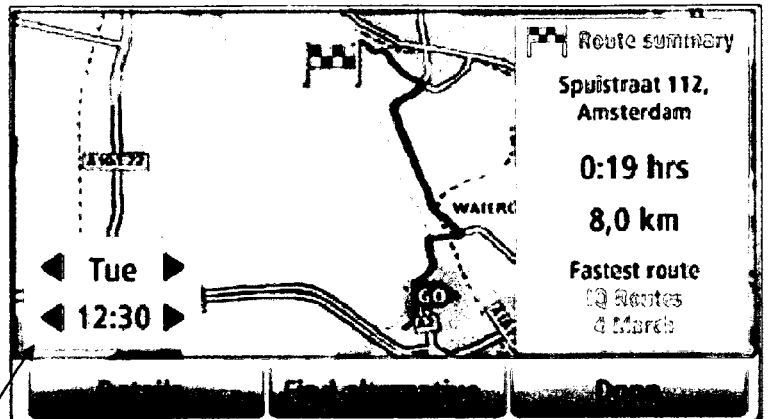
FIG. 27 shows an update to the display of FIG. 26 after the user has altered the travel time.
Figure 28:
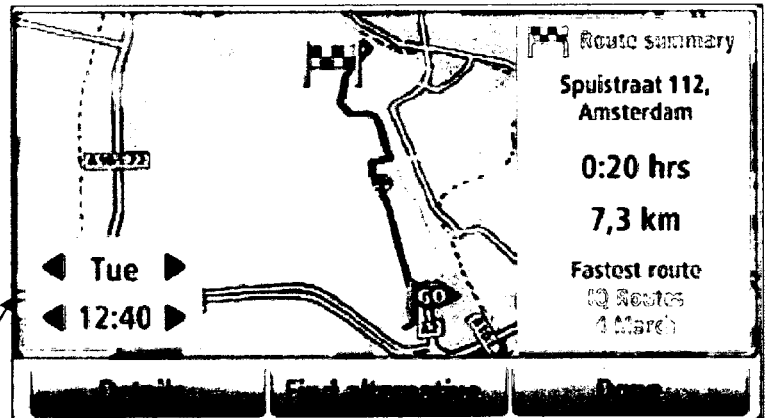
FIG. 28 shows an update to the display of FIG. 27 after the user has altered the travel time further.

FIGS. 26 to 28 illustrate an alternative embodiment. In this embodiment, a cost profile has been determined, as described above, but only an image of a route determined for a travel time specified by the user is displayed. However, on the display is a box 2010 showing the day and time for which the displayed route is applicable. Arrows provided either side of the day and time can be selected by a user whilst viewing the image of the map data showing the determined route to change the day and/or time. Changing the day and/or time may cause the route to change and the display is updated to display the new route as well as any changes in the time to travel the route and the distance travelled. Examples of these updated displays are shown in FIGS. 27 and 28.

Updating of the display occurs in "real-time", for example of the order of milliseconds, for example in less than 1000 milliseconds and preferably less than 500 milliseconds. Such fast re-calculation times can be achieved through the use of the pre-processed minimum cost data and/or because routes for these other times have already been determined through a profile search.

Figure 29:
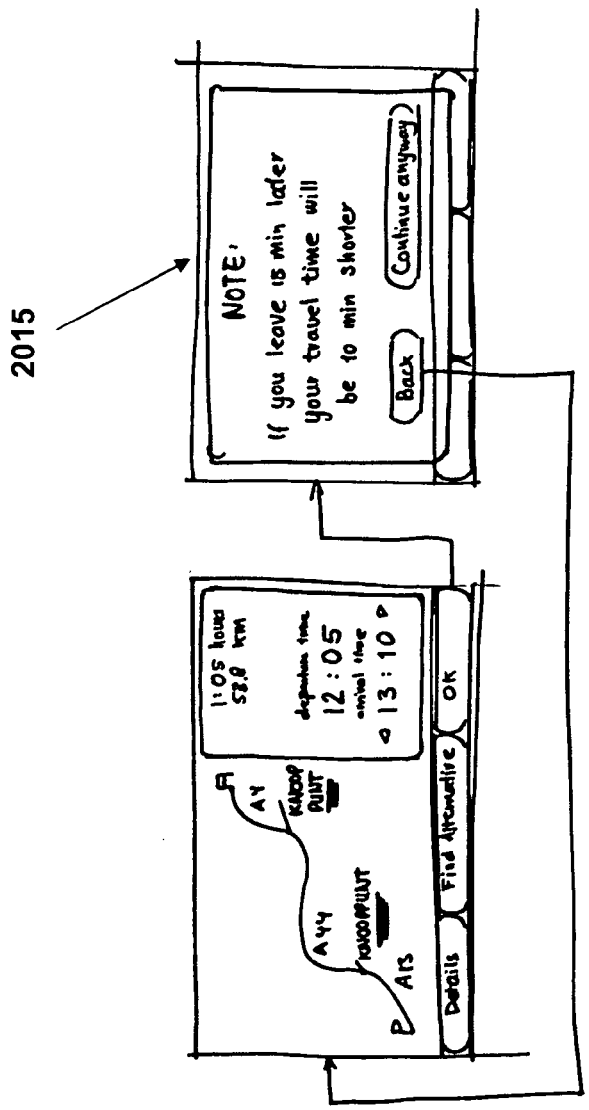
FIG. 29 shows a series of displays of a navigation device, wherein a travel time is suggested to the user.

FIG. 29 illustrates a further function of the navigation device using profile searches. In this embodiment, on selection of a travel time, eg a start time, the processor of the navigation device may compare the cost of travelling at that time with values of the cost profile in a window around that travel time, for example, 30 minutes either side if the travel time. If the processor finds a travel time within that window having a lower cost then the processor may cause the display to display an indication of the travel time that gives a better result. For example, in the illustrated embodiment, a note 2015 is displayed informing the user that if he/she travels 15 minutes later the travel time will be shorter, in this instance by 10 minutes.

In order to perform the routing so far described, bit vector information is obtained from the encoded side file described in relation to FIGS. 11 to 13 using a decoding process.

The output of the pre-processing described above comprises:

an assignment of hierarchical regions to most of the nodes, and an assignment of bit vectors to the outgoing road segments at these nodes.

Map Loading

Consistency Checks

When map data is loaded, the set of side-files should be present in the map directory, otherwise the decoder will deactivate the search acceleration data so that the route search is carried out without search acceleration data. There are several checks which help to ensure data integrity, which are now listed.

The side-files follow a naming convention.

The number of levels is given by the number of side-files, but it is also stored in the header of each side-file and equals the number of side file.

Each side-file stores the number of regions at its respective level, which is the same as specified in the side-file names. Moreover, the side-files store the following information, which should be the same for all side-files:

the side-file version.

the number of nodes per "bit vector page" (explained below).

There are also checksums in each side-file which identify the particular side-file set as a whole the map as a whole.

These should be correct for the side-files associated for a given electronic map. If any of the above checks fails, the search acceleration data feature will not be activated for this map.

Data Structures which are Loaded into Memory

The decoder reads the side-files in an external-memory implementation. This means that the contents of the bit vector side-files are not loaded entirely into memory, but only read as needed. However, some general data is loaded into memory at the beginning and held there as long as the map is loaded.

Header Information

Figure 8:
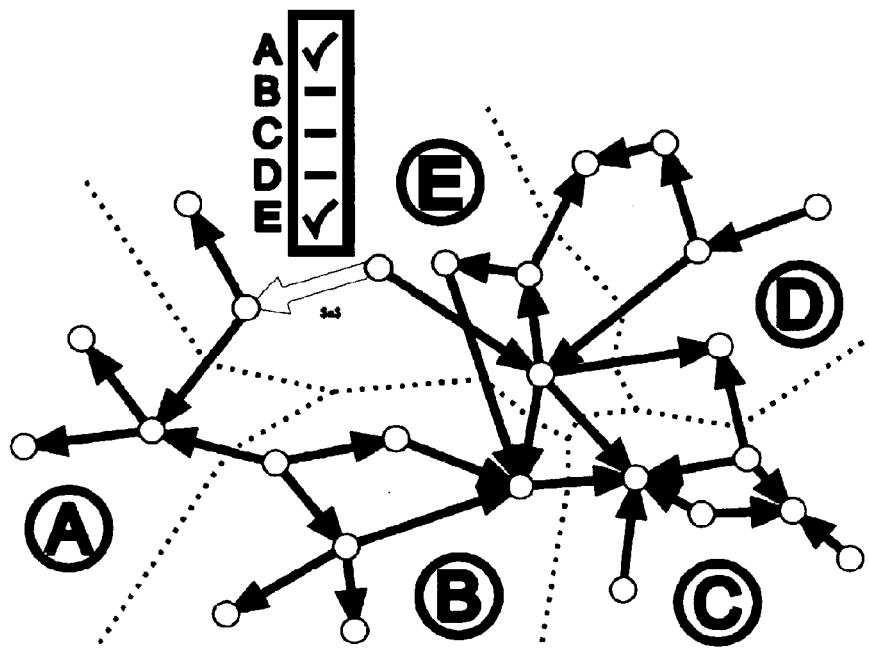
FIG. 8 shows an example of how nodes, in some embodiments, are allocated to the map of FIG. 7.

Each side-file starts with a header section, which contains the data described in relation to FIGS. 8 to 10 above. This information is stored in memory for each side-file.

Huffman Tree Definitions

The side-files contain the definitions of several Huffman trees. Each Huffman tree definition gives the complete description of a particular Huffman encoding and is used later to decode a part of the side-file bit stream into the original data (i.e. to decode a sequence of bits from a side-file into a number or some other particular value). The following Huffman tree definitions are read from each side-file and held in memory.

A Huffman tree for decoding the number of road segments at each node. (The encoded number of road segments can be smaller than in the underlying map. Note than the decoder is independent of the underlying map, i.e. it does not need to read the map.) This Huffman tree is only stored in the level-0 side-file.

A Huffman tree for decoding the page code (explained below).

Several Huffman trees for decoding bit vector blocks. The number of tree definitions is given by the regular bit vector block length as stored in the side-file header; it equals the block length minus one. (The entire bit string of bit vectors for a road segment is split into blocks. If the length of the bit vector bit string is not a multiple of the regular block length, then the final block is shorter. There is one Huffman tree for each block length from 2 up to the regular block length. No Huffman tree is used for a block of length one, because this is just a bit and is stored directly.)

Several Huffman trees for selecting the decoding method for bit vectors. The number of these trees is specified in the header; their use is explained below.

Neighbour Lists

At each level except the finest level, the side-file encodes neighbour lists. A neighbour list for a region at level k is a list of zero or more level-(k+1) regions which are called neighbours of the level-k region. The neighbour list section at the level-k side-file has two parts.

The first part contains the number of neighbour regions for each level-k subregion. For example (k=1), if there are 4000 regions at the global level 0, and each global region is subdivided into 10 level-1 regions, then the level-1 side-file contains 4000*10 level-1 subregions. For each of these, the length of the individual neighbour list (which consists of level-2 regions) is given.

The second part contains the actual neighbour lists, whose respective lengths are known from the first part. Each neighbour list is a list of level-(k+1) subregions.

Region Remap Table

The side-files store bit vectors in a compressed format eg by coalescing and reordering, etc. The side-file at level k has a region remap table which is used to decompress bit vectors encoded by blocks. It consists of two parts:

The first part is an array which is indexed by the level-k subregions. For each subregion at level k, it contains the length of the compressed bit vector. This is relevant for those outgoing road segments of nodes in the respective subregion for which the bit vector is encoded by blocks.

The second part is a two-dimensional array indexed by (1) the bit position in the uncompressed bit vector and (2) the level-k subregion. The array entries specify the bit position in the compressed bit vector for the given bit position in the uncompressed bit string read by blocks.

Note that only the first part is held in memory; the second part is only used on demand during decoding because it is large. Currently, the region remap table is only stored at the global-level side-file (k=0).

Initiating a Route Query

The decoder is used to accelerate the route search from a departure position to a set of destination nodes. (An example where the destination consists of more than one node is when an entire road stretch is used as destination.) The destination nodes define a set of one or more target regions.

Note that a target region is a sequence of region IDs, one for each partitioning level, starting at level 0. At the beginning of each new search, the set of target regions is built up by clearing the previous target region set and passing the new destination nodes to the decoder. The decoder will determine a list of target regions without duplicates. The mechanism for finding the region of a given node is the same as during the search; see below for details.

Scanning a Node During Route Search

The remaining discussion assumes that a set of target regions has been set. A feature of the decoder is a function which, given a node ID of the road network, returns a bit array (the bit vectors for this node and the given target regions) which is indexed over the road segments leaving this node. The ordering of the nodes and the road segments at a node is defined by the map. Whenever a bit value is zero, this means that the corresponding road segment can be ignored during the search. (This usually leads to a considerable reduction of the search space and thus the running time for the search.)

For a small number of nodes, neither region information nor bit vector data is stored in the side-files. For these nodes, the decoder returns a bit string in which all bits are 1. (This will prevent the route search from skipping any road segment at this node.) The decoder has a Boolean query function which says whether this is the case for a given node. Moreover, there is a Boolean query function which says whether a given node is located in one of the previously fixed target regions. The bit vectors returned by the decoder for a node in a target region are again bit strings in which all bits are 1. These Boolean query functions are used for optimizations in the route search.

According to the side-file format, the bit vector data for a given node is decoded in several steps. In each side-file, the region and bit vector information is organized in so-called pages. The number of nodes per page is a fixed power of 2 (e.g. 16) and identical for each side-file of a side-file set. This means that, for a given node ID, the page index of a bit vector page can be computed by a simple bit-shift. Information for the nodes is stored consecutively by node ID.

Finding the Page Offset for a Given Node

For each side-file, the average number of bytes per page is stored in the header of the side-file. It is used to approximate the byte offset of the page by multiplying the page index with the average size. A correction term is stored in a table indexed by the page index. This table is stored in a separate section of the side-file. When a page is queried, the correction term is looked up in the table and added to the approximate page offset, giving the position of the page in the side-file.

Decoding A Page

Caching

When a page is queried for the first time, the bit vector strings for the nodes in the page are decoded (with respect to the fixed target region set) and cached. The next time data is queried for a node from the same page, the cached data can be used without any side-file access. A special marker bit in the decoded bit vector bit string is used to remember whether the node is a no-information node.

Page Code

For each page, a so-called page code bit specifies whether all nodes in the page have the same region ID. The page code contains one bit per level, but all bits are stored as a common Huffman symbol at the beginning of the page in the level-0 side-file only.

Decoding Outgoing Road Segment Counts

As mentioned above, each page contains information for a fixed number of nodes. This number of nodes is stored in the header of each side-file. At the beginning of a page (or after the page code, for level 0), the page lists the number of outgoing road segments for each node in the page. Whenever the number of outgoing road segments is zero, this means that no information at all is stored for the corresponding node. While the page is decoded, the numbers are stored in a temporary array.

Decoding Regions

The road segment counts section is followed by the regions section. The region of a node is given by a sequence of region IDs, one at each level. The region ID of a particular level is stored in the corresponding side-file. The decoder reads the regions at all levels for all nodes in the page. When no information is stored for a node (i.e. the road segment count of the node is zero), the region information is left empty. The decoder reads the region ID sequence for the first node which has a road segment count greater than zero. If the page code at a given level specifies that all region IDs are the same at that level, then at that level the same region ID is set for all nodes. Otherwise, the region IDs at the corresponding levels are read for all nodes of positive road segment count. At the end of this process, the decoder has filled a table with the complete region ID sequences for all nodes of the page (where some sequences may be empty).

Decoding Bit Vectors

Finding the Set of Relevant Bit Positions

For a given node and target region, a particular bit at a particular level determines the value of the bit vector bits for the road segments leaving this node. When there is more than one target region, the resulting bits are ORed together. For each node, the decoder computes the set of relevant bit positions. The set of relevant bit positions is the same for each outgoing road segment at that node. It only depends on the region of the node and the set of target regions. If there is just one target region, there will be only one relevant bit position at one level; in other words, information stored at the other levels can be ignored for this node. In the case of more than one target region, some of the relevant bit positions may coincide, so there are always at most as many relevant bit positions as there are target regions. In the following, we shall discuss how the decoder determines the relevant bit position for one target region. For more than one target region, the relevant bit positions are found in the same way and combined into a set.

When no neighbour regions are defined, there is one bit vector bit (per outgoing road segment) for each target region at each level. (For simplicity, we neglect the fact that no bit is stored for the region ID of the node itself.) The relevant bit is at the first level, counting up from level 0, at which the region ID of the node differs from the region ID of the target region. For example, if the region ID of the node at the global level is equal to the target region ID at the global, but the two region IDs are different at level 1, then the relevant bit position is at level 1, and it equals the target region ID. It is a bit position in the uncompressed bit vector string at that level; this string contains one bit for each possible target region ID. The region remap table is used to transform this position into a position in the compressed bit vector string, the string which is actually encoded at that level.

When neighbour regions are defined, then the relevant bit is determined at the "finest" level at which the target region is a neighbour of the node's region. Taking four levels as an example, let the target region ID sequence be (a, b, c, d), and let the node's region ID sequence be (e, f, g, h). If (a, b, c, d) is a neighbour of (e, f, g) as defined in the neighbour lists section, and (a, b) is a neighbour of (e), then the relevant bit is determined by (a, b, c, d) and located at level 2, the level of the (e, f, g) prefix which contains (a, b, c, d) as a neighbour. More precisely, the relevant bit position is the index of (a, b, c, d) as a neighbour of region (e, f, g) in the level-2 side-file. The regular bit for region ID h, as explained in the previous paragraph, is irrelevant in this case. Again, this relevant bit position is with respect to the uncompressed bit vector string. The decoder uses the region remap table to transform it to a bit position in the compressed bit string at level 2. More information on neighbour lists is contained in the document "Proposal for enhanced multi-level graph partitioning".

Decoding the Bit Vector Bits

Given the fixed set of target regions, the bit vector for each node in the page will consist of one bit per outgoing road segment. If the road segment count of the node is zero (i.e. the node is a no-information node), each bit will be set to 1 without further decoding for that node. If the node is located in one of the target regions, the bit vector will again be all-1; in this case, encoded data might have to be skipped in order to decode data for the subsequent nodes.

If the bit vector for the current node is not trivially all-1, the decoder determines the set of relevant bit positions, as explained earlier. Each bit position is with respect to a particular level, i.e. the bit is located in a particular side-file. At each level, the side-file contains the complete compressed bit string, but the decoder needs to extract the bits at the relevant bit positions only. During decoding, unused information is read (skipped), but only if it is followed by information which is really needed. Otherwise, the unused part of the bit stream is not read at all.

The set of relevant bit positions is grouped according to level. Instead of decoding the compressed bit string and uncompressing it for reading the bits at the relevant positions, the relevant positions are transformed into positions in the compressed bit string. If there are relevant bits at some level, first the data for preceding nodes is skipped (if appropriate the decoder remembers how far it has come in the side-file at each level). When the section for the node in question is reached in a given side-file, the bit vectors are decoded line by line. For each outgoing road segment, one bit is stored; it is the result of an OR operation of the decoded bit for all relevant bit positions. The information for a particular road segment at the current node starts with a Huffman symbol which specifies the decoding method. It has one of the following values:

- A symbol which specifies that all bit vector bits for the road segment at this level are 0 (including all neighbour bits at this level). No further bits have to be decoded for this road segment.
- A symbol which specifies that all bit vector bits for the road segment at this level are 1 (including all neighbour bits at this level). No further bits have to be decoded for this road segment.
- A symbol which specifies that the bit vector bit string is given explicitly by blocks. The decoding of the compressed bit vector bit string by blocks is explained below. The bit vector bit for the road segment is put into a "history stack" that is built up during the encoding of the entire page.
- A symbol which specifies an index into the history stack. At the given index, the history stack contains the desired bit vector bit value for the road segment.
- A different Huffman tree for the decoding method selector is used, depending on the current size of the history stack. There is a limit value in the header of the side-file which specifies the number of Huffman trees; when the size of the history stack exceeds this value, then the last Huffman tree is reused.

If the method selector symbol specifies that the bit vector string should be encoded explicitly, then the decoder reads the compressed bit vector bit string block by block. It collects the bit values at the relevant bit positions (with respect to the compressed bit vector string) at this level. The values of the bits are ORed. As soon as the intermediate result of the OR becomes 1, the rest of the bits in all further blocks for this road segment can be skipped. The Huffman tree used for decoding each block depends on the number of bits in the block. There is one Huffman tree for the regular block length as specified in the side-file header. The last block for the road segment may be shorter; depending on its size, an appropriate Huffman tree is used for decoding. A block of length one is just a bit, which is read directly without Huffman decoding.

If the number of blocks is at least 2, then the bit stream generated from the bit vector contains an additional bit which comes before the Huffman symbols for the blocks. Its value specifies whether the entire decoded string is understood to be the bit-wise negation of the actual value. (The purpose of this negation is better Huffman compression.

The invention claimed is:

1. A method of determining and using cost profiles of routes using map data divided into a plurality of regions, the method comprising using at least one processing apparatus to:

search, by the at least one processing apparatus, for one or more routes from an origin to a destination, the search comprising determining whether one or more navigable segments of a set of navigable segments connected to a node are identified by pre-processed minimum cost data as part of a minimum cost path for regions comprising the origin and destination at one or more of a plurality of time periods and, if one or more of the navigable segments of the set are identified as being part of a minimum cost path during at least one of the plurality of time periods, exploring from the set only the one or more navigable segments that are identified as being part of a minimum cost path during at least one of the plurality of time periods, wherein the set of navigable segments comprises segments of navigable paths of the map data, each navigable segment having an associated time varying cost function;

determine, by the at least one processing apparatus, a cost profile of the one or more routes over time from the time varying cost functions of the navigable segments that are explored, the cost profile representing the cost of an optimum route between the origin and the destination at different travel times, wherein determining a cost profile of the one or more routes over time comprises combining a first cost profile associated with a first minimum cost path and a second cost profile associated with a second minimum cost path when the first and second minimum cost paths intersect at a node to determine at least one combined cost profile, and further propagating the at least one combined cost profile from the node; and display, by the at least one processing apparatus, the optimum route for a particular travel time based on the determined cost profile or a representation of the determined cost profile on a display.

2. A non-transitory computer-readable medium having stored thereon instructions which, when executed by a processing apparatus, causes the processing apparatus to perform the method according to claim 1.

3. A computer device comprising memory having stored therein map data divided into a plurality of regions, the map data comprising:

a plurality of navigable segments representing segments of navigable paths of the map data, each navigable segment having an associated time varying cost function; and pre-processed minimum cost data for the navigable segments identifying whether a navigable segment is part of a minimum cost path between regions of the map data at one or more of a plurality of time periods, and a processing apparatus arranged to:

search for one or more routes from an origin to a destination, the search comprising determining whether one or more navigable segments of a set of navigable segments connected to a node are identified by the minimum cost data as part of a minimum cost path for regions comprising the origin and destination and, if one or more of the navigable segments of the set are identified as being part of a minimum cost path during at least one of the plurality of time periods, exploring from the set only the one or more navigable segments that are identified as being part of a minimum cost path during at least one of the plurality of time periods;

determine a cost profile of the one or more routes over time from the time varying cost functions of the navigable segments that are explored, the cost profile representing the cost of an optimum route between the origin and the destination at different travel times, wherein determining a cost profile of the one or more routes over time comprises combining a first cost profile associated with a first minimum cost path and a second cost profile associated with a second minimum cost path when the first and second minimum cost paths intersect at a node to determine at least one combined cost profile, and further propagate the at least one combined cost profile from the node; and display the optimum route for a particular travel time based on the determined cost profile or a representation of the determined cost profile on a display.

4. The method according to claim 1, wherein the step of combining the first and second cost profiles comprises superimposing the two cost profiles and determining at least one of a maximum and minimum cost profile for further propagation.

5. The method according to claim 1, wherein the step of combining the first and second cost profiles comprises determining an average cost profile for further propagation.

6. The method according to claim 1, wherein the time varying cost function associated with a navigable segment comprises speed profile data identifying the expected speed on the navigable segment at different times.

7. The method according to claim 1, wherein the cost profile of the one or more routes over time is determined in response to receiving a cost profile request, the cost profile request including a time frame within which the search for routes is confined.

8. The method according to claim 1, comprising receiving a request for a route between the origin and the destination at a particular travel time, the cost profile of the one or more routes over time being determined for a time window including that particular travel time, the method further comprising:
 determining from the cost profile whether at another time within that time window the cost of the route is less than the cost for the particular time and, if the cost is less, causing the display of a message informing the user of the other travel time.

9. The method according to claim 1, comprising receiving from a user via a user interface a selection of a travel time and causing a display to display an image of the route determined from the cost profile at the received travel time.

10. The method according to claim 9, comprising enabling the user to change the travel time whilst viewing the image of the route, and, in response to a change in the travel time, updating the display with an image of a new route determined from the cost profile for the changed travel time.

11. The method according to claim 10, comprising causing the display of a slider representing the travel time and updating the display with the image of the new route in response to user interaction with the slider.

12. A navigation device comprising:
 at least one processing apparatus;
 a memory; and
 a display,
 wherein the memory stores map data comprising a plurality of navigable segments representing segments of navigable paths of the map data, each navigable segment having an associated time varying cost function and minimum cost data for the navigable segments identifying whether a navigable segment is part of a minimum cost path between regions of the map data at one or more of a plurality of time periods; and
 wherein the at least one processing apparatus is operative to: search for one or more routes from an origin to a destination, the search comprising determining whether one or more navigable segments of a set of navigable segments connected to a node are identified by pre-processed minimum cost data as part of a minimum cost path for regions comprising the origin and destination and, if one or more of the navigable segments of the set are identified as being part of a minimum cost path during at least one of a plurality of time periods, exploring from the set only the one or more navigable segments that are identified as being part of a minimum cost path during at least one of a plurality of time periods; and
 determine a cost profile of the one or more routes over time from the time varying cost functions of the navigable segments that are explored, the cost profile representing the cost of an optimum route between the origin and the destination at different travel times, wherein determining a cost profile of the one or more routes over time comprises combining a first cost profile associated with a first minimum cost path and a second cost profile associated with a second minimum cost path when the first and second minimum cost paths intersect at a node to determine at least one combined cost profile, and further propagate the at least one combined cost profile from the node; and
 display the optimum route for a particular travel time based on the determined cost profile or a representation of the determined cost profile on the display.

13. The navigation device of claim 12, wherein the minimum cost data is stored as a bit vector.

14. The navigation device of claim 13, wherein the bit vector comprises a bit for each region of the map data.

15. The navigation device of claim 12, wherein the identification of the minimum cost path is based on at least one of a plurality of predetermined criterion.

16. The navigation device of claim 12, wherein the cost profile is displayed on the display as a graph indicating at least one departure time.

17. The navigation device of claim 12, wherein the minimum cost data comprises a plurality of sets of minimum cost data.

18. The method according to claim 1, wherein the time resolution of the cost data is of the order of seconds, deciseconds, or centiseconds.

19. The navigation device of claim 12, wherein the time resolution of the cost data is of the order of seconds, deciseconds, or centiseconds.

* * * * *